US011943538B2

(12) United States Patent
Jung et al.

(10) Patent No.: US 11,943,538 B2
(45) Date of Patent: Mar. 26, 2024

(54) CAMERA MODULE AND ELECTRONIC DEVICE INCLUDING THE SAME

(71) Applicant: Samsung Electronics Co., Ltd., Gyeonggi-do (KR)

(72) Inventors: Hwajoong Jung, Gyeonggi-do (KR); Bongchan Kim, Gyeonggi-do (KR); Kwangseok Byon, Gyeonggi-do (KR); Taehwan Kim, Gyeonggi-do (KR); Hyungjin Rho, Gyeonggi-do (KR); Jaeheung Park, Gyeonggi-do (KR); Jonghun Won, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 146 days.

(21) Appl. No.: 17/732,976

(22) Filed: Apr. 29, 2022

(65) Prior Publication Data
US 2022/0353417 A1  Nov. 3, 2022

Related U.S. Application Data

(63) Continuation of application No. PCT/KR2022/005554, filed on Apr. 18, 2022.

(30) Foreign Application Priority Data

Apr. 29, 2021  (KR) .................. 10-2021-0055707

(51) Int. Cl.
*H04N 23/68*   (2023.01)
*H04N 23/51*   (2023.01)
*H04N 23/54*   (2023.01)
*H05K 1/11*    (2006.01)
*H05K 1/14*    (2006.01)

(52) U.S. Cl.
CPC .......... *H04N 23/687* (2023.01); *H04N 23/54* (2023.01); *H05K 1/112* (2013.01); *H05K 1/118* (2013.01); *H05K 1/14* (2013.01); *H04N 23/51* (2023.01)

(58) Field of Classification Search
CPC ...... H04N 23/687; H04N 23/54; H04N 23/57; H05K 1/148; H05K 1/112; H05K 1/118; H05K 1/14
See application file for complete search history.

(56) References Cited

U.S. PATENT DOCUMENTS 7,777,782 B2   8/2010  Eromaki
9,091,802 B2   7/2015  Lee et al.
(Continued)

FOREIGN PATENT DOCUMENTS

KR       10-0663276      1/2007
KR       1020080066758   7/2008
(Continued)

OTHER PUBLICATIONS

International Search Report dated Aug. 2, 2022 issued in counterpart application No. PCT/KR2022/005554, 12 pages.

*Primary Examiner* — Nicholas G Giles
(74) *Attorney, Agent, or Firm* — The Farrell Law Firm, P.C.

(57) ABSTRACT

Disclosed is an electronic device including a camera module enabling a movable member (e.g., a circuit board) having an image sensor disposed thereon to move for an image stabilization function and including a connecting member that provides electrical connection of the image sensor, and an electronic device including the camera module.

20 Claims, 26 Drawing Sheets

(56) References Cited

U.S. PATENT DOCUMENTS

| | | |
|---|---|---|
| 9,936,134 B2 | 4/2018 | Enta |
| 10,884,321 B2 | 1/2021 | Jerby et al. |
| 11,199,182 B2 | 12/2021 | Miller et al. |
| 11,378,814 B2 | 7/2022 | Choi et al. |
| 11,637,919 B2 | 4/2023 | Baker et al. |
| 2007/0103555 A1 | 5/2007 | Eromaki |
| 2010/0165131 A1* | 7/2010 | Makimoto ............ H04N 23/68 359/557 |
| 2014/0184891 A1 | 7/2014 | Lee et al. |
| 2017/0353662 A1 | 12/2017 | Enta |
| 2018/0171991 A1 | 6/2018 | Miller et al. |
| 2020/0099151 A1* | 3/2020 | Zhu .................... H01R 13/025 |
| 2021/0088880 A1 | 3/2021 | Jerby et al. |
| 2021/0088881 A1 | 3/2021 | Jerby et al. |
| 2021/0088882 A1 | 3/2021 | Jerby et al. |
| 2021/0168230 A1 | 6/2021 | Baker et al. |
| 2021/0208417 A1 | 7/2021 | Choi et al. |
| 2021/0223563 A1 | 7/2021 | Miller et al. |
| 2022/0099072 A1 | 3/2022 | Miller et al. |

FOREIGN PATENT DOCUMENTS

| | | |
|---|---|---|
| KR | 10-1035791 | 5/2011 |
| KR | 1020140086622 | 7/2014 |
| KR | 1020170096124 | 8/2017 |
| KR | 1020190097113 | 8/2019 |
| KR | 1020190132126 | 11/2019 |
| KR | 1020200106312 | 9/2020 |
| KR | 1020210069596 | 6/2021 |
| KR | 10-2021-0132914 | 11/2021 |

* cited by examiner

CAMERA MODULE AND ELECTRONIC DEVICE INCLUDING THE SAME

CROSS-REFERENCE TO RELATED APPLICATION(S)

This application is a Bypass Continuation Application of International Application No. PCT/KR2022/005554, which was filed on Apr. 18, 2022, and is based on and claims priority under 35 U.S.C. § 119 to Korean Patent Application No. 10-2021-0055707, which was filed in the Korean Intellectual Property Office on Apr. 29, 2021, the entire disclosure of each of which is incorporated herein by reference.

BACKGROUND

1. Field

The disclosure relates generally to wireless communication, and more particularly, to a camera module and an electronic device including the camera module, for use in wireless communication.

2. Description of Related Art

A mobile electronic device, such as a smartphone, may include a camera module. The camera module may include lenses, a lens barrel surrounding the lenses, and an image sensor. The camera module may receive light reflected from an external object. The light reflected from the object may travel into the lens barrel, may pass through the lenses, and may travel to the image sensor. The image sensor may convert the received light signal into a related electrical signal.

The camera module may support various functions. For example, the camera module may support a function related to image stabilization. For example, the camera module may be configured to provide the image stabilization function by moving the image sensor in a direction perpendicular to the optical axis.

SUMMARY

Aspects of the disclosure are to address at least the above-mentioned problems and/or disadvantages and to provide at least the advantages described below. Accordingly, an aspect of the disclosure is to provide a camera module enabling a movable member (e.g., a circuit board) having an image sensor disposed thereon to move for an image stabilization function and including a connecting member that provides electrical connection of the image sensor, and an electronic device including the camera module.

According to an aspect of the disclosure, an electronic device includes a housing in which a main circuit board is disposed, and a camera module, at least part of which is disposed in the housing, the camera module being electrically connected with the main circuit board, wherein the camera module includes a camera housing, a lens assembly, at least part of which is accommodated in the camera housing, the lens assembly including a lens, a movable member including an image sensor and a first circuit board electrically connected with the image sensor, the movable member being coupled to the camera housing so as to be movable in a direction perpendicular to an optical axis of the lens, a second circuit board, at least part of which is electrically connected with the main circuit board, and a connecting member configured to electrically connect the first circuit board and the second circuit board, wherein the connecting member includes a first flexible circuit board connected with the first circuit board and a second flexible circuit board connected with the second circuit board, wherein the first flexible circuit board and the second flexible circuit board are configured to be electrically connected, and wherein each of the first flexible circuit board and the second flexible circuit board includes a first layer, a second layer disposed to face the first layer, and a via configured to electrically connect the first layer and the second layer.

According to an aspect of the disclosure, a camera module includes a camera housing, a lens assembly, at least part of which is accommodated in the camera housing, the lens assembly including a lens, and a circuit board structure for electrical connection of the camera module, wherein the circuit board structure includes a first circuit board portion on which an image sensor is disposed, a second circuit board portion on which a connector is disposed, and a third circuit board portion, at least part of which flexibly extends from the first circuit board portion toward the second circuit board portion to connect the first circuit board portion and the second circuit board portion, wherein the third circuit board portion includes a first flexible portion connected to the first circuit board portion and a second flexible portion connected to the second circuit board portion, and wherein each of the first flexible portion and the second flexible portion includes a first layer, a second layer disposed to face the first layer, an adhesive member disposed between a partial area of the first layer and a partial area of the second layer, and a VIA configured to pass through the adhesive member to electrically connect the first layer and the second layer.

BRIEF DESCRIPTION OF THE DRAWINGS

The above and other aspects, features, and advantages of certain embodiments of the disclosure will be more apparent from the following description taken in conjunction with the accompanying drawings, in which.

With regard to description of the drawings, identical or similar reference numerals may be used to refer to identical or similar components.

DETAILED DESCRIPTION

Figure 1:
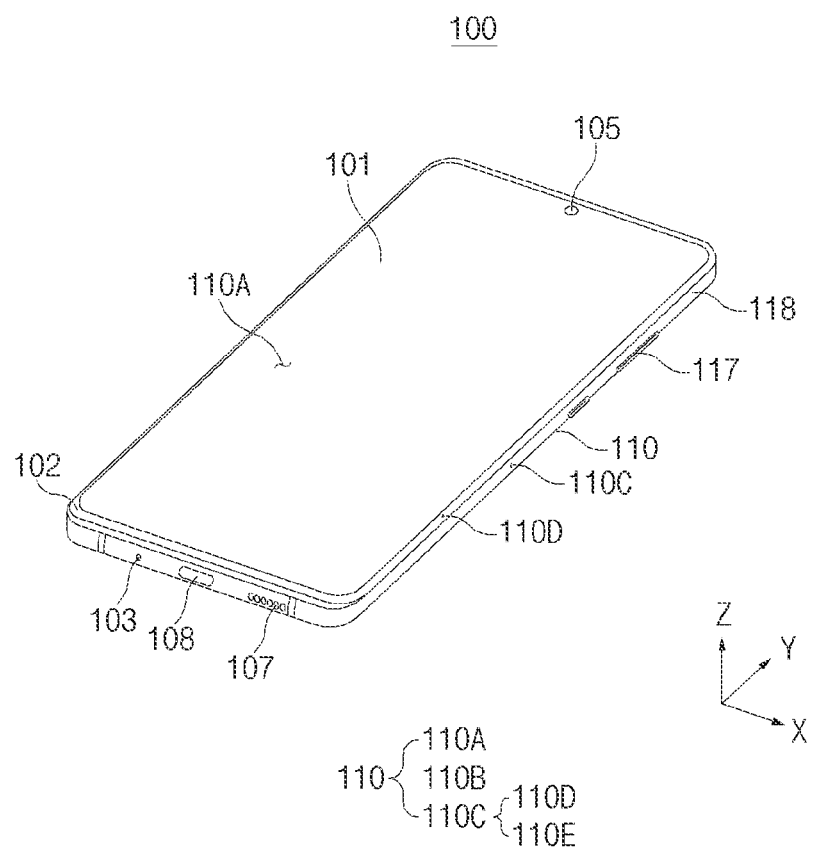
FIG. 1 is a front perspective view of an electronic device according to an embodiment.

Embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

The electronic device according to various embodiments may be one of various types of electronic devices. The electronic devices may include, for example, a portable communication device (e.g., a smartphone), a computer device, a portable multimedia device, a portable medical device, a camera, a wearable device or a home appliance. The electronic devices are not limited to those described above.

Various embodiments of the present disclosure and the terms used therein are not intended to limit the technological features set forth herein to particular embodiments and include various changes, equivalents or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B," "at least one of A and B," "at least one of A or B," "A, B or C," "at least one of A, B, and C," and "at least one of A, B or C," may include any one of or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly or via a third element.

Figure 2:
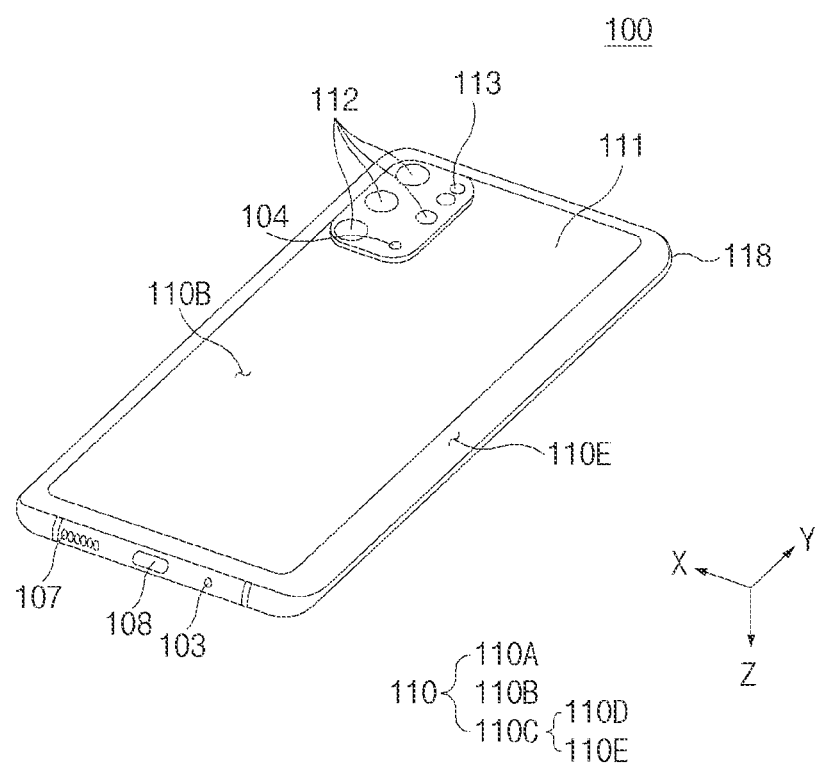
FIG. 2 is a rear perspective view of the electronic device according to an embodiment.

FIG. 1 is a front perspective view of an electronic device 100 according to an embodiment. FIG. 2 is a rear perspective view of the electronic device 100 according to an embodiment.

Referring to FIGS. 1 and 2, the electronic device 100 may include a housing 110 that includes a first surface (or a front surface) 110A, a second surface (or a rear surface) 110B, and a third surface (or a side surface) 110C surrounding the space between the first surface 110A and the second surface 110B.

Alternatively, the housing 110 may refer to a structure that forms some of the first surface 110A, the second surface 110B, and the third surface 110C.

The first surface 110A may be formed by a front plate 102, at least a portion of which is substantially transparent (e.g., a glass plate including various coating layers or a polymer plate). The second surface 110B may be formed by a back plate 111 that is substantially opaque. The back plate 111 may be formed of, for example, coated or colored glass, ceramic, a polymer, metal (e.g., aluminum, stainless steel (STS) or magnesium) or a combination of at least two of the aforementioned materials. The third surface 110C may be formed by a side bezel structure (or a side member) 118 that is coupled with the front plate 102 and the back plate 111 and that contains metal and/or a polymer.

Alternatively, the back plate 111 and the side bezel structure 118 may be integrally formed with each other and may contain the same material (e.g., a metallic material such as aluminum).

The front plate 102 may include two first areas 110D that curvedly and seamlessly extend from partial areas of the first surface 110A toward the back plate 111. The first areas 110D may be located at opposite long edges of the front plate 102.

The back plate 111 may include two second areas 110E that curvedly and seamlessly extend from partial areas of the second surface 110B toward the front plate 102. The second areas 110E may be located at opposite long edges of the back plate 111.

Alternatively, the front plate 102 (or the back plate 111) may include only one of the first areas 110D (or the second areas 110E) (or may not include a part of the first areas 110D (or the second areas 110E).

When viewed from a side of the electronic device 100, the side bezel structure 118 may have a first thickness (or width) at sides (e.g., short sides) not including the first areas 110D or the second areas 110E and may have a second thickness at sides (e.g., long sides) including the first areas 110D or the second areas 110E, the second thickness being smaller than the first thickness.

Figure 24:
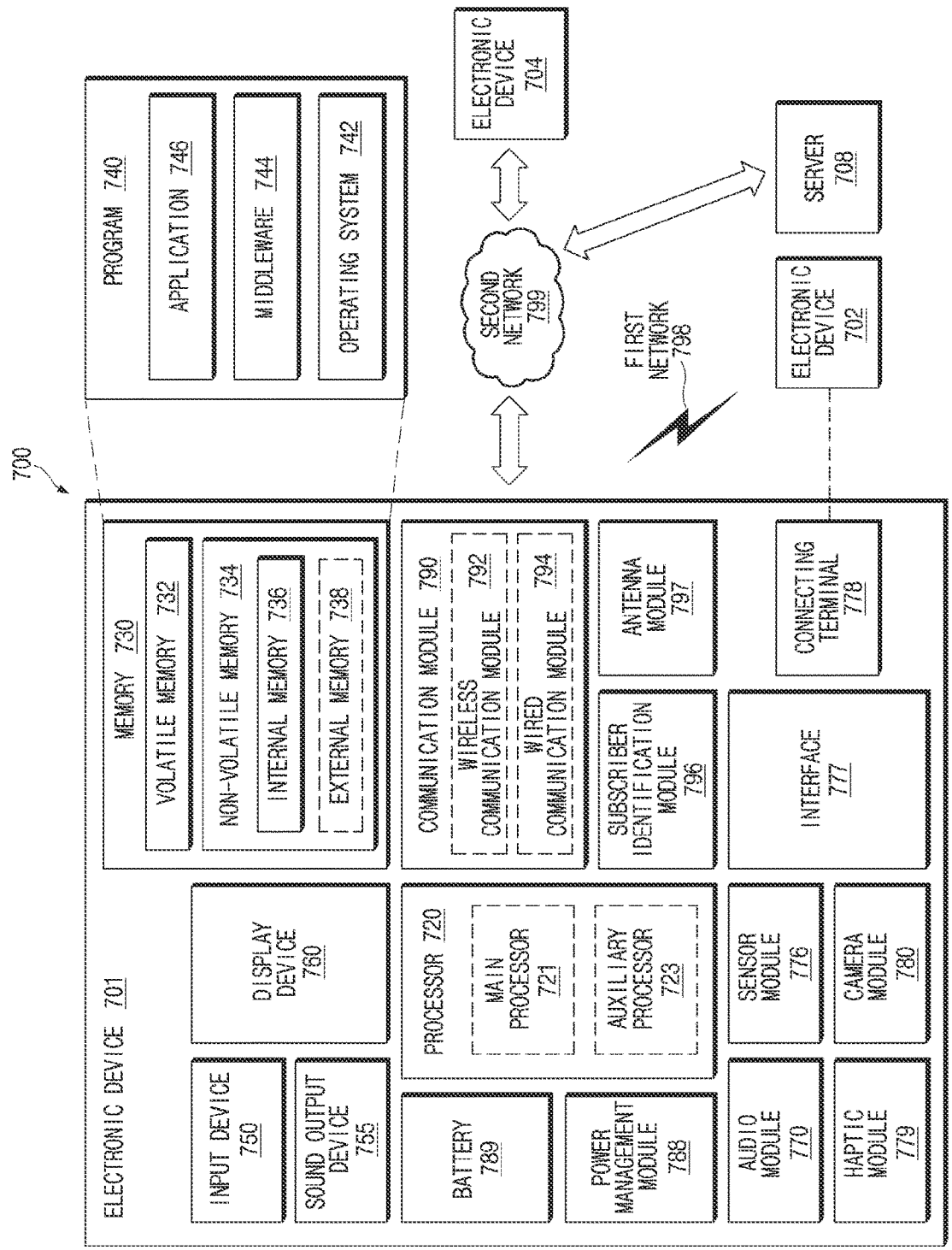
FIG. 24 is a block diagram of an electronic device in a network environment according to an embodiment.

The electronic device 100 may include at least one of a display 101, audio modules 103, 104, and 107 (e.g., an audio module 770 of FIG. 24), a sensor module (e.g., a sensor module 776 of FIG. 24), camera modules 105 112, and 113 (e.g., a camera module 780 of FIG. 24), key input devices 117 (e.g., an input device 750 of FIG. 24), a light emitting element or a connector hole 108 (e.g., a connecting terminal 778 of FIG. 24). Alternatively, at least one component (e.g., the key input devices 117 or the light emitting element) among the aforementioned components may be omitted from the electronic device 100 or other component(s) may be additionally included in the electronic device 100.

The display 101 may be visually exposed through most of the front plate 102. For example, at least a portion of the display 101 may be visually exposed through the front plate 102 that includes the first surface 110A and the first areas 110D of the third surface 110C. The display 101 may be disposed on the rear surface of the front plate 102.

The periphery of the display 101 may be formed to be substantially the same as the shape of the adjacent outside edge of the front plate 102. Alternatively, the gap between the outside edge of the display 101 and the outside edge of the front plate 102 may be substantially constant to expand the area by which the display 101 is visually exposed.

A surface of the housing 110 (or the front plate 102) may include a screen display area that is formed as the display 101 is visually exposed. For example, the screen display area may include the first surface 110A and the first areas 110D of the side surface 110C.

Alternatively, the screen display area 110A and 110D may include a sensing area that is configured to obtain biometric information of a user. When the screen display area 110A and 110D includes the sensing area, this may mean that at least a portion of the sensing area overlaps the screen display area 110A and 110D. For example, the sensing area may refer to an area capable of displaying visual information by the display 101 like other areas of the screen display area 110A and 110D and additionally obtaining biometric information (e.g., a fingerprint) of the user.

The screen display area 110A and 110D of the display 101 may include an area through which the first camera module 105 (e.g., a punch hole camera) is visually exposed. For example, at least a portion of the periphery of the area through which the first camera module 105 is visually exposed may be surrounded by the screen display area 110A and 110D. The first camera module 105 may include a plurality of camera modules (e.g., the camera module 780 of FIG. 24).

The display 101 may be configured such that at least one of an audio module, a sensor module, a camera module (e.g., the first camera module 305) or a light emitting element is disposed on the rear surface of the screen display area 110A and 110D. For example, the electronic device 100 may be configured such that the first camera module 105 (e.g., an under display camera (UDC)) is disposed on the rear side (e.g., the side facing the −z-axis direction) of the first surface 110A (e.g., the front surface) and/or the side surface IOC (e.g., at least one surface of the first areas 110D) so as to face toward the first surface 110A and/or the side surface 110C. For example, the first camera module 105 may be disposed under the display 101 and may not be visually exposed through the screen display area 110A and 110D.

The display 101 may be coupled with or disposed adjacent to, touch detection circuitry, a pressure sensor capable of measuring the intensity (pressure) of a touch, and/or a digitizer that detects a stylus pen of a magnetic field type.

The audio modules 103, 104, and 107 may include the microphone holes 103 and 104 and the speaker hole 107.

The microphone holes 103 and 104 may include the first microphone hole 103 formed in a partial area of the third surface 110C and the second microphone hole 104 formed in a partial area of the second surface 110B. A microphone for obtaining an external sound may be disposed in the microphone holes 103 and 104. The microphone may include a plurality of microphones to sense the direction of a sound.

The second microphone hole 104 formed in the partial area of the second surface 110B may be disposed adjacent to the camera modules 105, 112, and 113. For example, the second microphone hole 104 may obtain sounds when the camera modules 105, 112, and 113 are executed or may obtain sounds when other functions are executed.

The speaker hole 107 may include an external speaker hole 107 and a receiver hole for telephone call. The external speaker hole 107 may be formed in a portion of the third surface 110C of the electronic device 100. Alternatively, the external speaker hole 107 and the microphone hole 103 may be implemented as a single hole. The receiver hole for telephone call may be formed in another portion of the third surface 110C. For example, the receiver hole for telephone call may be formed in another portion (e.g., a portion facing the +y-axis direction) of the third surface 110C that faces the portion (e.g., a portion facing the −y-axis direction) of the third surface 110C in which the external speaker hole 107 is formed. The receiver hole for telephone call may not be formed in a portion of the third surface 110C and may be formed by the separation space between the front plate 102 (or the display 101) and the side bezel structure 118.

The electronic device 100 may include at least one speaker that is configured to output a sound outside the housing 110 through the external speaker hole 107 or the receiver hole for telephone call. The speaker may include a piezoelectric speaker not including the speaker hole 107.

The sensor module may generate an electrical signal or a data value that corresponds to an operational state inside the electronic device 100 or an environmental state external to the electronic device 100. For example, the sensor module may include at least one of a proximity sensor, a heart rate monitor (HRM) sensor, a fingerprint sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor or an illuminance sensor.

The camera modules 105, 112, and 113 may include the first camera module 105 (e.g., a punch hole camera) exposed on the first surface 110A of the electronic device 100, the second camera module 112 exposed on the second surface 110B, and/or the flash 113.

The first camera module 105 may be visually exposed through a portion of the screen display area 110A and 110D of the display 101. For example, the first camera module 105 may be visually exposed on a partial area of the screen display area 110A and 110D through an opening that is formed in a portion of the display 101. In another example, the first camera module 105 (e.g., a UDC) may be disposed on the rear surface of the display 101 and may not be visually exposed through the screen display area 110A and 110D.

The second camera module 112 may include a plurality of cameras (e.g., a dual camera, a triple camera or a quad camera). However, the second camera module 112 is not necessarily limited to including the plurality of cameras and may include one camera.

The first camera module 105 and the second camera module 112 may include one or more lenses, an image sensor, and/or an image signal processor (ISP). A flash 113 may include, for example, a light emitting diode or a xenon lamp. Alternatively, two or more lenses (an IR camera lens, a wide angle lens, and a telephoto lens) and image sensors may be disposed on one surface of the electronic device 100.

The key input devices 117 may be disposed on the third surface 110C (e.g., the first areas 110D and/or the second areas 110E) of the housing 110. Alternatively, the electronic device 100 may not include all or some of the key input devices 117, and the key input devices 117 not included may be implemented in a different form, such as a soft key, on the display 101. Alternatively, the key input devices 117 may include a sensor module that forms the sensing area that is included in the screen display area 110A and 110D.

The connector hole 108 may accommodate a connector. The connector hole 108 may be disposed in the third surface 110C of the housing 110. For example, the connector hole 108 may be disposed in the third surface 110C so as to be adjacent to at least a part of the audio modules (e.g., the microphone hole 103 and the speaker hole 107). Alternatively, the electronic device 100 may include the first connector hole 108 capable of accommodating a connector (e.g., a universal serial bus (USB) connector) for transmitting/receiving power and/or data with an external electronic device, and/or a second connector hole capable of accommodating a connector (e.g., an earphone jack) for transmitting/receiving audio signals with an external electronic device.

The electronic device 100 may include the light emitting element. For example, the light emitting element may be disposed on the first surface 110A of the housing 110. The light emitting element may provide state information of the electronic device 100 in the form of light. Alternatively, the light emitting element may provide a light source that operates in conjunction with an operation of the first camera module 105. For example, the light emitting element may include an LED, an IR LED, and/or a xenon lamp.

Figure 3:
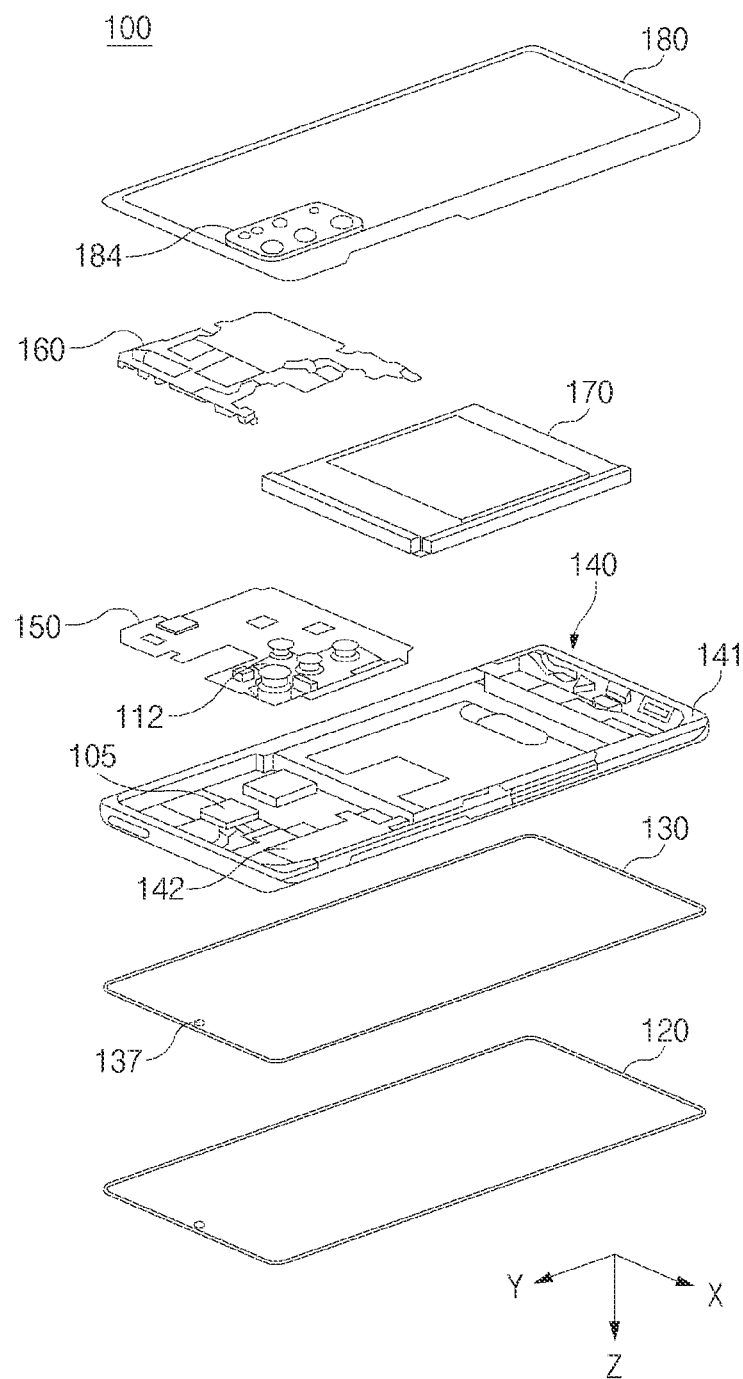
FIG. 3 is an exploded perspective view of the electronic device according to an embodiment.

FIG. 3 is an exploded perspective view of the electronic device 100 according to an embodiment.

Referring to FIG. 3, the electronic device 100 may include a front plate 120 (e.g., the front plate 102 of FIG. 1), a display 130 (e.g., the display 101 of FIG. 1), a side member 140 (e.g., the side bezel structure 118 of FIG. 1), a printed circuit board (PCB) 150, a rear case 160, a battery 170, a back plate 180 (e.g., the back plate 111 of FIG. 2), and an antenna.

The electronic device 100 may not include at least one component (e.g., the rear case 160) among the aforementioned components or may additionally include other component(s). Some of the components of the electronic device 100 illustrated in FIG. 3 may be the same as or similar to, some of the components of the electronic device illustrated in FIGS. 1 and 2 (e.g., the electronic device 100 of FIGS. 1 and 2), and therefore repetitive descriptions will hereinafter be omitted.

The front plate 120 and the display 130 may be coupled to the side member 140. For example, the front plate 120 and the display 130 may be disposed under the side member 140 based on FIG. 3. The front plate 120 and the display 130 may be located in the +z-axis direction from the side member 140. For example, the display 130 may be coupled to the bottom of the side member 140, and the front plate 120 may be coupled to the bottom of the display 130. The front plate 120 may form a portion of the outer surface (or the exterior) of the electronic device 100. The display 130 may be disposed between the front plate 120 and the side member 140 so as to be located inside the electronic device 100.

The side member 140 may be disposed between the display 130 and the back plate 180. For example, the side member 140 may be configured to surround the space between the back plate 180 and the display 130.

The side member 140 may include a frame structure 141 forming a portion of the side surface (e.g., the third surface 110C of FIG. 1) of the electronic device 100 and a plate structure 142 extending inward from the frame structure 141.

The plate structure 142 may be disposed inside the frame structure 141 so as to be surrounded by the frame structure 141. The plate structure 142 may be connected with the frame structure 141 or may be integrally formed with the frame structure 141. The plate structure 142 may be formed of a metallic material and/or a nonmetallic (e.g., polymer) material. The plate structure 142 may support other components included in the electronic device 100. For example, at least one of the display 130, the PCB 150, the rear case 160 or the battery 170 may be disposed on the plate structure 142. For example, the display 130 may be coupled to one surface (e.g., the surface facing the +z-axis direction) of the plate structure 142, and the PCB 150 may be coupled to an opposite surface (e.g., the surface facing the −z-axis direction) facing away from the one surface.

The rear case 160 may be disposed between the back plate 180 and the plate structure 142. The rear case 160 may be coupled to the side member 140 so as to overlap at least a portion of the PCB 150. For example, the rear case 160 may face the plate structure 142 with the PCB 150 therebetween.

A processor (e.g., a processor 720 of FIG. 24), memory (e.g., memory 730 of FIG. 24), and/or an interface (e.g., an interface 777 of FIG. 24) may be mounted on the PCB 150. The processor may include, for example, one or more of a central processing unit (CPU), an application processor (AP), a graphics processing unit (GPU), an ISP, a sensor hub processor or a communication processor (CP). The memory may include, for example, volatile memory or nonvolatile memory. The interface may include, for example, a high-definition multimedia interface (HDMI), a USB interface, a secure digital (SD) card interface, and/or an audio interface. The interface may electrically or physically connect the electronic device 100 with an external electronic device and may include a USB connector, an SD card/multimedia card (MMC) connector or an audio connector.

The battery 170 may supply power to at least one component of the electronic device 100. For example, the battery 170 may include a primary cell that is not rechargeable, a secondary cell that is rechargeable or a fuel cell. At least a portion of the battery 170 may be disposed on substantially the same plane as the PCB 150. The battery 170 may be integrally disposed inside the electronic device 100 or may be disposed to be detachable from the electronic device 100.

The antenna may be disposed between the back plate 180 and the battery 170. The antenna may include, for example, a near field communication (NFC) antenna, a wireless charging antenna, and/or a magnetic secure transmission (MST) antenna. For example, the antenna may perform short-range communication with an external device or may wirelessly transmit and receive power required for charging.

The first camera module 105 may be disposed on at least the plate structure 142 of the side member 140 such that a lens receives external light through a partial area of the front surface 110A. For example, the lens of the first camera module 105 may be visually exposed through a camera area 137 of the front plate 120.

The second camera module 112 may be disposed on the PCB 150 such that a lens receives external light through a camera area 184 of the rear surface 1101B of the electronic device 100. For example, the lens of the second camera module 112 may be visually exposed through the camera area 184. The second camera module 112 may be disposed in at least a portion of the inner space formed in the housing 110 of the electronic device 100 and may be electrically connected to the PCB 150 through a connecting member (e.g., a connector).

The camera area 184 may be formed in the rear surface 310B of the back plate 180. The camera area 184 may be formed to be at least partially transparent such that external light is incident on the lens of the second camera module 112. At least a portion of the camera area 184 may protrude to a predetermined height from the surface of the back plate 180. However, without being necessarily limited thereto, the camera area 184 may form substantially the same plane as the surface of the back plate 180.

Figure 4:
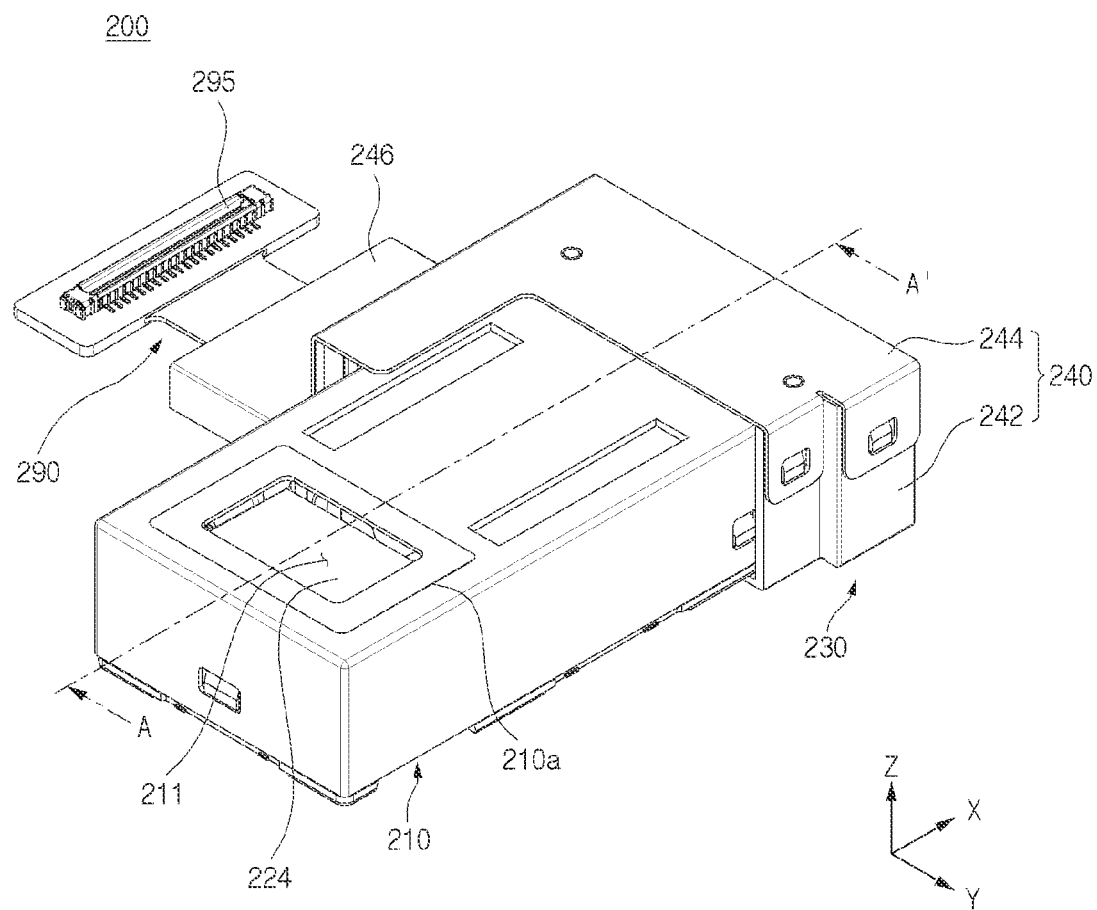
FIG. 4 is a perspective view of a camera module according to an embodiment.
Figure 5:
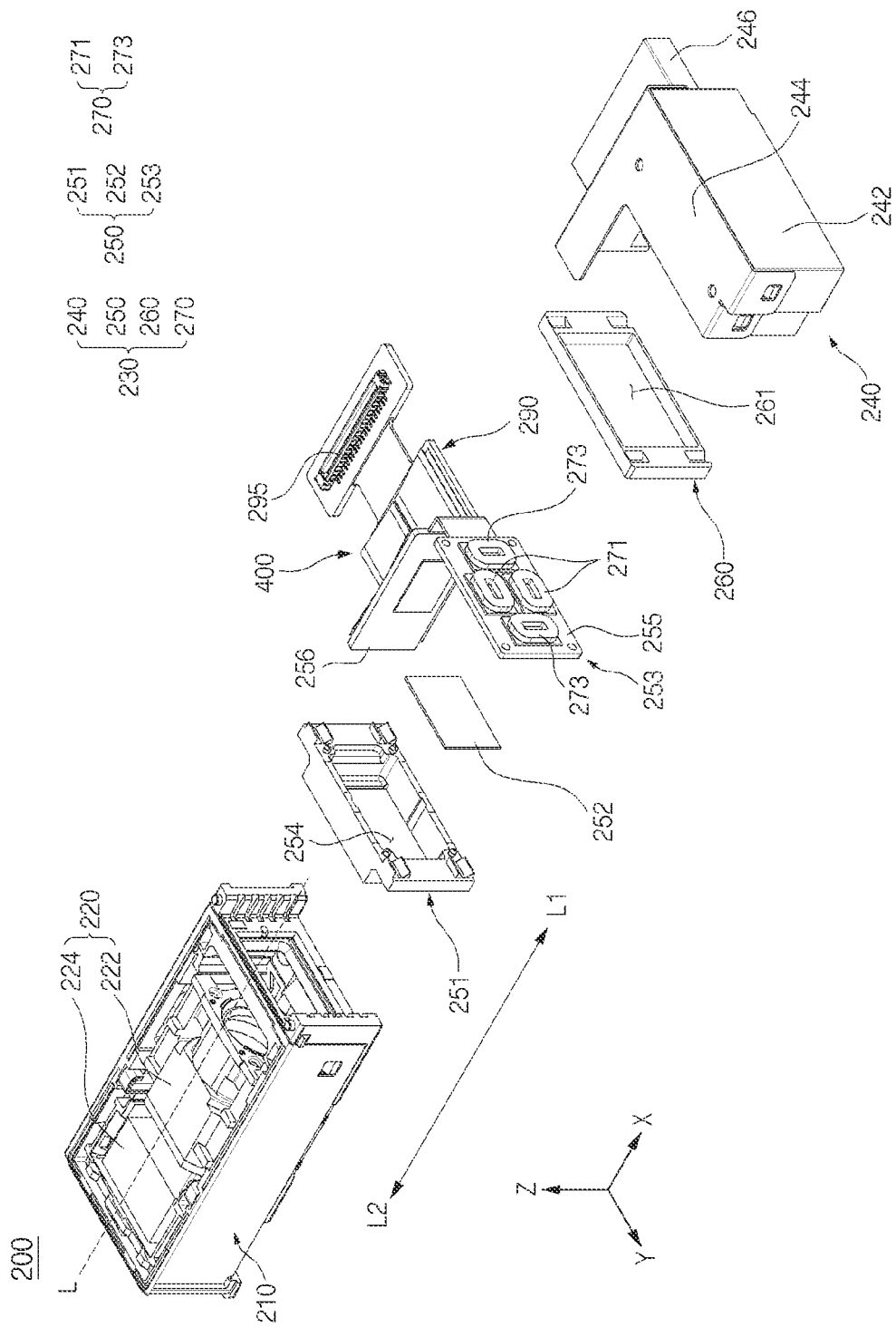
FIG. 5 is an exploded perspective view of the camera module according to an embodiment.
Figure 6:
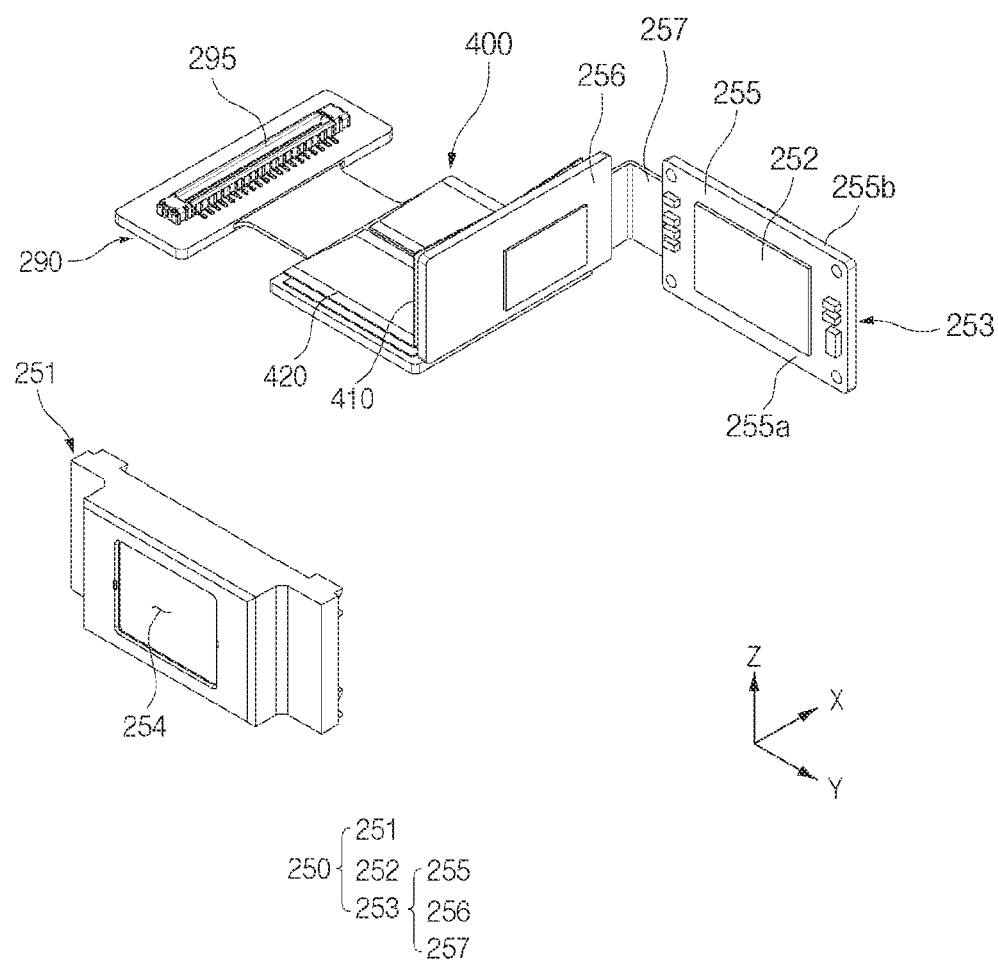
FIG. 6 illustrates a movable member and a connecting member of the camera module according to an embodiment.

FIG. 4 is a perspective view of a camera module 200 according to an embodiment. FIG. 5 is an exploded perspective view of the camera module 200 according to an embodiment. FIG. 6 illustrates a movable member 250 and a connecting member 400 of the camera module 200 according to an embodiment.

Referring to FIGS. 4, 5 and 6, the camera module 200 may include a camera housing 210, a lens assembly 220, an image stabilization assembly 230, a second circuit board 290, and the connecting member 400.

The camera housing 210 may form at least a portion of the exterior of the camera module 200. A surface of the camera housing 210 may form a portion of the outer surface or the exterior of the camera module 200. The camera housing 210 may accommodate a part of other components of the camera module 200. The lens assembly 220 may be accommodated in the camera housing 210.

The camera housing 210 may be connected with a part of the image stabilization assembly 230. For example, the camera housing 210 may be connected with a frame 242 and/or a cover 244 of the image stabilization assembly 230. The camera housing 210 may form the exterior of the camera module 200 together with the frame 242 and/or the cover 244. The camera housing 210 may be integrally formed with the frame 242 and/or the cover 244.

The camera housing 210 may have, in one surface thereof, a light receiving area 211 through which a reflective member 224 is visually exposed. For example, the light receiving area 211 may be formed in a portion of a first surface 210a facing the +z-axis direction of the camera housing 210. For example, the light receiving area 211 may include an opening area (or a through-hole through which a portion of the reflective member 224 is directly exposed outside the camera housing 210. The light receiving area 211 may include a transparent area (e.g., a window cover). The first surface 210a of the camera housing 210 may be parallel to a portion of the rear surface 110B of the electronic device 100 or may form a portion of the rear surface 110B of the electronic device 100. In an embodiment, external light may be incident on the reflective member 224, which is disposed in the camera housing 210, through the light receiving area 211.

As illustrated in FIG. 4, at least a portion of the reflective member 224 may be visually exposed outside the camera housing 210 through the light receiving area 211. For example, at least a portion of the reflective member 224 may overlap the light receiving area 211 when the first surface 210a of the camera housing 210 is viewed from above.

The lens assembly 220 may be disposed in the camera housing 210. The lens assembly 220 may include a lens unit 222 and the reflective member 224. For example, the lens unit 222 and the reflective member 224 of the lens assembly 220 may be located in the camera housing 210. The lens unit 222 and the reflective member 224 may be aligned with the image stabilization assembly 230 (or an image sensor 252 in the direction of an optical axis L of a lens. For example, the optical axis L of the lens may be defined as a virtual axis extending in the direction in which light incident on the lens through the reflective member 224 passes through the lens. For example, the optical axis L may extend substantially parallel to the x-axis.

The lens unit 222 may include at least one lens. For example, the lens unit 222 may include one lens or may include a plurality of lenses. At least a portion of the lens unit 222 may be accommodated in a lens carrier, and the lens carrier may be disposed in the camera housing 210. The lens carrier may be configured to move in the direction of the optical axis L inside the camera housing 210. For example, the lens unit 222 may move straight (or may move linearly) in the direction of the optical axis L together with the lens carrier.

The lens unit 222 may be disposed between the reflective member 224 and the image stabilization assembly 230. For example, the lens unit 222 may be located between the reflective member 224 and the image sensor 252 based on the direction of the optical axis L. The reflective member 224, the lens unit 222, and the image sensor 252 may be at least partially disposed on the optical axis L. For example, the image sensor 252 may be disposed in a first optical axis direction L1 (e.g., the +x-axis direction) from the lens unit 222, and the reflective member 224 may be disposed in a second optical axis direction L2 (e.g., the −x-axis direction) from the lens unit 222. As illustrated in FIG. 5, the reflective member 224, the lens unit 222, and the image sensor 252 may be sequentially disposed along the first optical axis direction L1. Herein, external light may be incident on the reflective member 224 through the light receiving area 211 and may be reflected or refracted by the reflective member 224 to travel toward the lens unit 222 and/or the image sensor 252.

The reflective member 224 may be disposed in the camera housing 210 to face the image sensor 252 with the lens unit 222 therebetween. For example, the reflective member 224 may be located in the second optical axis direction L2 (e.g., the −x-axis direction) with respect to the lens unit 222. For example, the lens unit 222 and the image sensor 252 may be sequentially disposed in the first optical axis direction L1 (e.g., the +x-axis direction) from the reflective member 224.

The reflective member 224 may be configured to reflect or refract external light incident through the light receiving area 211. For example, external light reflected from an object may be incident on the reflective member 224 in a direction (e.g., the z-axis direction) perpendicular to the optical axis L through the light receiving area 211. The light incident on the reflective member 224 may be reflected and/or refracted in the direction of the optical axis L by the reflective member 224 and may pass through the lens of the lens unit 222, and the light passing through the lens may be incident on the image sensor 252. The plurality of lenses of the lens unit 222 may condense the light reflected or refracted by the reflective member 224. The condensed light may form an image on the image sensor 252 of the image stabilization assembly 230. The reflective member 224 may include a prism or an inclined mirror.

The lens assembly 220 may further include a focus drive unit that is configured to move at least a portion of the lens unit 222 in the direction of the optical axis L. For example, the focus drive unit may include a magnet that is disposed on one of the lens unit 222 and the camera housing 210 and a coil that is disposed on the other one of the lens unit 222 and the camera housing 210. For example, the magnet and the coil may be configured to electromagnetically interact with each other. The lens unit 222 may be configured to move in the direction of the optical axis L by an electromagnetic force (e.g., Lorentz force) generated between the coil and the magnet. The camera module 200 may be configured to perform a zoom function and/or an auto focus (AF) function by moving the lens unit 222 in the first optical axis direction L1 or the second optical axis direction L2 using the focus drive unit.

The image stabilization assembly 230 may perform an optical image stabilizer (OIS) function in response to external noise (e.g., a shaking movement of the user's hand or vibration) applied to the camera module 200.

The image stabilization assembly 230 may include a fixed member 240, the movable member 250, a guide member 260, and a drive member 270.

The fixed member 240 may be coupled with the camera housing 210 so as to be fixed to the camera housing 210. The fixed member 240 may include the cover 244 and the frame 242. For example, the cover 244 and/or the frame 242 may be connected to the camera housing 210 or may be integrally formed with the camera housing 210. The cover 244 and the frame 242 may be integrally formed with each other or may be coupled so as to be detachable from each other. For example, the cover 244 and the frame 242 may form a predetermined space in which the movable member 250 is disposed. For example, the frame 242 may include an extending portion 246 surrounding at least a portion of the connecting member 400.

The movable member 250 may be configured to move in a direction perpendicular to the optical axis L. The movable member 250 may move relative to the camera housing 210 and the fixed member 240 in the direction perpendicular to the optical axis L. For example, the image stabilization assembly 230 may perform an image stabilization function by moving the movable member 250 in the direction perpendicular to the optical axis L (e.g., the y-axis direction and/or the z-axis direction). For example, light reflected from the object may pass through the lens assembly 220 and may form an image on the image sensor 252. The image formed on the image sensor 252 may be shaken by external noise. For example, the image stabilization assembly 230 may move the image sensor 252 to compensate for the shake in response to the external noise. When the image sensor 252 moves, the optical axis L may be located to deviate from the center of the image sensor 252. The image stabilization assembly 230 may compensate for the image shake by moving the movable member 250 including the image sensor 252 in the direction perpendicular to the optical axis L.

The movable member 250 may include a holder 251, a first circuit board 253, and the image sensor 252. For example, the holder 251, the first circuit board 253, and the image sensor 252 may be coupled or connected so as to move together in the direction perpendicular to the optical axis L.

The holder 251 may be coupled to the first circuit board 253 so as to move together with the first circuit board 253. For example, the holder 251 may be coupled to the first circuit board 253 through insertion-coupling. The holder 251 may include protrusions that are press-fit into holes of the first circuit board 253 or may include holes into which protrusions formed on the first circuit board 253 are press-fit. For example, the holder 251 may move together with the image sensor 252 and the first circuit board 253 when the image stabilization function is performed.

The holder 251 may have a first opening area 254 formed therein to be aligned with the image sensor 252 in the direction of the optical axis L. For example, the image sensor 252 may face the lens unit 222 through the first opening area 254. Light passing through the lens unit 222 may be incident on the image sensor 252 through the first opening area 254.

The first circuit board 253 may be configured such that the image sensor 252 is electrically connected to one portion of the first circuit board 253 and the connecting member 400 is electrically connected to another portion of the first circuit board 253. The first circuit board 253 may include a first portion 255 substantially perpendicular to the optical axis L, a second portion 256 disposed to be substantially perpendicular to the first portion 255, and a connecting portion 257 connecting the first portion 255 and the second portion 256. For example, the image sensor 252 may be connected to or disposed on, the first portion 255 of the first circuit board 253, and the connecting member 400 may be connected to the second portion 256 of the first circuit board 253. For example, the second portion 256 may be disposed substantially parallel to the optical axis L. The connecting portion 257 may be formed in a shape in which one portion is bent such that the first portion 255 and the second portion 256 are perpendicular to each other. The first circuit board 253 may be configured such that the first portion 255, the second portion 256, and the connecting portion 257 are integrally formed or are manufactured as separate parts and assembled together.

The first portion 255 of the first circuit board 253 may include a first surface 255a facing toward the lens assembly 220 and a second surface 255b facing away from the first surface 255a. For example, the first surface 255a may be a surface facing the second optical axis direction L2 (e.g., the −x-axis direction), and the second surface 255b may be a surface facing the first optical axis direction L1 (e.g., the +x-axis direction). The image sensor 252 may be disposed on the first surface 255a of the first portion 255 of the first circuit board 253. One or more coils 271 and 273 may be disposed on the second surface 255b of the first portion 255 of the first circuit board 253. The first circuit board 253 may be disposed such that the first opening area 254 of the holder 251 and the image sensor 252 are aligned with each other with respect to the optical axis L.

The image sensor 252 may be at least partially aligned with the optical axis L. The image sensor 252 may be electrically connected with the first circuit board 253 or may be disposed on the first surface 255a of the first circuit board 253 (e.g., the first portion 255). The image sensor 252 may be configured to receive light passing through the lens and generate an electrical signal based on the received light signal. For example, the image sensor 252 may face the lens included in the lens unit 222 through the first opening area 254 of the holder 251. To compensate for a shake, the image stabilization assembly 230 may move the movable member 250 (e.g., the holder 251, the first circuit board 253, and the image sensor 252) in at least one direction perpendicular to the optical axis L in response to the direction in which the camera module 200 is shaken.

The plurality of coils 271 and 273 may be located on the second surface 255b of the first portion 255 of the first circuit board 253. The plurality of coils 271 and 273 may include the first coil 271 that provides a driving force for a movement of the first circuit board 253 (or the image sensor 252) in the y-axis direction and the second coil 273 that provides a driving force for a movement of the first circuit board 253 (or the image sensor 252) in the z-axis direction. The plurality of coils 271 and 273 may interact with a plurality of magnets on the frame 242 of the fixed member 240 to provide the driving forces for moving the first circuit board 253.

The image stabilization assembly 230 (or the camera module 200) may perform the image stabilization function by moving the first circuit board 253 (or the image sensor 252) in a direction perpendicular to the optical axis L (e.g., the y-axis direction and/or the z-axis direction) by applying electrical signals to the plurality of coils 271 and 273. For example, the first coil 271 and the second coil 273 may electromagnetically interact with the plurality of magnets on the frame 242. For example, when the electrical signals are applied to the plurality of coils 271 and 273, a magnetic field may be formed, and an electromagnetic force may be generated between the plurality of coils 271 and 273 and the plurality of magnets. The movable member 250 may be configured to move in the y-axis direction and/or the z-axis direction relative to the lens assembly 220 and the fixed member 240 by the electromagnetic force.

The guide member 260 may be configured to support a movement of the movable member 250. For example, the guide member 260 may be coupled to be movable relative to the holder 251 and the fixed member 240. For example, the guide member 260 may be coupled to the holder 251 so as to be movable in the y-axis direction and may be coupled to the frame 242 of the fixed member 240 so as to be movable in the z-axis direction. The guide member 260 may be coupled to the frame 242 such that a movement of the guide member 260 relative to the frame 242 in the y-axis direction is limited.

When the image stabilization function is performed, the guide member 260 may move together with the movable member 250 or may be fixed without moving together with the movable member 250. For example, the guide member 260 may be configured to move in the z-axis direction together with the movable member 250 when the movable member 250 moves in the z-axis direction. For example, the guide member 260 may be configured to be separated from the movement of the movable member 250 in the y-axis direction by being fixed to the frame 242 when the movable member 250 moves in the y-axis direction. For example, the guide member 260 may support the movement of the movable member 250 in the y-axis direction.

The guide member 260 may have a second opening area 261 formed therein through which the plurality of coils 271 and 273 on the first circuit board 253 face the plurality of magnets on the frame 242 of the fixed member 240.

The second circuit board 290 may be configured to electrically connect the camera module 200 with a main circuit board (e.g., the PCB 150 of FIG. 3) of an electronic device (e.g., the electronic device 100 of FIGS. 1 to 3). For example, the second circuit board 290 may be electrically connected with the first circuit board 253 of the camera module 200 and the main circuit board 150 of the electronic device 100. The second circuit board 290 may be electrically connected with the first circuit board 253 through the connecting member 400. The second circuit board 290 may include a connector 295. For example, the connector 295 may be disposed on or connected to, a portion of the second circuit board 290. The connector 295 may be electrically connected to the main circuit board (e.g., the PCB 150 of FIG. 3) of the electronic device (e.g., the electronic device 100 of FIGS. 1 to 3).

The second circuit board 290 may be fixedly disposed in the housing of the electronic device 100 (e.g., the housing 110 of FIGS. 1 and 2). For example, the second circuit board 290 may be fixed inside the housing 110 by connection of the connector 295 to the main circuit board 150 of the electronic device 100. When the first circuit board 253 moves as the image stabilization function is performed, the second circuit board 290 may remain fixed without moving together.

The connecting member 400 may electrically connect the first circuit board 253 and the second circuit board 290. For example, the connecting member 400 may be connected to the first circuit board 253 and the second circuit board 290 and may perform a function of transferring an electrical signal and/or a control signal between the processor of the electronic device 100 (e.g., the processor 720 of FIG. 24) and the camera module 200. For example, a control signal and/or an electrical signal generated from the processor 720 disposed on the main circuit board (e.g., the PCB 150 of FIG. 3) may be transferred to a part (e.g., the image stabilization assembly 230 or the lens assembly 220) of the camera module 200 through the connecting member 400. Furthermore, an image-related electrical signal generated by the image sensor 252 may be transferred to the processor of the electronic device 100 (e.g., the processor 720 of FIG. 24) through the connecting member 400.

When the first circuit board 253 moves relative to the second circuit board 290 as the image stabilization function is performed, the connecting member 400, which electrically connects the first circuit board 253 and the second circuit board 290, may be deformed while at least a portion of the connecting member 400 moves together. The connecting member 400 may include one or more flexible circuit boards 410 and 420. For example, the flexible circuit boards 410 and 420 may include a flexible PCB (FPCB).

The connecting member 400 may include the first flexible circuit board 410 connected to the first circuit board 253 and the second flexible circuit board 420 connected to the second circuit board 290. The connecting member 400 may include two first flexible circuit boards 410 and two second flexible circuit boards 420. For example, the two first flexible circuit boards 410 may be disposed on the first circuit board 253 so as to be symmetrical to each other, and the two second flexible circuit boards 420 may be disposed on the second circuit board 290 so as to be symmetrical to each other. However, the numbers of first flexible circuit boards 410 and second flexible circuit boards 420 are not limited to the illustrated embodiment, and the connecting member 400 may include one, three or more first flexible circuit boards 410 and one, three or more second flexible circuit boards 420. The number of first flexible circuit boards 410 and the number of second flexible circuit boards 420 may differ from each other.

The first flexible circuit boards 410 and the second flexible circuit boards 420 may be electrically connected. For example, the first flexible circuit boards 410 and the second flexible circuit boards 420 may be directly connected while being integrally formed with each other as the second flexible circuit boards 420 extend from portions of the first flexible circuit boards 410. In another example, the first flexible circuit boards 410 and the second flexible circuit boards 420 may be indirectly connected through connecting circuit boards.

When the movable member 250 moves in a direction perpendicular to the optical axis L, the second circuit board 290 may be fixed, and the first circuit board 253 may move relative to the second circuit board 290. For example, the first flexible circuit boards 410 and the second flexible circuit boards 420 may be at least partially deformed or may move, in response to the movement of the first circuit board 253, as will be described with reference to FIGS. 9 to 14.

The connecting member 400 may be configured to be a part separate from the first circuit board 253 and the second circuit board 290. However, without being limited thereto, at least some of the connecting member 400, the first circuit board 253, and the second circuit board 290 may be integrally formed. The connecting member 400, the first circuit board 253, and the second circuit board 290 may be integrally formed and may be configured to be one circuit board structure. For example, the circuit board structure may be implemented with a rigid FPCB (RFPCB) so as to include the first circuit board 253 and the second circuit board 290 and the connecting member 400.

Figure 7:
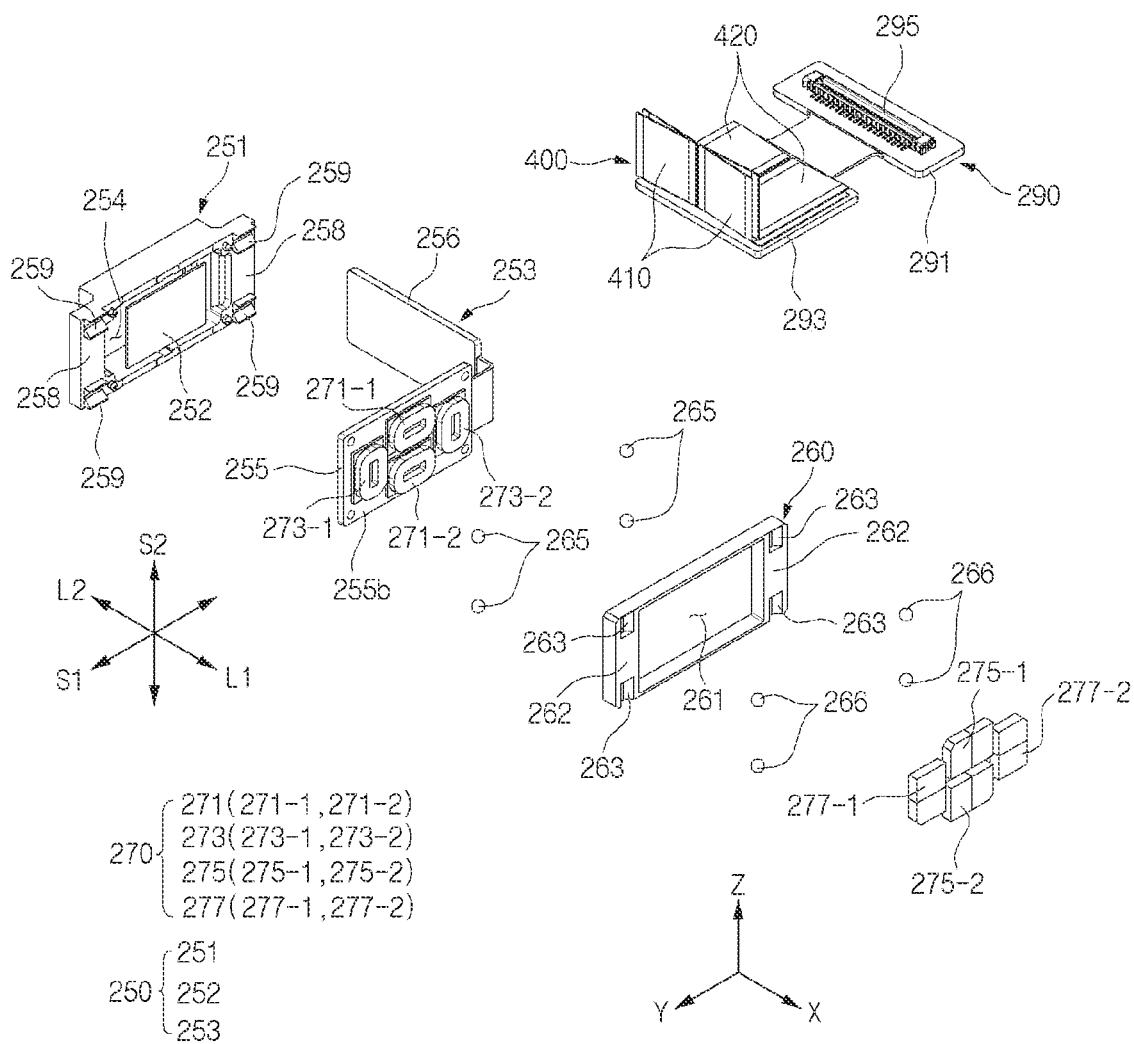
FIG. 7 illustrates a movable member, a guide member, and a drive member of an image stabilization assembly according to an embodiment.
Figure 8:
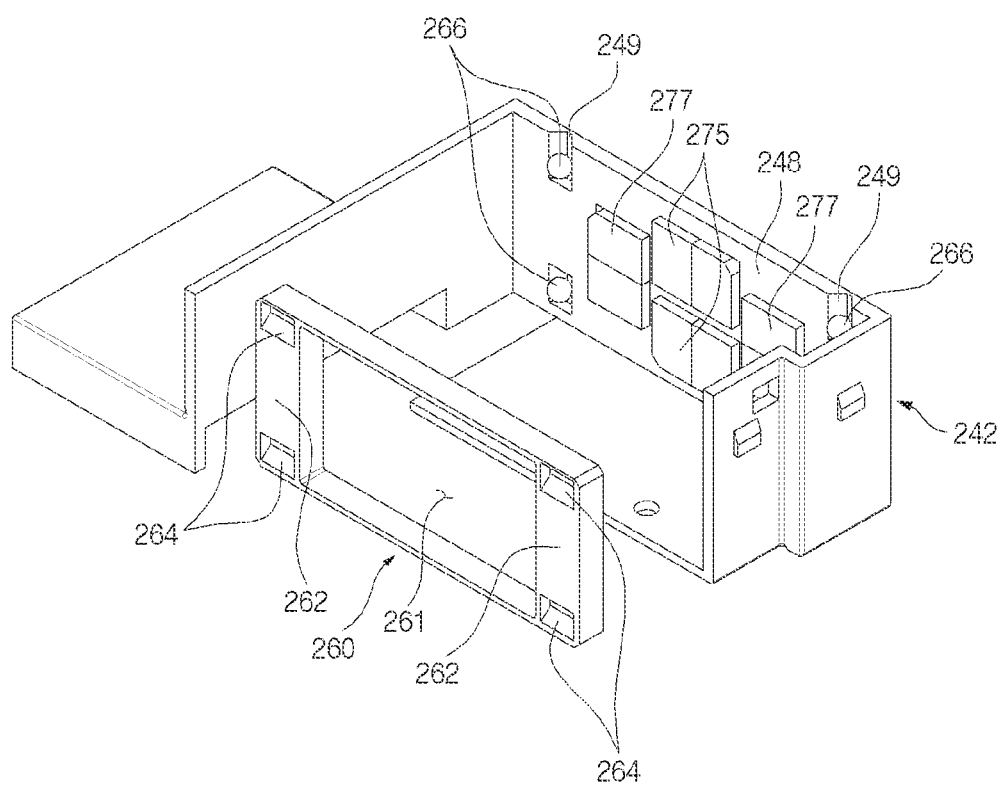
FIG. 8 illustrates a coupling structure of the guide member and a frame of the image stabilization assembly according to an embodiment.

FIG. 7 illustrates the movable member 250, the guide member 260, and the drive member 270 of the image stabilization assembly 230 according to an embodiment. FIG. 8 illustrates a coupling structure of the guide member 260 and the frame 242 of the image stabilization assembly 230 according to an embodiment.

Referring to FIGS. 7 and 8, the images stabilization assembly 230 of the camera module 200 may include the frame 242 the movable member 250, the guide member 260, and the drive member 270. Some of the components of the image stabilization assembly 230 illustrated in FIGS. 7 and 8 are the same as or similar to, some of the components of the camera module 200 illustrated in FIGS. 4 to 6, and therefore repetitive descriptions will hereinafter be omitted.

The movable member 250 may include the holder 251, the first circuit board 253 coupled to the holder 251, and the image sensor 252 disposed on one area of the first circuit board 253 (e.g., the first surface 255a of the first portion 255). The movable member 250 may be configured to move in the direction of a first shift axis S1 and the direction of a second shift axis S2 perpendicular to the optical axis L (e.g., the x-axis direction) when an image stabilization function is performed. For example, the first shift axis S1 and the second shift axis S2 may be perpendicular to each other. For example, the first shift axis S1 may be substantially parallel to the y-axis, and the second shift axis S2 may be substantially parallel to the z-axis.

The drive member 270 may be configured to provide a driving force for moving the movable member 250 in a direction perpendicular to the optical axis L. For example, the drive member 270 may generate a driving force for moving the movable member 250 in the direction of the first shift axis S1 and/or the direction of the second shift axis S2.

The drive member 270 may include the plurality of coils 271 and 273 and a plurality of magnets 275 and 277. The plurality of coils 271 and 273 may be disposed on the first circuit board 253 of the movable member 250. The plurality of magnets 275 and 277 may be disposed on the frame 242 of the fixed member 240. Accordingly, the movable member 250 may be configured to move relative to the fixed member 240 by an interaction between the plurality of magnets 275 and 277 and the plurality of coils 271 and 273.

The plurality of coils 271 and 273 and the plurality of magnets 275 and 277 may be disposed to at least partially overlap each other when viewed in the direction of the optical axis L (e.g., the x-axis direction). For example, the plurality of coils 271 and 273 may be disposed on the second surface 255b of the first portion 255 of the first circuit board 253. The plurality of magnets 275 and 277 may be disposed on a sidewall 248 of the frame 242 to face the plurality of coils 271 and 273. The sidewall 238 of the frame 242 and the second surface 255b of the first portion 255 of the first circuit board 253 may be located to face each other in the direction of the optical axis L.

The drive member 270 may include a first drive member 270 for moving the movable member 250 in the direction of the first shift axis S1 (e.g., the y-axis direction) and a second drive member 270 for moving the movable member 250 in the direction of the second shift axis S2 (e.g., the z-axis direction).

The first drive member 270 may include the first coil 271 and the first magnet 275. The first coil 271 may be disposed on the second surface 255b of the first circuit board 253, and the first magnet 275 may be disposed on the sidewall 248 of the frame 242. The first coil 271 and the first magnet 275 may be disposed to at least partially overlap each other when viewed in the direction of the optical axis L (e.g., the x-axis direction).

An electrical signal may be applied to the first coil 271. For example, the electrical signal may be applied through the second circuit board 290, the connecting member 400, and/or the first circuit board 253. A processor of the electronic device may control the direction and/or strength of an electric current passing through the first coil 271. An electromagnetic force (e.g., Lorentz force) may be applied to the first magnet 275 to correspond to the direction of the electric current passing through the first coil 271. The movable member 250 may be moved (linearly moved) in the direction of the first shift axis S1 by the electromagnetic force.

The first coil 271 may have a shape that is longer in the y-axis direction than in the z-axis direction. For example, the first coil 271 may include a conductive wire surrounding any axis parallel to the optical axis L (e.g., an axis parallel to the x-axis direction) or may include a conductive pattern formed in the direction surrounding the any axis (e.g., the axis parallel to the x-axis direction). For example, the first coil 271 may be formed such that a conductive wire or a conductive pattern that extends in the y-axis direction is longer than a conductive wire or a conductive pattern that extends in the z-axis direction.

The first magnet 275 may be formed such that the surface facing the first coil 271 includes two different polarities. For example, the first magnet 275 may be formed such that an N-pole area and an S-pole area are arranged in the direction of the first shift axis S1 (e.g., the y-axis direction). The first magnet 275 may be configured such that the N-pole area and the S-pole area at least partially overlap the first coil 271 when viewed in the direction of the optical axis L (e.g., the x-axis direction).

The first drive member 270 may include a plurality of first coils 271 and a plurality of first magnets 275. For example, the plurality of first coils 271 may include a first sub coil 271-1 and a second sub coil 271-2. The first sub coil 271-1 and the second sub coil 271-2 may be arranged in the z-axis direction. For example, the first sub coil 271-1 may be located in the +z-axis direction with respect to the second sub coil 271-2. For example, the plurality of first magnets 275 may include a first sub magnet 275-1 corresponding to the first sub coil 271-1 and a second sub magnet 275-2 corresponding to the second sub coil 271-2. The first sub magnet 275-1 and the second sub magnet 275-2 may be arranged in the z-axis direction. For example, the first sub magnet 275-1 may be located in the +z-axis direction with respect to the second sub magnet 275-2.

The second drive member 270 may include the second coil 273 and the second magnet 277. The second coil 273 may be disposed on the second surface 255b of the first circuit board 253, and the second magnet 277 may be disposed on the sidewall 248 of the frame 242. The second coil 273 and the second magnet 277 may be disposed to at least partially overlap each other when viewed in the direction of the optical axis L (e.g., the x-axis direction).

An electrical signal may be applied to the second coil 273. For example, the electrical signal may be applied through the second circuit board 290, the connecting member 400, and/or the first circuit board 253. The processor 720 and/or the iSP of the electronic device 100 may control the direction and/or strength of an electric current passing through the second coil 273. An electromagnetic force (e.g., Lorentz force) may be applied to the second magnet 277 to correspond to the direction of the electric current passing through the second coil 273. The movable member 250 may be moved (linearly moved) in the direction of the second shift axis S2 by the electromagnetic force.

The second coil 273 may have a shape that is longer in the z-axis direction than in the y-axis direction. For example, the second coil 273 may include a conductive wire surrounding any axis parallel to the optical axis L (e.g., an axis parallel to the x-axis direction) or may include a conductive pattern formed in the direction surrounding the any axis (e.g., the axis parallel to the x-axis direction). For example, the second coil 273 may be formed such that a conductive wire or a conductive pattern that extends in the z-axis direction is longer than a conductive wire or a conductive pattern that extends in the y-axis direction.

The second magnet 277 may be formed such that the surface facing the second coil 273 includes two different polarities. For example, the second magnet 277 may be formed such that an N-pole area and an S-pole area are arranged in the direction of the second shift axis S2 (e.g., the z-axis direction). The second magnet 277 may be configured such that the N-pole area and the S-pole area at least partially overlap the second coil 273 when viewed in the direction of the optical axis L (e.g., the x-axis direction).

The second drive member 270 may include a plurality of second coils 273 and a plurality of second magnets 277. For example, the plurality of second coils 273 may include a third sub coil 273-1 and a fourth sub coil 273-2. The third sub coil 273-1 and the fourth sub coil 273-2 may be arranged in the y-axis direction. For example, the third sub coil 273-1 may be located in the +y-axis direction with respect to the fourth sub coil 273-2. For example, the plurality of second magnets 277 may include a third sub magnet 277-1 corresponding to the third sub coil 273-1 and a fourth sub magnet 277-2 corresponding to the fourth sub coil 273-2. The third sub magnet 277-1 and the fourth sub magnet 277-2 may be arranged in the y-axis direction. For example, the third sub magnet 277-1 may be located in the +y-axis direction with respect to the fourth sub magnet 277-2.

The plurality of coils 271 and 273 of the drive member 270 may be located on the first circuit board 253, and the plurality of magnets 275 and 277 of the drive member 270 may be located on the frame 242. However, the disclosure is not necessarily limited thereto. Alternatively, the plurality of coils 271 and 273 may be located on the sidewall 248 of the frame 242, and the plurality of magnets 275 and 277 may be disposed on the first circuit board 253 or the holder 251. Alternatively, the camera module 200 and/or the image stabilization assembly 230 may further include a separate additional connecting member (e.g., a circuit board) for applying electrical signals (e.g., currents) to the plurality of coils 271 and 273 located on the frame 242.

The guide member 260 may be located between the holder 251 of the movable member 250 and the sidewall 248 of the frame 242. The guide member 260 may be coupled to the holder 251 and the sidewall 248 so as to be movable. For example, the guide member 260 may be coupled to the holder 251 so as to be movable in the y-axis direction and may be coupled to the sidewall 248 of the frame 242 so as to be movable in the z-axis direction.

The guide member 260 may have the second opening area 261 formed therein to be aligned with the second surface 255b of the first circuit board 253 in the direction of the optical axis L. The second surface 255b of the first circuit board 253 may face the sidewall 248 of the frame 242 board through the second opening area 261. For example, the plurality of coils 271 and 273 located on the second surface 255b of the first circuit board 253 and the plurality of magnets 275 and 277 located on the sidewall 248 of the frame 242 may face each other in the direction of the optical axis L through the second opening area 261.

The image stabilization assembly 230 may further include a first ball guide structure and a second ball guide structure for guiding a movement of the movable member 250.

The first ball guide structure may include one or more first balls 265 disposed between the guide member 260 and the holder 251. For example, a plurality of first balls 265 may be formed.

The holder 251 may include the first opening area 254 in which the image sensor 252 is located and a first peripheral area 258 surrounding the first opening area 254. On the first peripheral area 258, the holder 251 may have first recesses 259 in which at least portions of the first balls 265 are accommodated. As many first recesses 259 as the first balls 265 may be formed. For example, the first recesses 259 may be formed in a shape extending in the y-axis direction.

The guide member 260 may have second recesses 264 overlapping the first recesses 259 in the direction of the optical axis L (e.g., the x-axis direction). The second recesses 264, together with the first recesses 259, may form spaces in which the first balls 265 are accommodated. For example, the second recesses 264 may be formed in a shape extending in the y-axis direction. As many second recesses 264 as the first balls 265 may be formed.

The first balls 265 may be configured to roll in the spaces between the first recesses 259 and the second recesses 264. For example, when the holder 251 moves in the y-axis direction, the first balls 265 may rotate while linearly moving in the y-axis direction in the spaces between the first recesses 259 and the second recesses 264 or may rotate in position in the spaces between the first recesses 259 and the second recesses 264.

The second ball guide structure may include one or more second balls 266 disposed between the guide member 260 and the sidewall 248 of the frame 242. For example, a plurality of second balls 266 may be formed.

The guide member 260 may include the second opening area 261 in which the plurality of coils 271 and 273 are located and a second peripheral area 262 surrounding the second opening area 261. On the second peripheral area 262, the guide member 260 may have third recesses 263 in which at least portions of the second balls 266 are accommodated. As many third recesses 263 as the second balls 266 may be formed. For example, the third recesses 263 may be formed in a shape extending in the z-axis direction.

On the sidewall 248, the frame 242 may have fourth recesses 249 overlapping the third recesses 263 in the direction of the optical axis L (e.g., the x-axis direction). The fourth recesses 249, together with the first recesses 263, may form spaces in which the second balls 266 are accommodated. For example, the fourth recesses 249 may be formed in a shape extending in the z-axis direction. As many fourth recesses 249 as the second balls 266 may be formed.

The second balls 266 may be configured to roll in the spaces between the third recesses 263 and the fourth recesses 249. For example, when the guide member 260 moves in the z-axis direction together with the holder 251, the second balls 266 may rotate while linearly moving in the z-axis direction in the spaces between the third recesses 263 and the fourth recesses 249 or may rotate in position in the spaces between the third recesses 263 and the fourth recesses 249.

Figure 9:
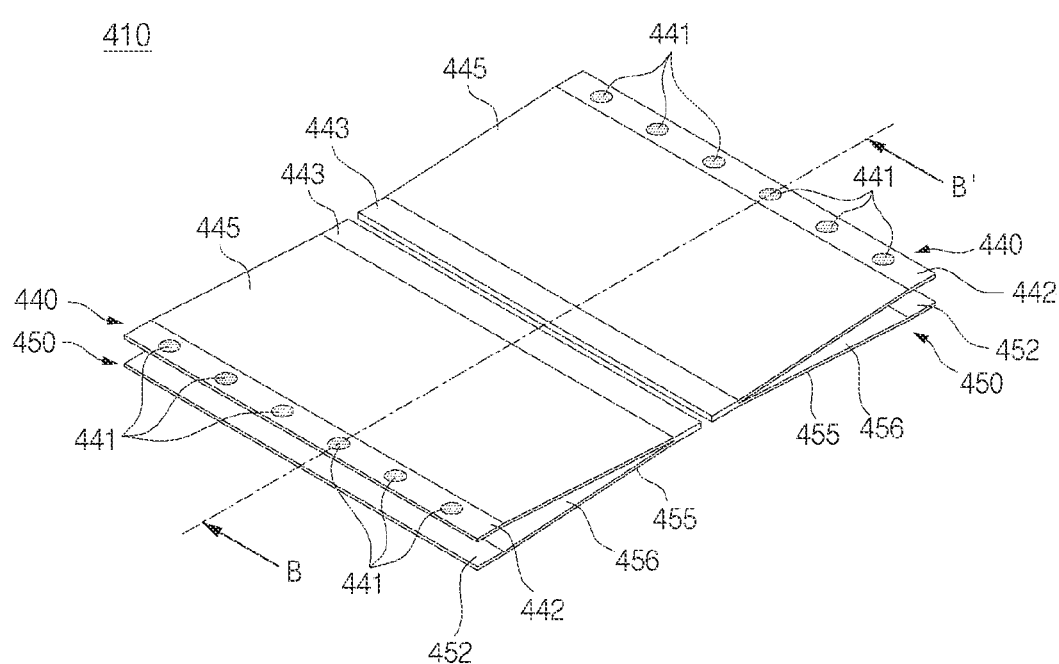
FIG. 9 is a perspective view of a flexible circuit board of the connecting member according to an embodiment.
Figure 10:
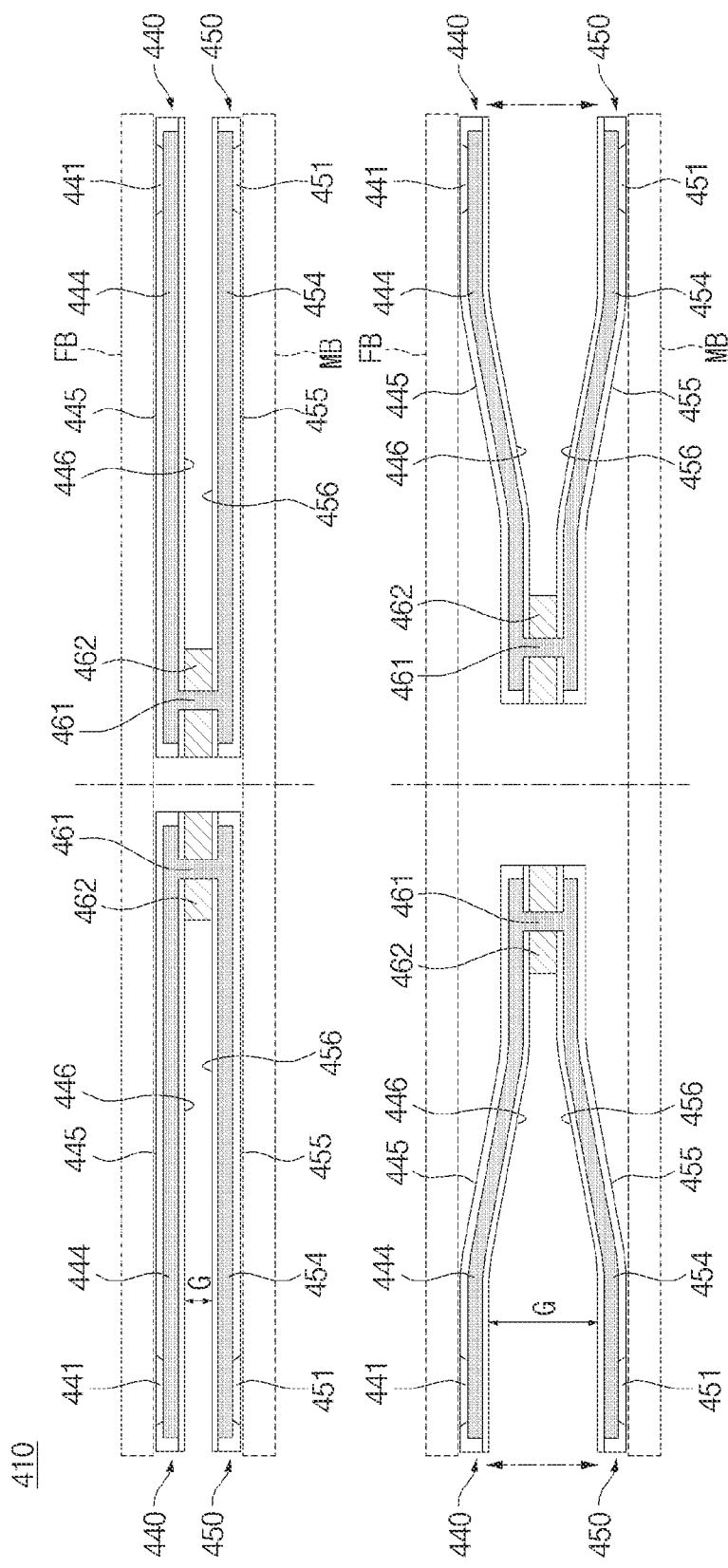
FIG. 10 is a sectional view of the flexible circuit board of the connecting member according to an embodiment.
Figure 11:
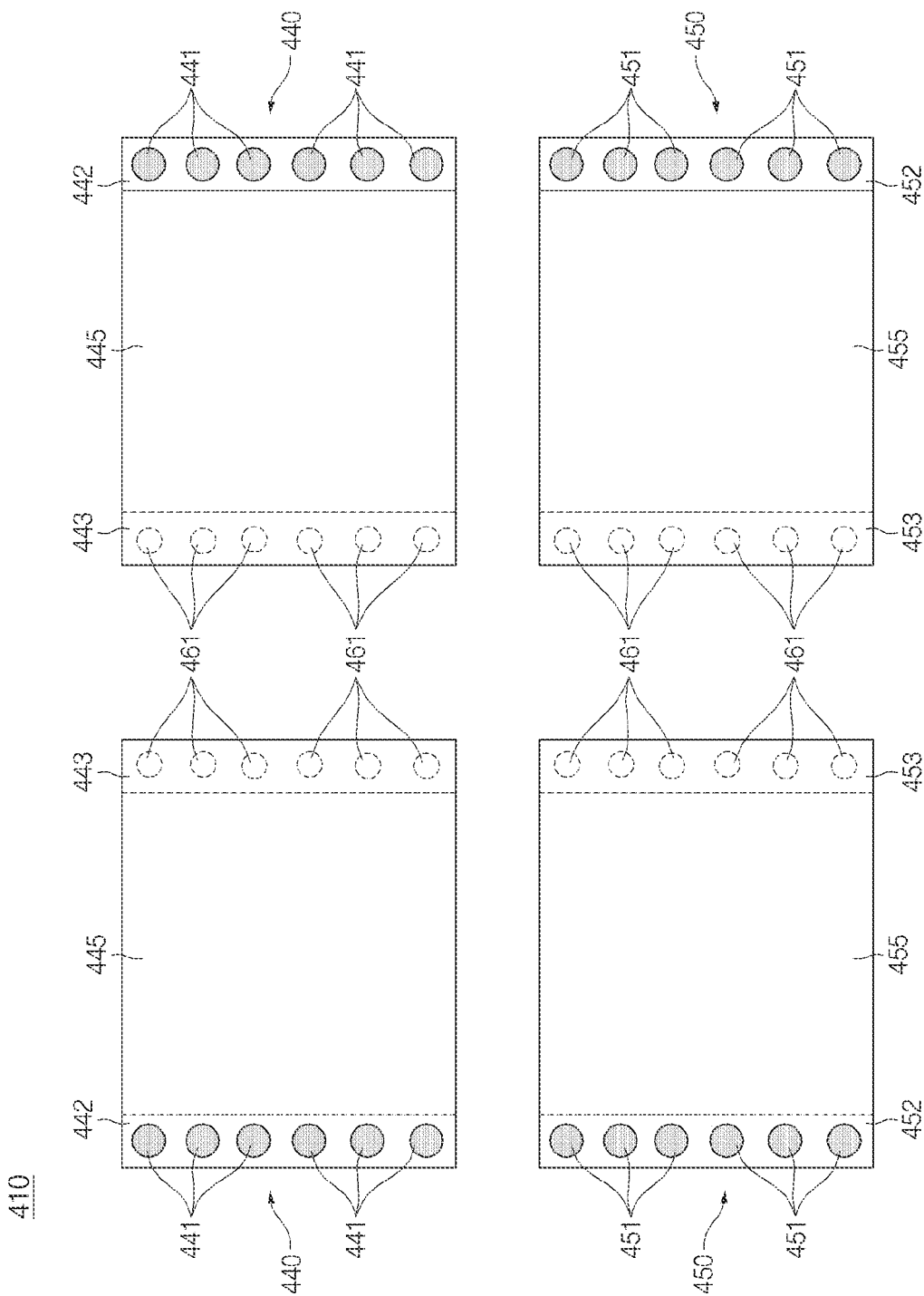
FIG. 11 illustrates a first layer and a second layer of the flexible circuit board of the connecting member according to an embodiment.

FIG. 9 is a perspective view of the flexible circuit board 410 of the connecting member 400 according to an embodiment. FIG. 10 is a sectional view of the flexible circuit board 410 of the connecting member 400 according to an embodiment. FIG. 11 illustrates a first layer 440 and a second layer 450 of the flexible circuit board 410 of the connecting member 400 according to an embodiment.

FIG. 10 is a sectional view of the flexible circuit board 410 taken along line B-B' in FIG. 9.

The flexible circuit board 410 illustrated in FIGS. 9 to 11 may be referred to as the first flexible circuit board 410. The first flexible circuit board 410 and the second flexible circuit board 420 of the connecting member 400 may be formed in substantially the same shape and/or structure. FIGS. 9 to 11 may be views for describing the first flexible circuit board 410, and the shape and/or structure of the first flexible circuit board 410 to be described with reference to FIGS. 9 to 11 may be identically applied to the second flexible circuit board 420.

Referring to FIGS. 9 to 11, the flexible circuit board 410 (e.g., the first flexible circuit board 410) of the connecting member 400 may include the first layer 440, the second layer 450, VIAs 461, conductive pads 441 and 451, and an adhesive member 462. For example, the flexible circuit board 410 may be implemented in a structure in which the first layer 440 and the second layer 450 are stacked on each other. The flexible circuit board 410 may be configured such that only one portion of the first layer 440 and only one portion of the second layer 450 are coupled with each other and the remaining portion of the first layer 440 and the remaining portion of the second layer 450 are deformed by moving in directions toward or away from, each other.

Identically to the structure of the first flexible circuit board 410 illustrated in FIGS. 9 to 11, the second flexible circuit board 420 may include a first layer 470, a second layer 480, VIAs 491, conductive pads 471 and 481, and an adhesive member 492.

The first layer 440 and the second layer 450 may be connected through the VIAs 461 and the adhesive member 462. For example, the first layer 440 and the second layer 450 may be electrically connected through the VIAs 461. For example, the first layer 440 and the second layer 450 may be physically coupled through the adhesive member 462 disposed between a partial area (e.g., a first VIA area 443) of the first layer 440 and a partial area (e.g., a second VIA area 453) of the second layer 450. For example, the adhesive member 462 may contain various adhesive materials (e.g., an optical clear adhesive (OCA) or a pressure sensitive adhesive (PSA)). For example, the first layer 440 and the second layer 450 may be formed in substantially the same shape.

The first layer 440 may include the first VIA area 443 in which the VIAs 461 are located and a first pad area 442 on which the first conductive pads 441 are located. The first VIA area 443 may be located adjacent to one end portion of the first layer 440, and the first pad area 442 may be located adjacent to an opposite end portion of the first layer 440. For example, the first layer 440 may include a first surface 445 on which the first conductive pads 441 are disposed and a second surface 446 facing away from the first surface 445. The first conductive pads 441 may be located on at least partial areas of the first surface 445. The VIAs 461 may pass through at least portions of the second surface 446.

The second layer 450 may include the second VIA area 453 in which the VIAs 461 are located and a second pad area 452 on which the second conductive pads 451 are located. The second VIA area 453 may be located adjacent to one end portion of the second layer 450, and the second pad area 452 may be located adjacent to an opposite end portion of the second layer 450. For example, the second layer 450 may include a third surface 455 on which the second conductive pads 451 are disposed and a fourth surface 456 facing away from the third surface 455. The second conductive pads 451 may be located on at least partial areas of the third surface 455. The VIAs 461 may pass through at least portions of the fourth surface 456.

The first layer 440 and the second layer 450 may be disposed such that the second surface 446 of the first layer 440 and the fourth surface 456 of the second layer 450 face each other. The adhesive member 462 may be disposed between the first VIA area 443 of the second surface 446 of the first layer 440 and the second VIA area 453 of the fourth surface 456 of the second layer 450. The first layer 440 and the second layer 450 may be spaced apart from each other by a predetermined gap G, and the gap G may be increased or decreased as the flexible circuit board 410 is deformed.

As illustrated in FIG. 9, the flexible circuit board 410 may be configured such that the gap between the first layer 440 and the second layer 450 is changed. The flexible circuit board 410 may be disposed between two circuit boards (e.g., a fixed circuit board (FB) and a movable circuit board (MB)) disposed parallel to each other and may electrically connect the two circuit boards, and one of the two circuit boards may be configured to move relative to the other. For example, the first layer 440 of the flexible circuit board 410 may be coupled to the fixed circuit board FB, and the second layer 450 may be coupled to the movable circuit board MB. The first conductive pads 441 of the first layer 440 may be electrically connected with the fixed circuit board FB, and the second conductive pads 451 of the second layer 450 may be electrically connected with the movable circuit board MB. For example, the pad areas 442 and 452 of the first layer 440 and the second layer 450 may be coupled to move together with the fixed circuit board FB and the movable circuit board MB, respectively. When the movable circuit board MB moves relative to the fixed circuit board FB, the flexible circuit board 410 may be deformed in response to the movement of the movable circuit board MB as the gap between the first conductive pads 441 and the second conductive pads 451 is increased or decreased.

The VIAs 461 may electrically connect the first layer 440 and the second layer 450. For example, a first conductive pattern 444 may be formed in the first layer 440, and a second conductive pattern 454 may be formed in the second layer 450. The VIAs 461 may be configured to electrically connect the first conductive pattern 444 formed in the first layer 440 and the second conductive pattern 454 formed in the second layer 450. For example, the VIAs 461 may pass through the second surface 446 of the first layer 440, the adhesive member 462, and the fourth surface 456 of the second layer 450 to electrically connect the first conductive pattern 444 and the second conductive pattern 454. The VIAs 461 may include through-holes that penetrate the first layer 440, the adhesive member 462, and the second layer 450 and a conductive material that fills the through-holes or is plated on the inner walls of the through-holes.

The adhesive member 462 may be disposed between the first VIA area 443 of the first layer 440 and the second VIA area 453 of the second layer 450. For example, the adhesive member 462, which is disposed between the VIA areas 443 and 453 of the first layer 440 and the second layer 450, may physically couple the first VIA area 443 of the first layer 440 and the second VIA area 453 of the second layer 450. For example, the adhesive member 462 may be disposed on an area corresponding to the first VIA area 443 of the second surface 446 of the first layer 440 or may be disposed on an area corresponding to the second VIA area 453 of the fourth surface 456 of the second layer 450.

The conductive pads 441 and 451 may be disposed on partial areas of the first surface 445 of the first layer 440 and partial areas of the third surface 455 of the second layer 450. The conductive pads 441 and 451 may include the first conductive pads 441 and the second conductive pads 451. For example, the first conductive pads 441 may be surface-mounted or disposed on the first pad area 442 of the first surface 445 of the first layer 440. For example, the second conductive pads 451 may be surface-mounted or disposed on the second pad area 452 of the third surface 455 of the second layer 450.

The conductive pads 441 and 451 may be electrically connected with at least a portion of the first circuit board (e.g., the first circuit board 253 of FIGS. 13 to 15B), the second circuit board 290 or the connecting circuit board 430. For example, the pad areas 442 and 452 of the first layer 440 and the second layer 450 may be coupled to the first circuit board 253, the second circuit board 290 or the connecting circuit board 430 to electrically connect the conductive pads 441 and 451 with the first circuit board 253, the second circuit board 290 or the connecting circuit board 430.

FIG. 11 illustrates a plan view of the first layer 440 when the first surface 445 of the first layer 440 is viewed and a plan view of the second layer 450 when the third surface 455 of the second layer 450 is viewed. The first layer 440 and the second layer 450 may have substantially the same shape. For example, the first layer 440 and the second layer 450 of the flexible circuit board 410 may be manufactured by using FPCBs having substantially the same shape. A partial area of the second surface 446 of the first layer 440 and a partial area of the fourth surface 456 of the second layer 450 may be attached to each other by the adhesive member 462 such that the first surface 445 and the third surface 455 face away from each other. The flexible circuit board 410 may be configured such that the first layer 440 is integrally formed with the second layer 450.

Figure 12:
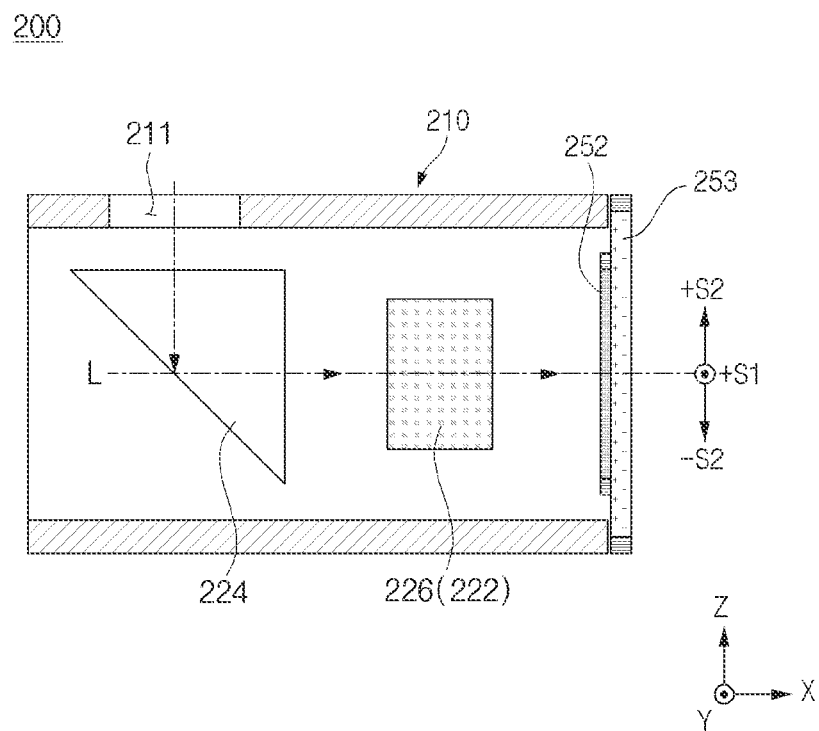
FIG. 12 illustrates an image stabilization operation of the camera module according to an embodiment.
Figure 13:
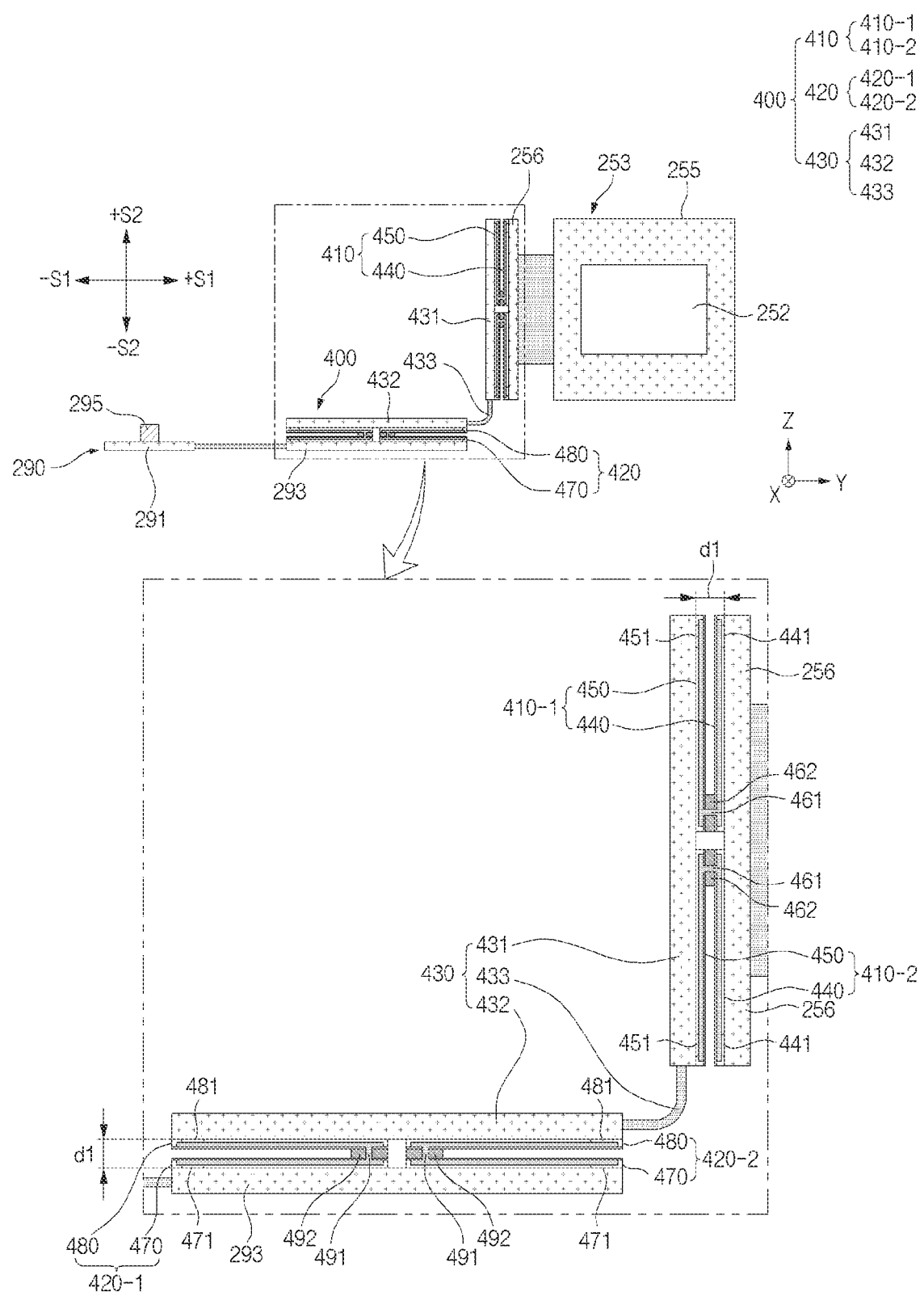
FIG. 13 illustrates an operation of the connecting member of the camera module according to an embodiment.
Figure 14:
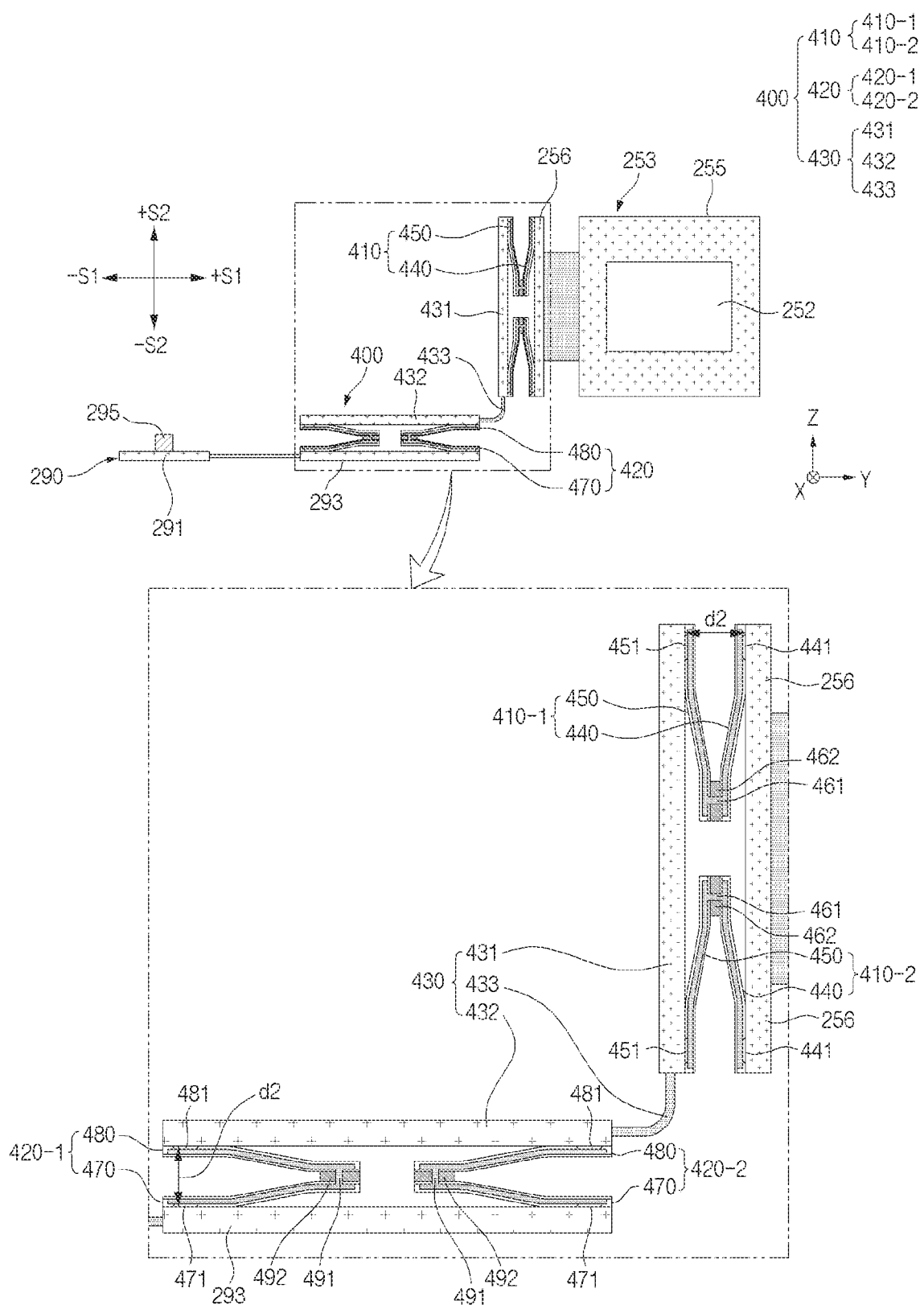
FIG. 14 illustrates an operation of the connecting member of the camera module according to an embodiment.

FIG. 12 illustrates an image stabilization operation of the camera module 200 according to an embodiment. FIG. 13 illustrates an operation of the connecting member 400 of the camera module 200 according to an embodiment. FIG. 14 illustrates an operation of the connecting member 400 of the camera module 200 according to an embodiment.

FIG. 12 is a sectional view of the camera module 200 taken along line A-A' in FIG. 4. For example, FIG. 12 may be a schematic view for describing the image stabilization operation of the camera module 200. FIGS. 13 and 14 are plan views when the image sensor 252 is viewed in the +x-axis direction.

Referring to FIG. 12, the camera module 200 may include the camera housing 210, the reflective member 224, a lens 226, the image sensor 252, and the first circuit board 253. For example, the lens 226 may be included in the lens unit illustrated in FIGS. 5 and 6 (e.g., the lens unit 222 of FIGS. 5 and 6). For example, the image sensor 252 and the first circuit board 253 may be included in the movable member 250.

The camera module 200 may perform an image stabilization function by moving the first circuit board 253 and the image sensor 252 in a direction perpendicular to the optical axis L. For example, in response to external noise (e.g., vibration or a shaking movement of a user's hand), the camera module 200 may correct image shake by moving the first circuit board 253, on which the image sensor 252 is disposed, in at least one of the directions of the first shift axis S1 or the second shift axis S2 perpendicular to the optical axis L.

The reflective member 224 and the lens 226 may be disposed in the camera housing 210. The camera housing 210 may have the light receiving area 211 formed therein through which external light is incident on the reflective member 224. For example, light incident on the reflective member 224 through the light receiving area 211 in the direction perpendicular to the optical axis L may be refracted and/or reflected in the direction of the optical axis L by the reflective member 224 and may travel toward the lens 226 and the image sensor 252.

The first circuit board 253 may be disposed on the camera housing 210 so as to be movable in the direction perpendicular to the optical axis L. The image sensor 252 may be disposed on the first circuit board 253. The image sensor 252 may be disposed on one surface of the first circuit board 253 to face the lens 226. The image sensor 252 may be electrically connected with the first circuit board 253. For example, the reflective member 224, the lens 226, and the image sensor 252 may be aligned in the direction of the optical axis L. The first circuit board 253 may be configured to move relative to the camera housing 210 in the direction of the first shift axis S1 and/or the direction of the second shift axis S2. The image sensor 252 may move together with the first circuit board 253 and may move relative to the reflective member 224 and the lens 226 accordingly.

The camera module 200 may align the optical axis L of the lens 226 and the image sensor 252 to a specified position by moving the first circuit board 253 in at least one of two directions perpendicular to the optical axis L using the drive member 270.

Referring to FIGS. 13 and 14, the camera module 200 may include the first circuit board 253 on which the image sensor 252 is disposed, the second circuit board 290 on which the connector 295 is disposed, and the connecting member 400 connecting the first circuit board 253 and the second circuit board 290.

The first circuit board 253 may include the first portion 255 on which the image sensor 252 is disposed and the second portion 256 extending from the first portion 255 at a right angle. For example, the image sensor 252 may be surface-mounted on the first surface 255a of the first portion 255. For example, the first flexible circuit board 410 may be connected to the second portion 256. For example, on the second portion 256, the first circuit board 253 may have a conductive area to which the first flexible circuit board 410 (e.g., the first conductive pads 441 of the first flexible circuit board 410) is electrically connected.

The second circuit board 290 may include a third portion 291 on which the connector 295 is disposed and a fourth portion 293 extending from the third portion 291. For example, the connecting member 400 (e.g., the second flexible circuit board 420) may be connected to the fourth portion 293. For example, on the fourth portion 293, the second circuit board 290 may have a conductive area to which the first conductive pads 471 of the second flexible circuit board 420 is electrically connected.

The connecting member 400 may electrically connect the first circuit board 253 and the second circuit board 290. For example, the first flexible circuit board 410 of the connecting member 400 may be connected to the first circuit board 253, and the second flexible circuit board 420 of the connecting member 400 may be connected to the second circuit board 290. Accordingly, the first circuit board 253 and the second circuit board 290 may be electrically connected through the connecting member 400.

The connecting member 400 may include the first flexible circuit board 410 connected to the first circuit board 253, the second flexible circuit board 420 connected to the second circuit board 290, and the connecting circuit board 430 electrically connecting the first flexible circuit board 410 and the second flexible circuit board 420. For example, the first flexible circuit board 410 and the second flexible circuit board 420 may be formed in the structure and/or shape described with reference to FIGS. 9 to 11.

The first flexible circuit board 410 may be disposed between the first circuit board 253 and the connecting circuit board 430 (e.g., a first connecting portion 431). For example, the first flexible circuit board 410 may be disposed between the second portion 256 of the first circuit board 253 and the first connecting portion 431 of the connecting circuit board 430. For example, the first flexible circuit board 410 may be disposed substantially perpendicular to the first portion 255 and may be disposed perpendicular to the image sensor 252 accordingly. The first flexible circuit board 410 may electrically connect the first circuit board 253 and the connecting circuit board 430. For example, a part of the first flexible circuit board 410 may be electrically connected to the second portion 256 of the first circuit board 253, and another part of the first flexible circuit board 410 may be electrically connected to the first connecting portion 431 of the connecting circuit board 430.

The first flexible circuit board 410 may be configured such that the first layer 440 of the first flexible circuit board 410 is connected to one of the first circuit board 253 and the connecting circuit board 430 and the second layer 450 of the first flexible circuit board 410 is connected to the other one of the first circuit board 253 and the connecting circuit board 430. For example, the first layer 440 of the first flexible circuit board 410 may be coupled to the second portion 256 such that the first conductive pads 441 are electrically connected with the conductive area of the second portion 256. For example, the second layer 450 of the first flexible circuit board 410 may be coupled to the first connecting portion 431 such that the second conductive pads 451 are electrically connected with a conductive area of the first connecting portion 431.

The first layer 440 and the second layer 450 of the first flexible circuit board 410 may be electrically connected through the VIAs 461. For example, the second portion 256 electrically connected with the first conductive pads 441 of the first layer 440 may be electrically connected, through the VIAs 461, with the first connecting portion 431 connected with the second conductive pads 451 of the second layer 450.

The second flexible circuit board 420 may be disposed between the second circuit board 290 and the connecting circuit board 430 (e.g., a second connecting portion 432). For example, the second flexible circuit board 420 may be disposed between the fourth portion 293 of the second circuit board 290 and the second connecting portion 432 of the connecting circuit board 430. The second flexible circuit board 420 may be disposed substantially perpendicular to the first portion 255 and may be disposed perpendicular to the image sensor 252 accordingly. The second flexible circuit board 420 may electrically connect the second circuit board 290 and the connecting circuit board 430. For example, a part of the second flexible circuit board 420 may be electrically connected to the fourth portion 293 of the second circuit board 290, and another part of the second flexible circuit board 420 may be electrically connected to the second connecting portion 432 of the connecting circuit board 430.

The second flexible circuit board 420 may be configured such that the first layer 470 of the second flexible circuit board 420 is connected to one of the second circuit board 290 and the connecting circuit board 430 and the second layer 480 of the second flexible circuit board 420 is connected to the other one of the second circuit board 290 and the connecting circuit board 430. The first layer 470 of the second flexible circuit board 420 may be coupled to the fourth portion 293 such that the first conductive pads 471 are electrically connected with the conductive area of the fourth portion 293. The second layer 480 of the second flexible circuit board 420 may be coupled to the second connecting portion 432 such that the second conductive pads 481 are electrically connected with a conductive area of the second connecting portion 432.

The first layer 470 and the second layer 480 of the second flexible circuit board 420 may be electrically connected through the VIAs 491. The fourth portion 293 electrically connected with the first conductive pads 471 of the first layer 470 may be electrically connected, through the VIAs 491, with the second connecting portion 432 connected with the second conductive pads 481 of the second layer 480.

The connecting circuit board 430 may electrically connect the first flexible circuit board 410 and the second flexible circuit board 420. The second layer 450 of the first flexible circuit board 410 and the second layer 480 of the second flexible circuit board 420 may be coupled to the connecting circuit board 430.

The connecting circuit board 430 may include the first connecting portion 431 connected with the first flexible circuit board 410, the second connecting portion 432 connected with the second flexible circuit board 420, and a third connecting portion 433 connecting the first connecting portion 431 and the second connecting portion 432. The first connecting portion 431 and the second connecting portion 432 may be disposed perpendicular to each other, and the third connecting portion 433 may be partially bent to connect the first connecting portion 431 and the second connecting portion 432.

The first connecting portion 431 may be coupled to be electrically connected with the first flexible circuit board 410. The first connecting portion 431 may include the conductive area to which the first flexible circuit board 410 (e.g., the second conductive pads 451 of the first flexible circuit board 410) is electrically connected.

The second connecting portion 432 may be coupled to be electrically connected with the second flexible circuit board 420. The second connecting portion 432 may include the conductive area to which the second conductive pads 481 of the second flexible circuit board 420 are electrically connected.

The first flexible circuit board 410, the second flexible circuit board 420, and the connecting circuit board 430 connecting the first flexible circuit board 410 and the second flexible circuit board 420 may be configured as separate parts. However, the structure of the connecting member 400 is not limited to the illustrated embodiment. The connecting member 400 may be integrally formed. The connecting member 400 may not include the connecting circuit board 430 and may be configured such that the second layer 450 of the first flexible circuit board 410 and the second layer 480 of the second flexible circuit board 420 are directly connected. In another example, the connecting member 400 may be implemented with an RFPCB so as to include a rigid circuit board portion (e.g., the connecting circuit board 430) and a flexible circuit board portion (e.g., the first flexible circuit board 410 and the second flexible circuit board 420).

Hereinafter, an operation of the connecting member 400 when the first circuit board 253 moves as illustrated in FIG. 12 will be described with reference to FIGS. 13 and 14.

FIGS. 13 and 14 illustrate an operation in which the first circuit board 253 moves a predetermined distance in the direction of the first shift axis S1 and/or the direction of the second shift axis S2 perpendicular to the optical axis L as the image stabilization function of the camera module 200 is performed.

The first flexible circuit board 410 and the second flexible circuit board 420 may be deformed such that portions of the first layers 440 and 470 and portions of the second layers 450 and 480 move toward or away from each other in response to a movement of the first circuit board 253 in the direction of the first shift axis S1 and/or the direction of the second shift axis S2.

When the camera module 200 moves the image sensor 252 (e.g., the first circuit board 253 or the movable member 250 of FIGS. 5 to 7) in the direction of the first shift axis S1, the first flexible circuit board 410 may be deformed in response to the gap between the first circuit board 253 and the first connecting portion 431.

Referring to FIGS. 13 and 14, when the first circuit board 253 moves in a +S1 direction (e.g., the +y-axis direction), the second circuit board 290 and the connecting circuit board 430 may be in a fixed state, and the gap between the second portion 256 of the first circuit board 253 and the first connecting portion 431 of the connecting circuit board 430 may be increased. When the first circuit board 253 moves, the gap between the first conductive pads 441 and the second conductive pads 451 may be increased as the first conductive pads 441 of the first layer 440 of the first flexible circuit board 410 are coupled to the second portion 256 of the first circuit board 253 and the second conductive pads 451 of the second layer 450 are coupled to the first connecting portion 431 of the connecting circuit board 430. The first flexible circuit board 410 may be deformed in a form in which the gap between the first layer 440 and the second layer 450 is gradually increased from the VIAs 461 toward the conductive pads 441 and 451.

Prior to the movement of the first circuit board 253, the first conductive pads 441 and the second conductive pads 451 of the first flexible circuit board 410 may be spaced apart from each other by a first gap d1. When the first circuit board 253 moves a specified distance in the +S1 direction, the first conductive pads 441 and the second conductive pads 451 of the first flexible circuit board 410 may be spaced apart from each other by a second gap d2 greater than the first gap d1. When the first circuit board 253 moves in a −S1 direction opposite to the +S1 direction in the state of FIG. 13, the first conductive pads 441 and the second conductive pads 451 of the first flexible circuit board 410 may be spaced apart from each other by a gap smaller than the first gap d1.

When the camera module 200 moves the image sensor 252 (e.g., the first circuit board 253 or the movable member 250 of FIGS. 5 to 7) in the direction of the second shift axis S2, the second flexible circuit board 420 may be deformed in response to the gap between the second circuit board 290 and the second connecting portion 432.

Referring to FIGS. 13 and 14, when the first circuit board 253 moves in a +S2 direction (e.g., the +z-axis direction), the second circuit board 290 may be in a fixed state, and the gap between the fourth portion 293 of the second circuit board 290 and the second connecting portion 432 of the connecting circuit board 430 may be increased as the connecting circuit board 430 moves in the +S2 direction together with the first circuit board 253. When the first circuit board 253 moves, the gap between the first conductive pads 471 and the second conductive pads 481 may be increased as the first conductive pads 471 of the first layer 470 of the second flexible circuit board 420 are coupled to the fourth portion 293 of the second circuit board 290 and the second conductive pads 481 of the second layer 480 are coupled to the second connecting portion 432 of the connecting circuit board 430. The second flexible circuit board 420 may be deformed in a form in which the gap between the first layer 470 and the second layer 480 is gradually increased from the VIAs 491 toward the conductive pads 471 and 481.

Prior to the movement of the first circuit board 253, the first conductive pads 471 and the second conductive pads 481 of the second flexible circuit board 420 may be spaced apart from each other by the first gap d1. When the connecting circuit board 430 moves a specified distance in the +S2 direction together with the first circuit board 253, the first conductive pads 471 and the second conductive pads 481 of the second flexible circuit board 420 may be spaced apart from each other by the second gap d2 greater than the first gap d1. When the first circuit board 253 moves in a −S2 direction opposite to the +S2 direction in the state of FIG. 13, the first conductive pads 471 and the second conductive pads 481 of the second flexible circuit board 420 may be spaced apart from each other by a gap smaller than the first gap d1.

Referring to FIGS. 13 and 14, the connecting member 400 may include two first flexible circuit boards 410 and two second flexible circuit boards 420. The first flexible circuit board 410 may include a first sub circuit board 410-1 and a second sub circuit board 410-2 that are disposed between the second portion 256 of the first circuit board 253 and the first connecting portion 431 of the connecting circuit board 430 so as to be spaced apart from each other. The second flexible circuit board 420 may include a third sub circuit board 420-1 and a fourth sub circuit board 420-2 that are disposed between the fourth portion 293 of the second circuit board 290 and the second connecting portion 432 of the connecting circuit board 430 so as to be spaced apart from each other.

The first sub circuit board 410-1 and the second sub circuit board 410-2 may be disposed such that the VIAs 461 of the first sub circuit board 410-1 and the VIAs 461 of the second sub circuit board 410-2 face each other. The distance between the VIAs 461 of the first sub circuit board 410-1 and the VIAs 461 of the second sub circuit board 410-2 may be increased or decreased in response to a movement of the first circuit board 253. The first sub circuit board 410-1 and the second sub circuit board 410-2 may be configured such that when the first circuit board 253 moves in the +S1 direction, the distance between the VIAs 461 of the first sub circuit board 410-1 and the VIAs 461 of the second sub circuit board 410-2 is increased as the first layers 440 and the second layers 450 move away from each other. However, the directions of the first sub circuit board 410-1 and the second sub circuit board 410-2 are not limited to the illustrated embodiment and may be changed according to various embodiments (e.g., refer to FIGS. 15A and 15B).

The third sub circuit board 420-1 and the fourth sub circuit board 420-2 may be disposed such that the VIAs 491 of the third sub circuit board 420-1 and the VIAs 491 of the fourth sub circuit board 420-2 face each other. The distance between the VIAs 491 of the third sub circuit board 420-1 and the VIAs 491 of the fourth sub circuit board 420-2 may be increased or decreased in response to a movement of the first circuit board 253. The third sub circuit board 420-1 and the fourth sub circuit board 420-2 may be configured such that when the first circuit board 253 moves in the +S2 direction, the distance between the VIAs 491 of the third sub circuit board 420-1 and the VIAs 491 of the fourth sub circuit board 420-2 is increased as the first layers 470 and the second layers 480 move away from each other. However, the directions of the third sub circuit board 420-1 and the fourth sub circuit board 420-2 are not limited to the illustrated embodiment and may be changed according to various embodiments (e.g., refer to FIGS. 15A and 15B).

A pair of first flexible circuit boards 410 and a pair of second flexible circuit boards 420 may be provided. However, this is illustrative, and the disclosure is not necessarily limited thereto. The number of first flexible circuit boards 410 and the number of second flexible circuit boards 420 may be changed depending on the size of the camera module 200. For example, when the camera module 200 has a relatively small size, at least one of the first flexible circuit board 410 or the second flexible circuit board 420 may include one flexible circuit board. In another example, when the camera module 200 has a relatively large size, at least one of the first flexible circuit board 410 or the second flexible circuit board 420 may include three or more flexible circuit boards.

The first circuit board 253, the second circuit board 290, and the connecting member 400 may be integrally formed. The camera module 200 may include a circuit board structure (e.g., the first circuit board 253, the second circuit board 290, and the connecting member 400) that is electrically connected with the PCB 150 of the electronic device 100. The circuit board structure may include a first circuit board portion 253 (e.g., the first circuit board 253) having the image sensor 252 disposed thereon, a second circuit board portion 290 (e.g., the second circuit board 290) having the connector 295 disposed thereon, and a third circuit board portion 400 (e.g., the connecting member 400) flexibly extending from part of the first circuit board portion 253 to part of the second circuit board portion 290. The third circuit board portion 400 may include a first flexible portion 410 (e.g., the first flexible circuit board 410) connected with the first circuit board portion 253 and a second flexible portion 420 (e.g., the second flexible circuit board 420) connected with the second circuit board portion 290. The first flexible portion 410 and the second flexible portion 420 may include first layers 440 and 470, second layers 450 and 480, and VIAs 461 and 491, respectively. The third circuit board portion 400 may further include the connecting circuit board 430 connecting the first flexible portion 410 and the second flexible portion 420. The circuit board structure may include a rigid PCB portion that includes the first circuit board portion 253, the second circuit board portion 290, and the rigid portion 430 and a flexible PCB portion that includes the first flexible portion 410 and the second flexible portion 420. The circuit board structure may be implemented with an RFPCB.

Figure 15A:
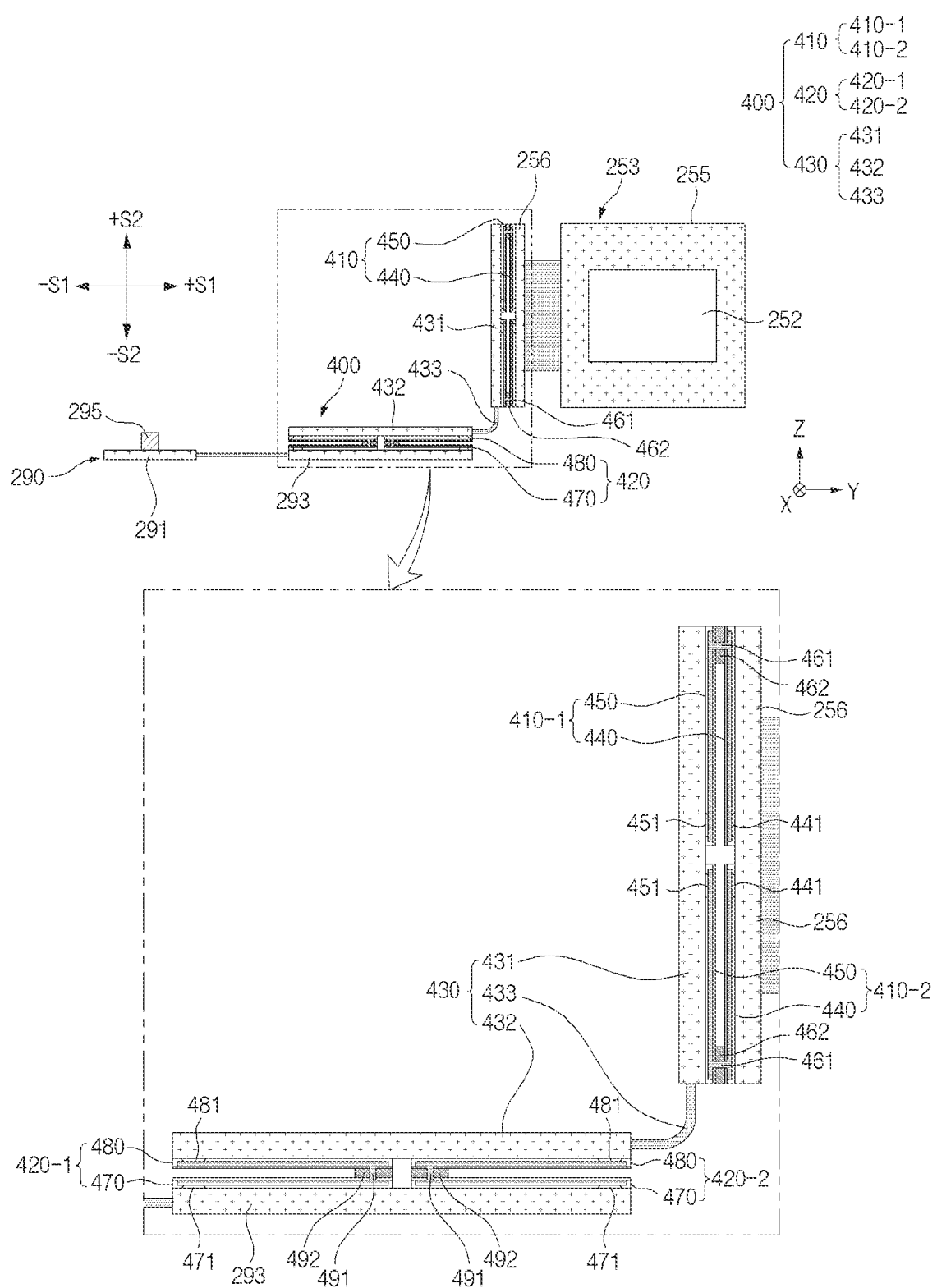
FIG. 15A illustrates an operation of a connecting member of a camera module according to an embodiment.

FIG. 15A illustrates an operation of a connecting member 400 of a camera module 200 according to an embodiment.

Figure 15B:
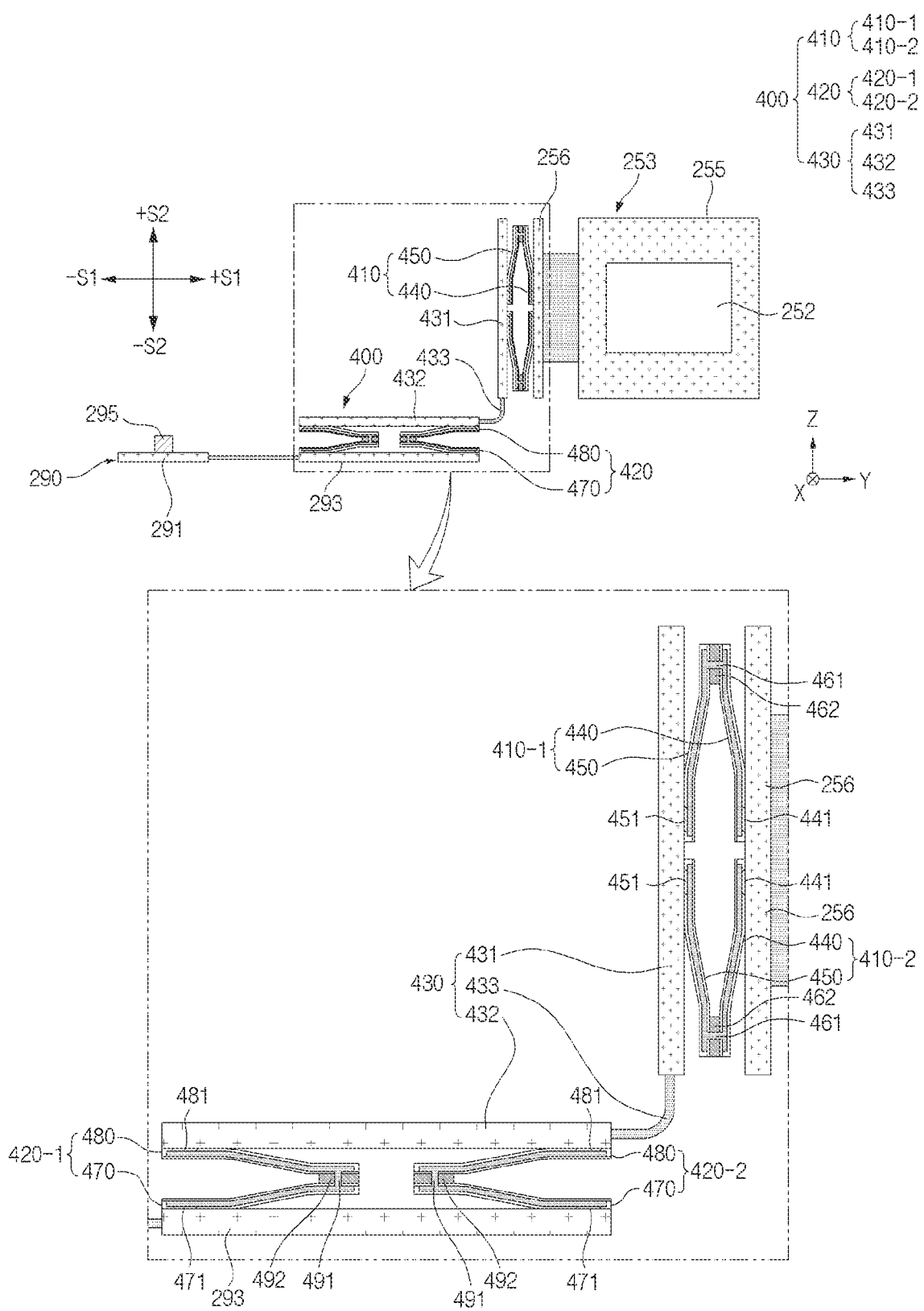
FIG. 15B illustrates an operation of the connecting member of the camera module according to an embodiment.

FIG. 15B illustrates an operation of the connecting member 400 of the camera module 200 according to an embodiment.

FIGS. 15A and 15B may be views illustrating the camera module 200 in which the arrangement of at least a part of flexible circuit boards 410 and 420 is changed, compared to the camera module 200 illustrated in FIGS. 13 and 14. Some of the components of the camera module 200 illustrated in FIGS. 15A and 15B are substantially the same as or similar to, some of the components of the camera module 200 illustrated in FIGS. 13 and 14, and therefore repetitive descriptions will hereinafter be omitted.

Referring to FIGS. 15A and 15B, the camera module 200 may include a first circuit board 253 on which an image sensor 252 is disposed, a second circuit board 290 on which a connector 295 is disposed, and the connecting member 400 connecting the first circuit board 253 and the second circuit board 290.

The first flexible circuit board 410 of the connecting member 400 may include a first sub circuit board 410-1 and a second sub circuit board 410-2, and the second flexible circuit board 420 of the connecting member 400 may include a third sub circuit board 420-1 and a fourth sub circuit board 420-2.

The direction in which the first flexible circuit board 410 is disposed may differ from the direction in which the second flexible circuit board 420 is disposed.

The first sub circuit board 410-1 and the second sub circuit board 410-2 may be disposed such that conductive pads 441 and 451 of the first sub circuit board 410-1 and conductive pads 441 and 451 of the second sub circuit board 410-2 are located adjacent to each other. For example, when the image sensor 252 is viewed from above, the conductive pads 441 and 451 of the first sub circuit board 410-1 and the conductive pads 441 and 451 of the second sub circuit board 410-2 may be disposed to face each other in the z-axis direction. Based on the drawings, the first sub circuit board 410-1 may be disposed such that the conductive pads 441 and 451 face downward (e.g., the −z-axis direction) and VIAs 461 face upward (e.g., the +z-axis direction), and the second sub circuit board 410-2 may be disposed such that VIAs 461 face downward (e.g., the −z-axis direction) and the conductive pads 441 and 451 face downward (e.g., the +z-axis direction). However, the arrangement direction of the first flexible circuit board 410 is not limited to the illustrated embodiment.

The third sub circuit board 420-1 and the fourth sub circuit board 420-2 may be disposed such that VIAs 491 of the third sub circuit board 420-1 and VIAs 491 of the fourth sub circuit board 420-2 are located adjacent to each other. For example, when the image sensor 252 is viewed from above, the VIAs 491 of the third sub circuit board 420-1 and the VIAs 491 of the fourth sub circuit board 420-2 may be disposed to face each other in the y-axis direction. Based on the drawings, the third sub circuit board 420-1 may be disposed such that conductive pads 471 and 481 face leftward (e.g., the −y-axis direction) and the VIAs 491 face rightward (e.g., the +y-axis direction), and the fourth sub circuit board 420-2 may be disposed such that the VIAs 491 face leftward (e.g., the −y-axis direction) and conductive pads 471 and 481 face rightward (e.g., the +y-axis direction). However, the arrangement direction of the second flexible circuit board 420 is not limited to the illustrated embodiment.

The conductive pads 441 of the first sub circuit board 410-1 and the second sub circuit board 410-2 may be fixed to the first circuit board 253, and the conductive pads 451 of the first sub circuit board 410-1 and the second sub circuit board 410-2 may be fixed to a connecting circuit board 430. Each of the first sub circuit board 410-1 and the second sub circuit board 410-2 may be configured such that in response to a movement of the first circuit board 253, the portion where the VIAs 461 are formed moves in a direction perpendicular to the direction of movement of the first circuit board 253. The first sub circuit board 410-1 and the second sub circuit board 410-2 may be configured such that when the first circuit board 253 moves in the +S1 direction, the VIAs 461 of the first sub circuit board 410-1 are pulled in the −S2 direction and the VIAs 461 of the second sub circuit board 410-2 are pulled in the +S2 direction as first layers 440 and second layers 450 move away from each other.

The arrangement of the flexible circuit boards 410 and 420 illustrated in FIGS. 15A and 15B is illustrative, and the disclosure is not limited thereto. The arrangement of the first flexible circuit board 410 and the second flexible circuit board 420 may be changed to be different from that in the illustrated embodiment. For example, identically to the arrangement of the first flexible circuit board 410 illustrated in FIGS. 15A and 15B, the third sub circuit board 420-1 and the fourth sub circuit board 420-2 may be disposed such that the conductive pads 471 and 481 are located adjacent to each other. In another example, the first flexible circuit board 410 may be disposed such that the VIAs 461 of the first sub circuit board 410-1 and the conductive pads 441 and 451 of the second sub circuit board 410-2 are located adjacent to each other. In such a case, the first flexible circuit board 410 may be disposed such that the VIAs 461 of the first sub circuit board 410-1 and the VIAs 461 of the second sub circuit board 410-2 face the same direction and the conductive pads 441 and 451 of the first sub circuit board 410-1 and the conductive pads 441 and 451 of the second sub circuit board 410-2 face the same direction. Likewise, the second flexible circuit board 420 may be disposed such that the VIAs 491 of the third sub circuit board 420-1 and the conductive pads 471 and 481 of the fourth sub circuit board 420-2 are located adjacent to each other.

In FIGS. 13 to 15B, the connecting member 400 may include a pair of first flexible circuit boards 410 and a pair of second flexible circuit boards 420. The pair of first flexible circuit boards 410 may include a first sub circuit board 410-1 and a second sub circuit board 410-2 spaced apart from each other. The pair of second flexible circuit boards 420 may include a third sub circuit board 420-1 and a fourth sub circuit board 420-2 spaced apart from each other.

The first flexible circuit board 410 may be configured such that the first sub circuit board 410-1 and the second sub circuit board 410-2 are integrally formed with each other. The first flexible circuit board 410 may be implemented as one flexible circuit board by connecting the first layer 440 of the first sub circuit board 410-1 and the first layer 440 of the second sub circuit board 410-2 and connecting the second layer 450 of the first sub circuit board 410-1 and the second layer 450 of the second sub circuit board 410-2.

The second flexible circuit board 420 may be configured such that the third sub circuit board 420-1 and the fourth sub circuit board 420-2 are integrally formed with each other. The second flexible circuit board 420 may be implemented as one flexible circuit board by connecting the first layer 470 of the third sub circuit board 420-1 and the first layer 470 of the fourth sub circuit board 420-2 and connecting the second layer 480 of the third sub circuit board 420-1 and the second layer 480 of the fourth sub circuit board 420-2.

Figure 16:
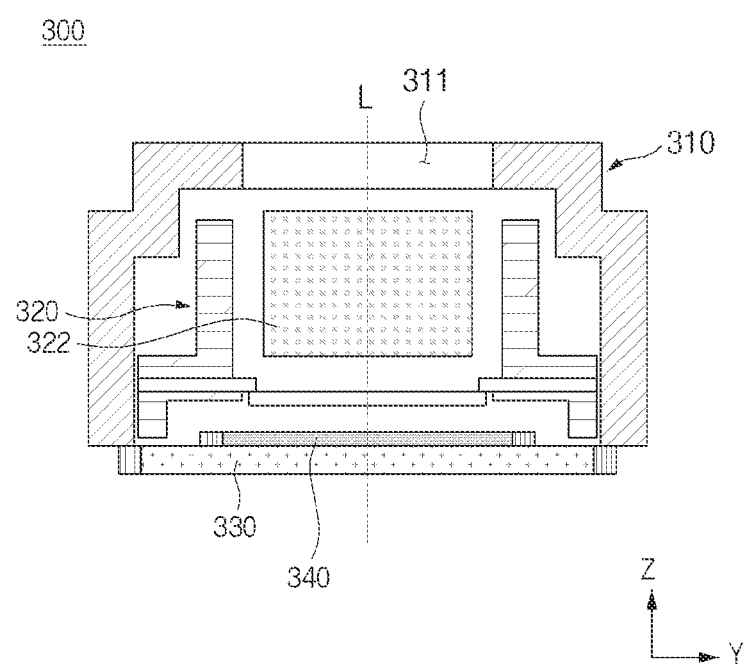
FIG. 16 illustrates an image stabilization operation of a camera module according to an embodiment.
Figure 17:
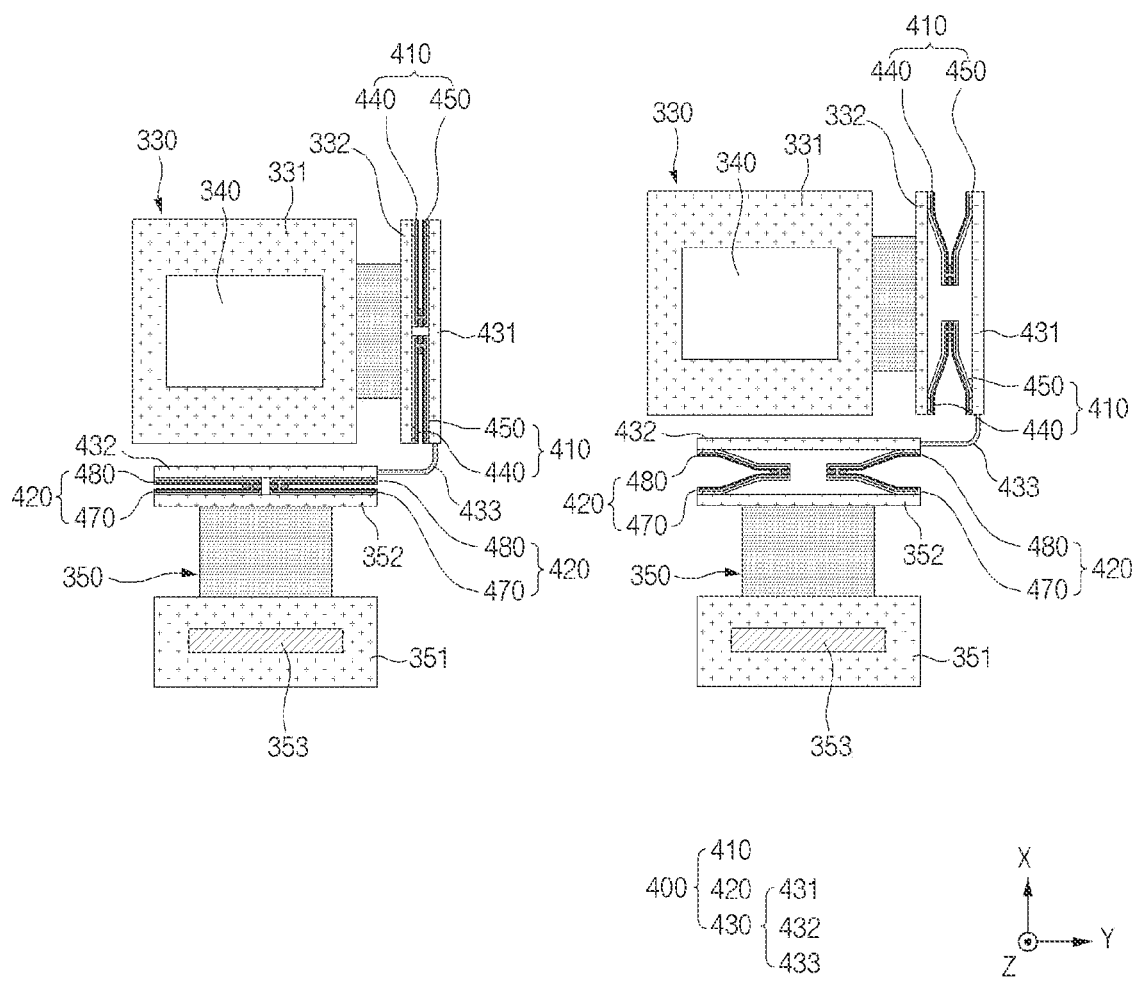
FIG. 17 illustrates an operation of a connecting member of the camera module according to an embodiment.

FIG. 16 illustrates an image stabilization operation of a camera module 300 according to an embodiment. FIG. 17 illustrates an operation of a connecting member 400 of the camera module 300 according to an embodiment.

FIGS. 16 and 17 illustrate the camera module 300 having a different structure from the camera module illustrated in FIGS. 4, 5, and 12 (e.g., the camera module 200 of FIGS. 4, 5, and 12) and some components of the camera module 300.

The camera module 200 of FIGS. 4, 5, and 12 may be a camera module (e.g., a folded camera) in which the direction in which external light is incident on the camera module 200 and the optical axis L of the lens 226 are perpendicular to each other, and the camera module 300 of FIGS. 16 and 17 may be a camera module (e.g., a direct type camera) in which the direction in which external light is incident on the camera module 300 and the optical axis of a lens are parallel to each other.

Referring to FIG. 16, the camera module 300 may include a camera housing 310, a lens assembly 320, an image sensor 340, and a first circuit board 330. For example, unlike the camera module 200 of FIG. 12, the camera module 300 of FIG. 16 may not include a reflective member (e.g., the reflective member 224 of FIG. 5) because the camera module 300 does not have to reflect and/or refract a travel path of external light.

The camera module 300 may perform an image stabilization function by moving the first circuit board 330 and the image sensor 340 in a direction perpendicular to an optical axis L (e.g., the z-axis). The camera module 300 may correct image shake by moving the first circuit board 330, on which the image sensor 340 is disposed, in at least one of two directions (e.g., the x-axis direction and the y-axis direction) perpendicular to the optical axis L.

The lens assembly 320 including a lens 322 may be disposed in the camera housing 310. The camera housing 310 may have a light receiving area 311 formed therein through which external light is incident. The external light may be incident on the lens 322 and the image sensor 340 through the light receiving area 311.

The first circuit board 330 may be disposed on the camera housing 310 so as to be movable in the direction perpendicular to the optical axis L. The image sensor 340 may be disposed on the first circuit board 330. The image sensor 340 may be disposed on one surface of the first circuit board 330 to face the lens 322. The first circuit board 330 may be configured to move in the x-axis direction and/or the y-axis direction relative to the camera housing 310. The image sensor 340 may move together with the first circuit board 330 and may move relative to the lens 322 accordingly. The camera module 300 may align the optical axis L of the lens 322 and the image sensor 340 to a specified position by moving the first circuit board 330 in at least one of the two directions perpendicular to the optical axis L using a drive member 270.

Referring to FIG. 17, the camera module 300 may include the first circuit board 330 on which the image sensor 340 is disposed, a second circuit board 350 (e.g., the second circuit board 290 of FIG. 12) on which a connector 353 is disposed, and the connecting member 400 that connects the first circuit board 330 and the second circuit board 350.

The connecting member 400 may electrically connect the first circuit board 330 and the second circuit board 350. For example, one portion of the connecting member 400 may be connected to the first circuit board 330, and another portion of the connecting member 400 may be connected to the second circuit board 350. Accordingly, the first circuit board 330 and the second circuit board 350 may be electrically connected through the connecting member 400.

In FIG. 17, the connecting member 400 may be substantially the same as the connecting member 400 of the camera module described with reference to FIGS. 13 and 14, and the contents described with reference to FIGS. 13 and 14 may be identically applied to the structure in which the connecting member 400 of FIG. 17 is electrically/physically connected to the first circuit board 330 and the second circuit board 350.

As illustrated in FIG. 17, the first circuit board 330 may be configured to move a predetermined distance in the direction perpendicular to the optical axis L as the image stabilization function of the camera module 300 is performed.

A first flexible circuit board 410 and a second flexible circuit board 420 may be deformed such that portions of first layers 440 and 470 and portions of second layers 450 and 480 move toward or away from each other in response to a movement of the first circuit board 330 in the x-axis direction and/or the y-axis direction.

When the first circuit board 330 moves in the y-axis direction, the gap between a second portion 332 of the first circuit board 330 and a first connecting portion 431 of a connecting circuit board 430 may be increased or decreased. For example, as at least a portion of the first layer 440 moves together with the first circuit board 330, the first flexible circuit board 410 between the second portion 332 and the first connecting portion 431 may be deformed with a partial increase or decrease in the gap between the first layer 440 and the second layer 450.

When the first circuit board 330 moves in the x-axis direction, the gap between a fourth portion 352 of the second circuit board 350 and a second connecting portion 432 of the connecting circuit board 430 may be increased or decreased. For example, as at least a portion of the second layer 480 moves together with the connecting circuit board 430, the second flexible circuit board 420 between the fourth portion 352 and the second connecting portion 432 may be deformed with a partial increase or decrease in the gap between the first layer 470 and the second layer 480.

Figure 18:
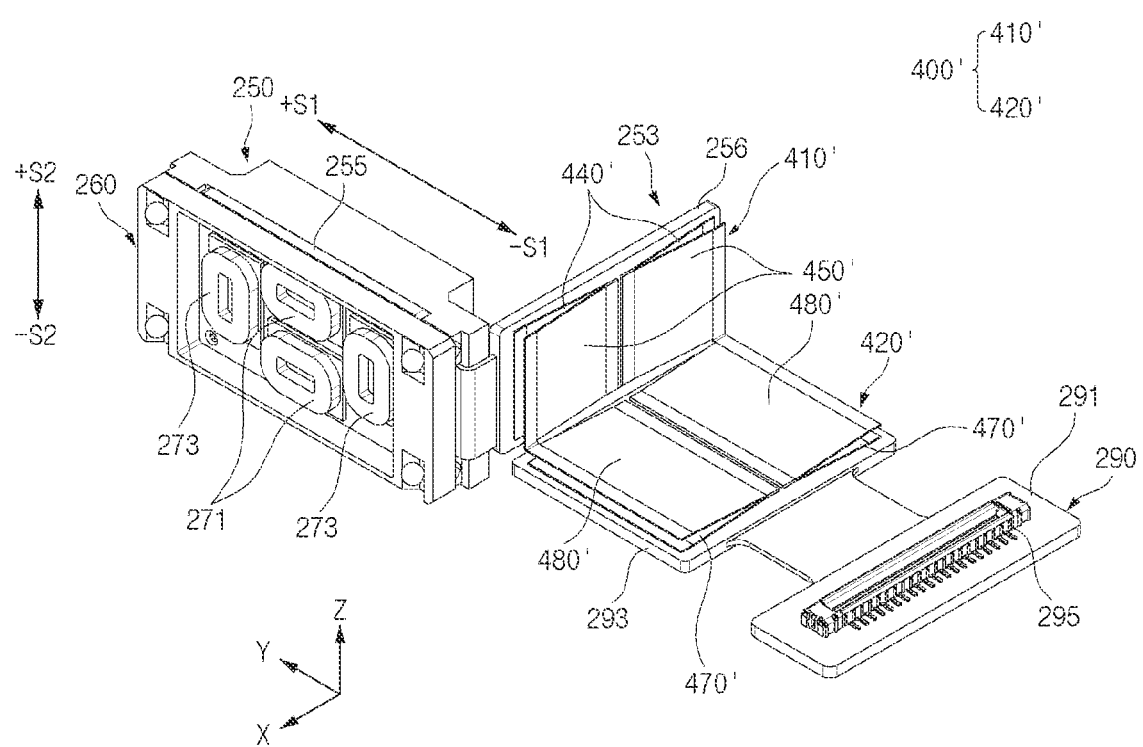
FIG. 18 illustrates a connecting structure of a first circuit board, a second circuit board, and a connecting member of a camera module according to an embodiment.

FIG. 18 illustrates a connecting structure of a first circuit board 253, a second circuit board 290, and a connecting member 400' of a camera module 200 according to an embodiment.

FIG. 18 illustrates an embodiment in which the connecting member 400' does not include the connecting circuit board 430 and a first flexible circuit board 410' and a second flexible circuit board 420' of the connecting member 400' are integrally formed with each other, compared to the camera module 200 illustrated in FIGS. 13 and 14.

Referring to FIG. 18, the camera module 200 may include a movable member 250, a guide member 260, the second circuit board 290, and the connecting member 400'.

The movable member 250 may include an image sensor 252 and the first circuit board 253 on which the image sensor 252 is disposed. The first circuit board 253 may include a first portion 255 on which the image sensor 252 is disposed and a second portion 256 that extends from the first portion 255 at a right angle and to which the connecting member 400' is connected. The second circuit board 290 may include a third portion 291 on which a connector 295 is disposed and a fourth portion 293 that extends from the third portion 291 and to which the connecting member 400' is connected.

The connecting member 400' may be connected to the second portion 256 of the first circuit board 253 and the fourth portion 293 of the second circuit board 290. The connector 295 of the second circuit board 290 may be fixedly coupled to the main circuit board 150 of the electronic device 100. According to an embodiment, when the movable member 250 moves according to an image stabilization operation, tension by the connecting member 400' may be applied between the first circuit board 253 and the second circuit board 290. The tension may obstruct the movement of the first circuit board 253 and the movable member 250. The connecting member 400' may be deformable in response to the movement of the first circuit board 253.

The connecting member 400' may include the first flexible circuit board 410' connected to the first circuit board 253 and the second flexible circuit board 420' connected to the second circuit board 290. The first flexible circuit board 410' and the second flexible circuit board 420' may include first layers 440' and 470' and second layers 450' and 480', respectively. At least a portion of the first layer 440' of the first flexible circuit board 410' may be coupled to the second portion 256 of the first circuit board 253. At least a portion of the first layer 470' of the second flexible circuit board 420' may be coupled to the fourth portion 293 of the second circuit board 290.

The first flexible circuit board 410' may be configured such that the first layer 440' and the second layer 450' are electrically connected through VIAs 461. The first layer 440' and the second layer 450' of the first flexible circuit board 410' may be physically coupled through an adhesive member (e.g., the adhesive member 462 of FIG. 9) disposed on the areas where the VIAs 461 are formed.

The second flexible circuit board 420' may be configured such that the first layer 470' and the second layer 480' are electrically connected through VIAs (e.g., the VIAs 491 of FIGS. 13 and 14). The first layer 470' and the second layer 480' of the second flexible circuit board 420' may be physically coupled through an adhesive member (e.g., the adhesive member 462 of FIG. 9) disposed on the areas where the VIAs 491 are formed (e.g., the VIA areas 443 and 453 of FIG. 11).

The first flexible circuit board 410' and the second flexible circuit board 420' may be at least partially connected. The second layer 450' of the first flexible circuit board 410' and the second layer 480' of the second flexible circuit board 420' may be at least partially connected with each other.

The second layer 450' of the first flexible circuit board 410' and the second layer 480' of the second flexible circuit board 420' may be integrally formed with each other. The second layer 480' of the second flexible circuit board 420' may extend from at least a portion of the second layer 450' of the first flexible circuit board 410'. The second layer 480' of the second flexible circuit board 420' may extend from an edge of the second layer 450' of the first flexible circuit board 410' and may extend substantially perpendicular to the second layer 450' of the first flexible circuit board 410' to face the fourth portion 293 of the second circuit board 290. The second layer 450' of the first flexible circuit board 410' and the second layer 480' of the second flexible circuit board 420' may be provided to form substantially one layer by bending and/or cutting one FPCB.

The camera module 200 may be configured to linearly move the movable member 250 in the direction of the first shift axis S1 (e.g., the y-axis direction) using a first coil 271.

When the movable member 250 moves in the +S1 direction, the first circuit board 253 may move in the +S1 direction relative to the second circuit board 290 that is relatively fixed. When the first circuit board 253 moves, the first layer 440' of the first flexible circuit board 410' may move in the +S1 direction together with the first circuit board 253, and the gap between the first layer 440' and the second layer 450' of the first flexible circuit board 410' may be increased. In contrast, when the movable member 250 moves in the −S1 direction, the first layer 440' of the first flexible circuit board 410' may move in the −S1 direction together with the first circuit board 253, and the gap between the first layer 440' and the second layer 450' of the first flexible circuit board 410' may be decreased.

The camera module 200 may be configured to linearly move the movable member 250 in the direction of the second shift axis S2 (e.g., the z-axis direction) using a second coil 273.

In the illustrated embodiment, when the movable member 250 moves in the +S2 direction, the first circuit board 253 may move in the +S2 direction relative to the second circuit board 290 that is relatively fixed. When the first circuit board 253 moves, the second layer 480' of the second flexible circuit board 420' may move in the +S2 direction together with the first flexible circuit board 410' (or the first circuit board 253, and the gap between the first layer 470' and the second layer 480' of the second flexible circuit board 420' may be increased. In contrast, when the movable member 250 moves in the −S2 direction, the second layer 480' of the second flexible circuit board 420' may move in the −S2 direction together with the first flexible circuit board 410', and the gap between the first layer 470' and the second layer 480' of the second flexible circuit board 420' may be decreased.

Figure 19:
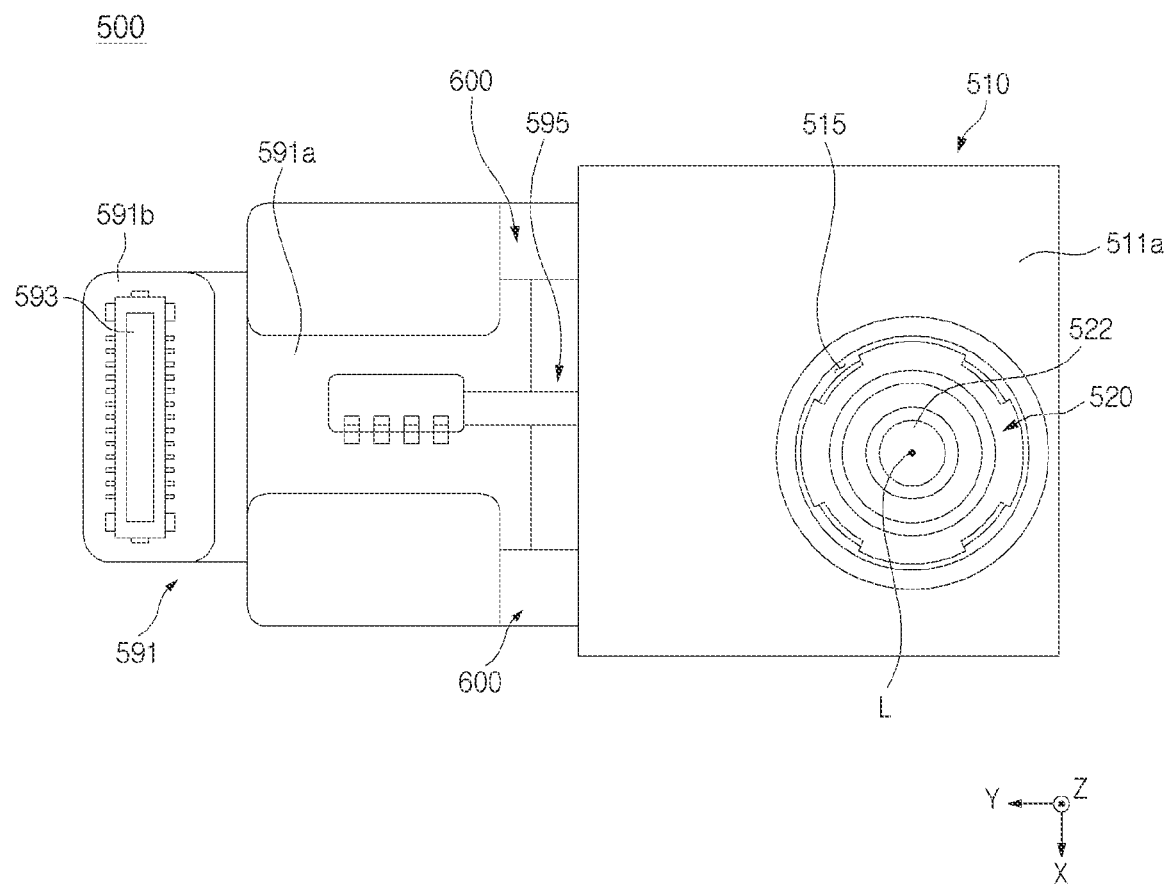
FIG. 19 is a plan view of a camera module according to an embodiment.
Figure 21:
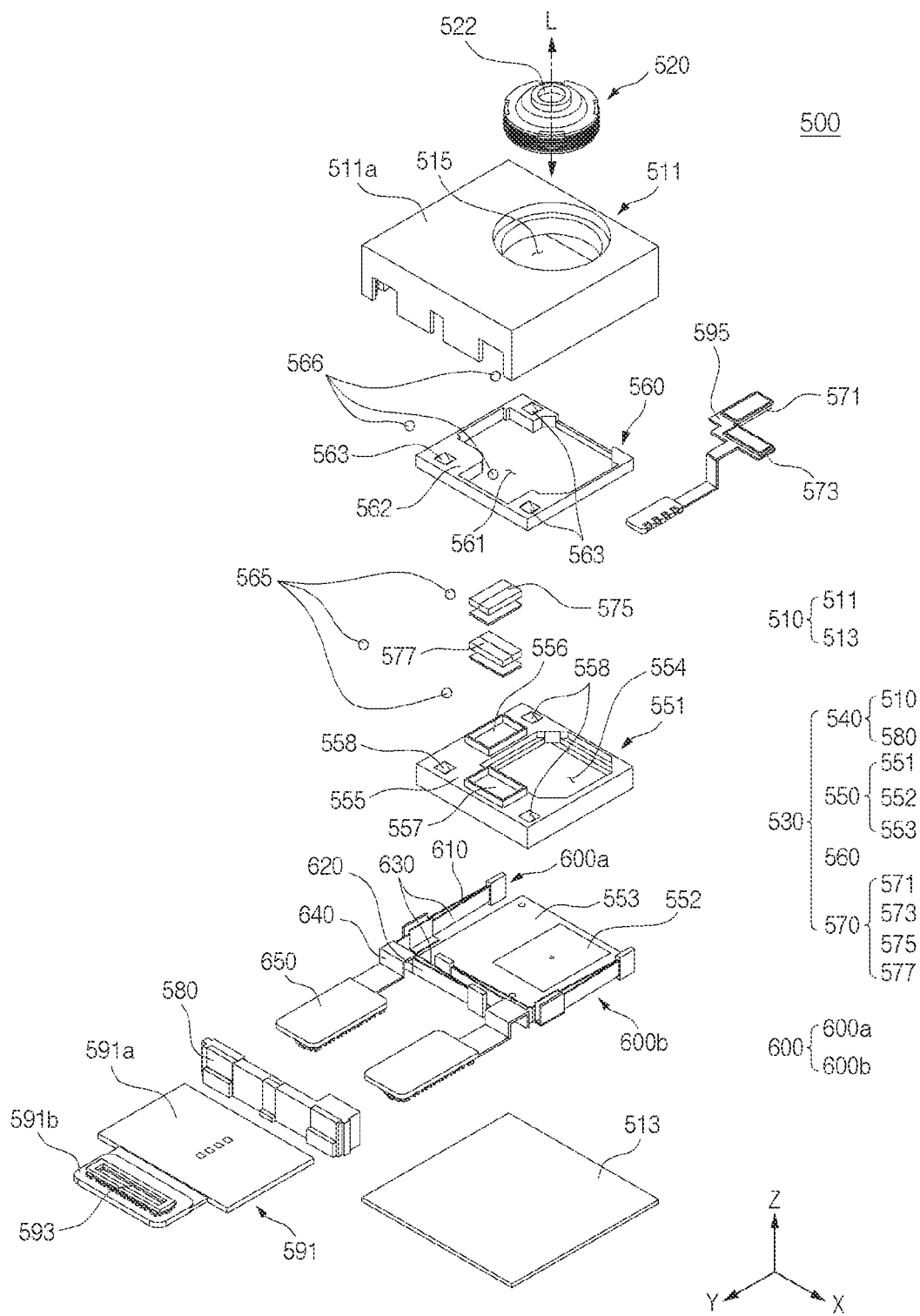
FIG. 21 is an exploded perspective view of the camera module according to an embodiment.

FIG. 19 is a plan view of a camera module 500 according to an embodiment. FIG. is a perspective view of the camera module 500 according to an embodiment. FIG. 21 is an exploded perspective view of the camera module 500 according to an embodiment.

Figure 20:
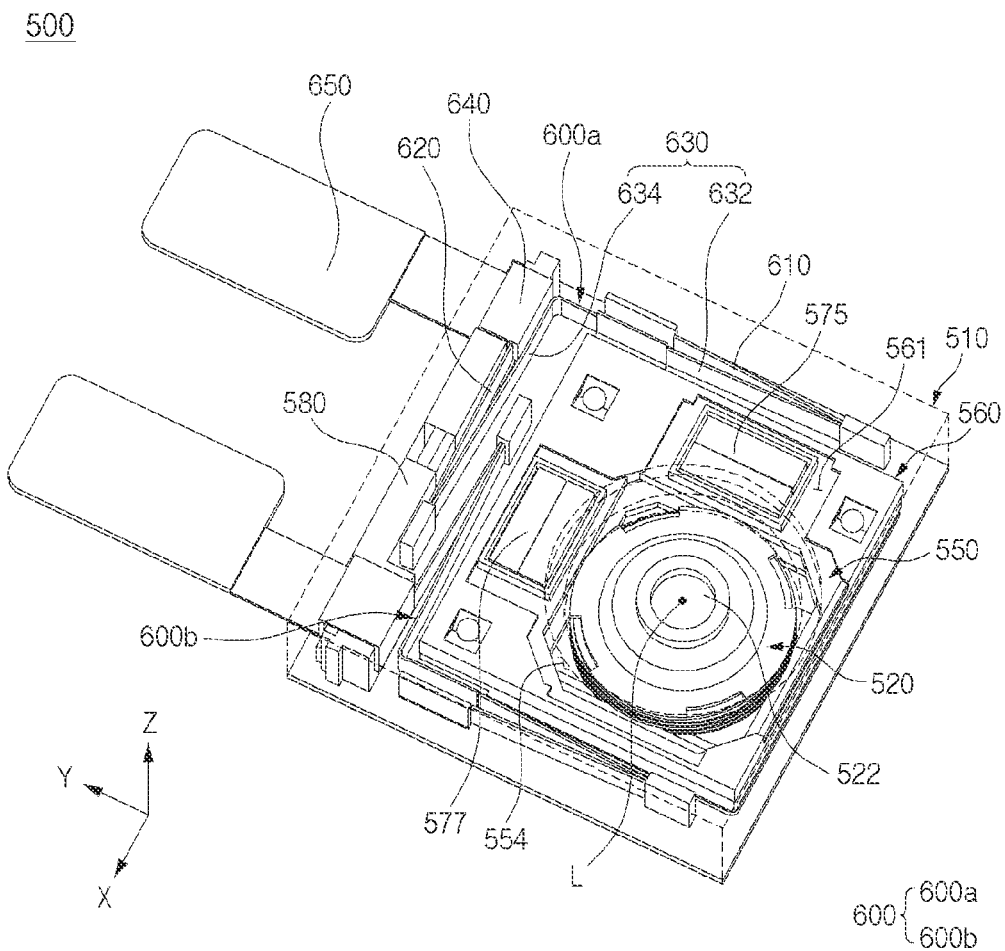
FIG. 20 is a perspective view of the camera module according to an embodiment.

FIG. 20 may be a view in which a first surface 511a of a camera housing 510 is omitted such that the inside of the camera housing 510 is visible.

FIGS. 19 to 21 illustrate the camera module 500 having a different structure from the camera module illustrated in FIGS. 4, 5, and 12 (e.g., the camera module 200 of FIGS. 4, 5, and 12).

The camera module 500 of FIGS. 19 to 21 may be referred to as the direct type camera module having a structure in which the direction in which external light is incident and the optical axis of a lens are parallel to each other, like the camera module of FIG. 16 (e.g., the camera module 300 of FIG. 16). For example, FIGS. 13 and 14 may be schematic views illustrating the camera module 500 and some components included in the camera module 500 illustrated in FIGS. 19 to 21.

Referring to FIGS. 19 to 21, the camera module 500 may include the camera housing 510, a lens assembly 520, an image stabilization assembly 530, a support member 580, a second circuit board 591, and a connecting member 600.

Some of the components of the camera module 500 illustrated in FIGS. 19 to 21 may be substantially the same as or similar to, some of the components of the camera module 200 illustrated in FIGS. 4 to 6 or the camera module 300 illustrated in FIG. 16, and therefore repetitive descriptions will hereinafter be omitted.

The camera housing 510 may form at least a portion of the exterior of the camera module 500. The camera housing 510 may accommodate a part of other components of the camera module 500. For example, at least a part of the lens assembly 520, at least a part of the image stabilization assembly 530, the support member 580, and/or the connecting member 600 may be accommodated in the camera housing 510.

The camera housing 510 may include a cover 511 and a plate 513. The camera housing 510 may be formed by a coupling of the cover 511 and the plate 513. The components of the camera module 500 may be accommodated in the space between the cover 511 and the plate 513. The cover 511 and the plate 513 may be integrally formed with each other.

The lens assembly 520 may be fixedly disposed in the camera housing 510. The lens assembly 520 may be coupled to the cover 511 of the camera housing 510. The cover 511 may have an opening 515 formed therein in which the lens assembly 520 is disposed. The opening 515 may be formed in a portion of the first surface 511a (e.g., the surface facing the +z-axis direction) of the camera housing 510. The lens assembly 520 may be disposed in the opening 515. The camera housing 510 may be configured such that at least a part of the lens assembly 520 is visually exposed outside the camera housing 510 through the opening 515. The lens assembly 520 may overlap the opening 515 when the first surface 511a of the camera housing 510 is viewed from above.

The lens assembly 520 may be partially disposed in the camera housing 510. At least a part of the lens assembly 520 may be visually exposed outside the camera housing 510 through the opening 515 of the camera housing 510. As the lens assembly 520 is disposed in the opening 515, a lens 522 may be configured to receive external light. The lens assembly 520 (or the lens 522 may be visually exposed inside the opening 515 when the first surface 511a of the camera housing 510 is viewed from above.

The lens assembly 520 may be fixed to the camera housing 510. The lens assembly 520 may be coupled to the inside of the opening 515 of the cover 511 and may be fixedly disposed in the camera housing 510 accordingly. In various embodiments, when a movable member 550 (or an image sensor 552) moves in a direction perpendicular to the optical axis L of the lens 522, the lens assembly 520 may be in a state of being relatively fixed to the camera housing 510.

The lens assembly 520 may be aligned with the image sensor 552 in the direction of the optical axis L of the lens 522. The lens assembly 520 may partially overlap the image sensor 552 when the first surface 511a of the camera housing 510 is viewed from above. The optical axis L of the lens 522 may refer to a virtual axis extending in the direction in which external light passes through the lens 522. The optical axis L of the lens 522 may be substantially perpendicular to the first surface 511a of the camera housing 510. The optical axis L of the lens 522 may extend substantially parallel to the z-axis direction.

The image stabilization assembly 530 may include a fixed member 540, the movable member 550, a guide member 560, and a drive member 570.

The fixed member 540 may refer to a structure, on the basis of which the movable member 550 makes a relative movement. The fixed member 540 may refer to components relatively fixed with respect to a movement of the movable member 550 in an image stabilization operation and may include the camera housing 510 and the support member 580. As the camera module 500 is configured such that the lens assembly 520 is fixed to the fixed member 540 and the movable member 550 moves relative to the fixed member 540, the position of the movable member 550 relative to the lens assembly 520 may be changed, and an image stabilization function may be performed based on the change.

The movable member 550 may be configured to move in the direction perpendicular to the optical axis L relative to the fixed member 540. The movable member 550 may move in at least one direction perpendicular to the optical axis L relative to the fixed member 540 and the lens assembly 520. The image stabilization assembly 530 may perform the image stabilization function by moving the movable member 550 in the direction perpendicular to the optical axis L (e.g., the x-axis direction and/or the y-axis direction). The image stabilization assembly 530 may compensate for image shake by moving the movable member 550 including the image sensor 552 in the x-axis direction and/or the y-axis direction with respect to the relatively fixed lens assembly 520.

The movable member 550 may include a holder 551 (e.g., the holder 251 of FIGS. 5 to 7), the image sensor 552, and a first circuit board 553. The holder 551, the image sensor 552, and the first circuit board 553 may be combined or connected so as to move together in the direction perpendicular to the optical axis L.

The holder 551 may be coupled with the first circuit board 553. For example, at least a portion of the holder 551 may be coupled to the first circuit board 553 such that the holder 551 moves together with the first circuit board 553. When the image stabilization operation is performed, the holder 551, together with the image sensor 552 and the first circuit board 553, may move relative to the fixed member 540 or the lens assembly 520.

The holder 551 may have a first opening area 554 formed therein to be aligned with the lens assembly 520 in the direction of the optical axis L. The lens assembly 520 may face the image sensor 552 through the first opening area 554. Light passing through the lens 522 may be incident on the image sensor 552 through the first opening area 554.

A plurality of magnets 575 and 577 may be disposed on the holder 551. The holder 551 may include magnet support portions 556 and 557 formed on a first peripheral area 555 surrounding the first opening area 554. The magnet support portions 556 and 557 may include the first magnet support portion 556 in which the first magnet 575 is seated and the second magnet support portion 557 in which the second magnet 577 is seated. The first magnet 575 may be fixedly disposed in the first magnet support portion 556, and the second magnet 577 may be fixedly disposed in the second magnet support portion 557.

The holder 551 may have on the first peripheral area 555 thereof, first recesses 558 in which at least portions of first balls 565 are accommodated. As many first recesses 558 as the first balls 565 may be formed. The first recesses 558 may be formed in a shape extending in the x-axis direction. However, the shape of the first recesses 558 is not limited to the illustrated embodiment.

The first circuit board 553 may be coupled to the holder 551 so as to move together with the holder 551. The first circuit board 553 may be electrically connected with the image sensor 552 and the connecting member 600. The image sensor 552 may be connected to or disposed on, one surface (e.g., the surface facing the +z-axis direction) of the first circuit board 553. The image sensor 552 may be mounted on the surface facing substantially the same direction as the first surface 511a of the camera housing 510 so as to partially face the lens assembly 520. The connecting member 600 may be connected to at least a portion of the periphery of the first circuit board 553. The structure in which the connecting member 600 and the first circuit board 553 are connected will be described below in more detail with reference to FIG. 23.

The guide member 560 may guide and/or support a movement of the movable member 550. The guide member 560 may be located between the holder 551 of the movable member 550 and the cover 511 of the camera housing 510. The guide member 560 may be coupled so as to be movable relative to the cover 511 and the holder 551. The guide member 560 may be coupled to the holder 551 so as to be movable in the x-axis direction and may be coupled to the cover 511 of the camera housing 510 so as to be movable in the y-axis direction. The guide member 560 may be coupled to the cover 511 such that a movement of the guide member 560 relative to the cover 511 in the x-axis direction is limited.

In an embodiment, in the image stabilization operation, the guide member 560 may move together with the movable member 550 or may be fixed without moving together with the movable member 550. The guide member 560 may be configured to move in the y-axis direction together with the movable member 550 when the movable member 550 moves in the y-axis direction. When the movable member 550 moves in the x-axis direction, a movement of the guide member 560 in the x-axis direction may be limited, and thus the guide member 560 may be separated from the movement of the movable member 550 in the x-axis direction. The guide member 560 may guide or support the movement of the movable member 550 in the x-axis direction in the image stabilization operation. The guide member 560 may move together with the movable member 550 in a stabilization operation of moving the movable member 550 (or the image sensor 552) in the y-axis direction and may be fixed to the fixed member 540 (e.g., the cover 511) without moving together with the movable member 550 in a stabilization operation of moving the movable member 550 in the x-axis direction.

The guide member 560 may have a second opening area 561 formed therein to be aligned with the lens assembly 520 in the direction of the optical axis L. The second opening area 561 may be aligned with the first opening area 554 of the holder 551 in the direction of the optical axis L. The lens assembly 520 may face the image sensor 552 through the first opening area 554 and the second opening area 561. Light passing through the lens 522 may be incident on the image sensor 552 through the first opening area 554 and the second opening area 561.

The second opening area 561 may overlap the first opening area 554 and the magnet support portions 556 and 557 of the holder 551. The second opening area 561 may be aligned with the first opening area 554 and the magnet support portions 556 and 557 in the direction perpendicular to the first surface 511a (e.g., the z-axis direction). Based on FIG. 22, the first opening area 554 and the magnet support portions 556 and 557 may be located inside the second opening area 561 when the camera module 500 is viewed in the +z-axis direction. A second surface (e.g., the surface facing the −z-axis direction) of the cover 511 that faces away from the first surface 511a may face at least a portion (e.g., the magnet support portions 556 and 557) of the holder 551 through the second opening area 561. A plurality of coils 571 and 573 located on the second surface of the cover 511 and the plurality of magnets 575 and 577 located in the magnet support portions 556 and 557 of the holder 551 may face each other in the direction of the optical axis L through the second opening area 561.

The guide member 560 may include a second peripheral area 562 surrounding the second opening area 561. The plurality of magnets 575 and 577 may be located in the second opening area 561. The guide member 560 may have on the second peripheral area 562 thereof, second recesses 563 in which at least portions of second balls 566 are accommodated. As many second recesses 563 as the second balls 566 may be formed. The second recesses 563 may be formed in a shape extending in the y-axis direction. However, the shape of the second recesses 563 is not limited to the illustrated embodiment.

The drive member 570 may be configured to provide a driving force for moving the movable member 550 in at least one direction perpendicular to the optical axis L. The drive member 570 may generate a driving force or a physical force for moving the movable member 550 in the first shift axis S1 and/or the direction of the second shift axis S2.

The drive member 570 may include the plurality of coils 571 and 573 and the plurality of magnets 575 and 577. The plurality of coils 571 and 573 may be disposed in the camera housing 510 of the fixed member 540. The plurality of magnets 575 and 577 may be disposed on the holder 551 of the movable member 550. The plurality of coils 571 and 573 may be fixedly disposed on the cover 511 of the camera housing 510, and the plurality of magnets 575 and 577 may be fixedly disposed in the magnet support portions 556 and 557 of the holder 551 to face the plurality of coils 571 and 573 in the direction of the optical axis L. The movable member 550 may be configured to move relative to the fixed member 540 by an electromagnetic interaction between the plurality of magnets 575 and 577 and the plurality of coils 571 and 573.

The plurality of coils 571 and 573 and the plurality of magnets 575 and 577 may be disposed to be aligned in the direction of the optical axis L (e.g., the z-axis direction). The plurality of magnets 575 and 577 may be disposed in the magnet support portions 556 and 557 of the holder 551 to face the second surface of the cover 511 (e.g., the surface facing away from the first surface 511a or the surface facing the −z-axis direction). A coil flexible circuit board 595 may be disposed on the second surface of the cover 511, and the plurality of coils 571 and 573 may be disposed on the coil flexible circuit board 595 to face the plurality of magnets 575 and 577. The plurality of coils 571 and 573 may be mounted on one area (e.g., the area facing the −z-axis direction) of the coil flexible circuit board 595 so as to be electrically connected with the coil flexible circuit board 595. The coil flexible circuit board 595 may be configured such that one portion is attached to the second surface of the cover 511 and another portion is connected to the second circuit board 591. The coil flexible circuit board 595 may be formed in a shape extending from the cover 511 toward the second circuit board 591.

The drive member 570 may include the first coil 571 and the first magnet 575 for moving the movable member 550 in the x-axis direction and the second coil 573 and the second magnet 577 for moving the movable member 550 in the y-axis direction.

The first magnet 575 may be fixedly disposed in the first magnet support portion 556 of the holder 551. The first coil 571 may be fixedly disposed on the cover 511 (or the coil flexible circuit board 595) to face the first magnet 575 in the direction of the optical axis L. The second magnet 577 may be fixedly disposed in the second magnet support portion 557 of the holder 551. The second coil 573 may be fixedly disposed on the cover 511 (or the coil flexible circuit board 595) to face the second magnet 577 in the direction of the optical axis L.

The camera module 500 may perform the image stabilization function by moving the movable member 550 (or the image sensor 552) in the direction perpendicular to the optical axis L (e.g., the x-axis direction and/or the y-axis direction) by applying electrical signals to the plurality of coils 571 and 573. For example, when the electrical signals are applied to the plurality of coils 571 and 573, a magnetic field may be formed, and an electromagnetic force may be generated between the plurality of coils 571 and 573 and the plurality of magnets 575 and 577. The movable member 550 may be configured to move in the x-axis direction and/or the y-axis direction relative to the lens assembly 520 and the fixed member 540 by the electromagnetic force.

The image stabilization assembly 530 may further include a first ball guide structure and a second ball guide structure for guiding a movement of the movable member 550.

The first ball guide structure may include one or more first balls 565 disposed between the guide member 560 and the holder 551. For example, a plurality of first balls 565 may be formed. Third recesses that overlap the first recesses 558 in the direction of the optical axis L may be formed on the guide member 560. The first balls 565 may be configured to roll in the spaces between the first recesses 558 of the holder 551 and the third recesses of the guide member 560.

The second ball guide structure may include one or more second balls 566 disposed between the guide member 560 and the cover 511. For example, a plurality of second balls 566 may be formed. Although not illustrated, fourth recesses that overlap the second recesses 563 in the direction of the optical axis L may be formed on the cover 511. The second balls 566 may be configured to roll in the spaces between the second recesses 563 of the guide member 560 and the fourth recesses of the cover 511.

The support member 580 may support at least a portion of the connecting member 600 and at least a portion of the coil flexible circuit board 595. The support member 580 may be located in the camera housing 510. The support member 580 may be coupled to the cover 511 so as to be fixedly disposed in the camera housing 510. The connecting member 600 and the coil flexible circuit board 595 may be mounted on at least portions of the support member 580. The connecting member 600 and the coil flexible circuit board 595 may extend from the inside of the camera housing 510 to the outside of the camera housing 510 across the support member 580.

As at least a portion of the connecting member 600 is mounted on the support member 580, the support member 580 may support the connecting member 600 such that the connecting member 600 is deformed in response to a movement of the first circuit board 553. For example, at least a portion of the connecting member 600 mounted on the support member 580 may be fixed to the support member 580. The connecting member 600 may be deformed in response to a movement of the first circuit board 553 based on the portion fixed to the support member 580.

The second circuit board 591 may be configured to electrically connect the camera module 500 with a main circuit board of an electronic device. The second circuit board 591 may be electrically connected with the camera module 500, the main circuit board 150, and the FPCB 595. The second circuit board 591 may be electrically connected with the first circuit board 553 of the camera module 500 through the connecting member 600. The second circuit board 591 may be electrically connected with the main circuit board 150 through a connector 593.

The second circuit board 591 may include a first portion 591a to which the connecting member 600 and the coil flexible circuit board 595 are connected and a second portion 591b extending from the first portion 591a. The connector 593 may be disposed on the second portion 591b. The connecting member 600 and/or the coil flexible circuit board 595 may be electrically connected to the first portion 591a. The second circuit board 591 may have on the first portion 591a thereof, a conductive area with which at least a portion of the connecting member 600 and/or at least a portion of the coil flexible circuit board 595 make electrical contact.

The second circuit board 591 may be fixedly disposed in the housing 110 of the electronic device 100. The second circuit board 591 may be fixed inside the housing 110 by connection of the connector 593 to the main circuit board 150. When the first circuit board 553 moves in the image stabilization operation, the second circuit board 591 may remain fixed without moving together with the first circuit board 553.

The connecting member 600 may electrically connect the first circuit board 553 and the second circuit board 591. The connecting member 600 may be connected to the first circuit board 553 and the second circuit board 591. When the first circuit board 553 moves relative to the second circuit board 591 in the image stabilization operation, the connecting member 600, which electrically connects the first circuit board 553 and the second circuit board 591, may be deformed while at least a portion of the connecting member 600 moves together. The connecting member 600 may include a first connecting member 600a and a second connecting member 600b. The first connecting member 600a and the second connecting member 600b may include identical components and may be formed in substantially the same shape or similar shapes.

The connecting member 600 may include one or more flexible circuit boards or flexible portions 610, 620, 630, and 640. The flexible portions 610, 620, 630, and 640 may include the FPCB. The flexible portions 610, 620, 630, and 640 may be integrally formed by using one FPCB or may be formed by connecting or coupling a plurality of FPCBs.

The connecting member 600 may include a flexible portion and a rigid portion. The flexible portion may include the first portions 610, the second portions 620, the bending portions 630, and the extending portions 640. The rigid portion may include contact portions 650 disposed on end portions of the extending portions 640 and brought into contact with the second circuit board 591. The connecting member 600 may be implemented with an RFPCB. A specific shape and a movement operation of the connecting member 600 will be described below in more detail with reference to FIGS. 22 and 23.

Figure 22:
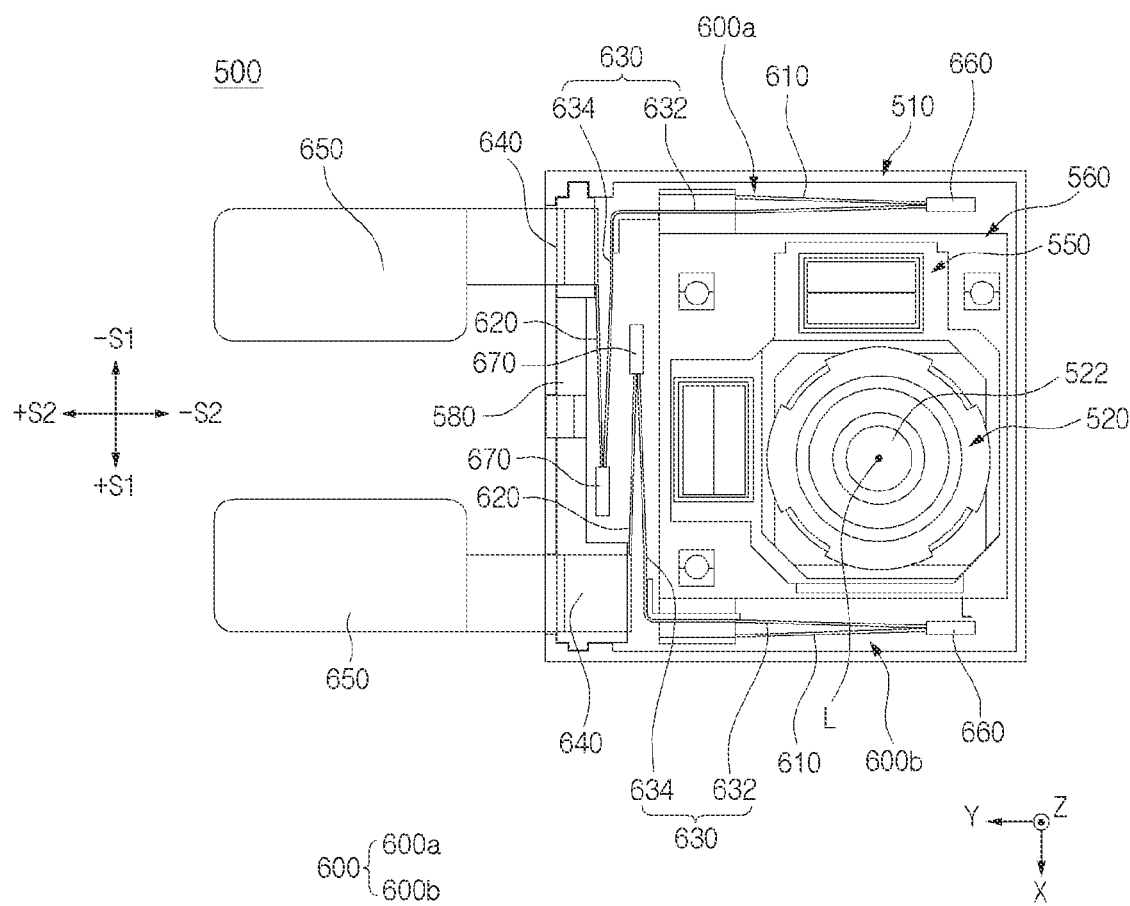
FIG. 22 illustrates a movable member and a connecting member of the camera module according to an embodiment.
Figure 23:
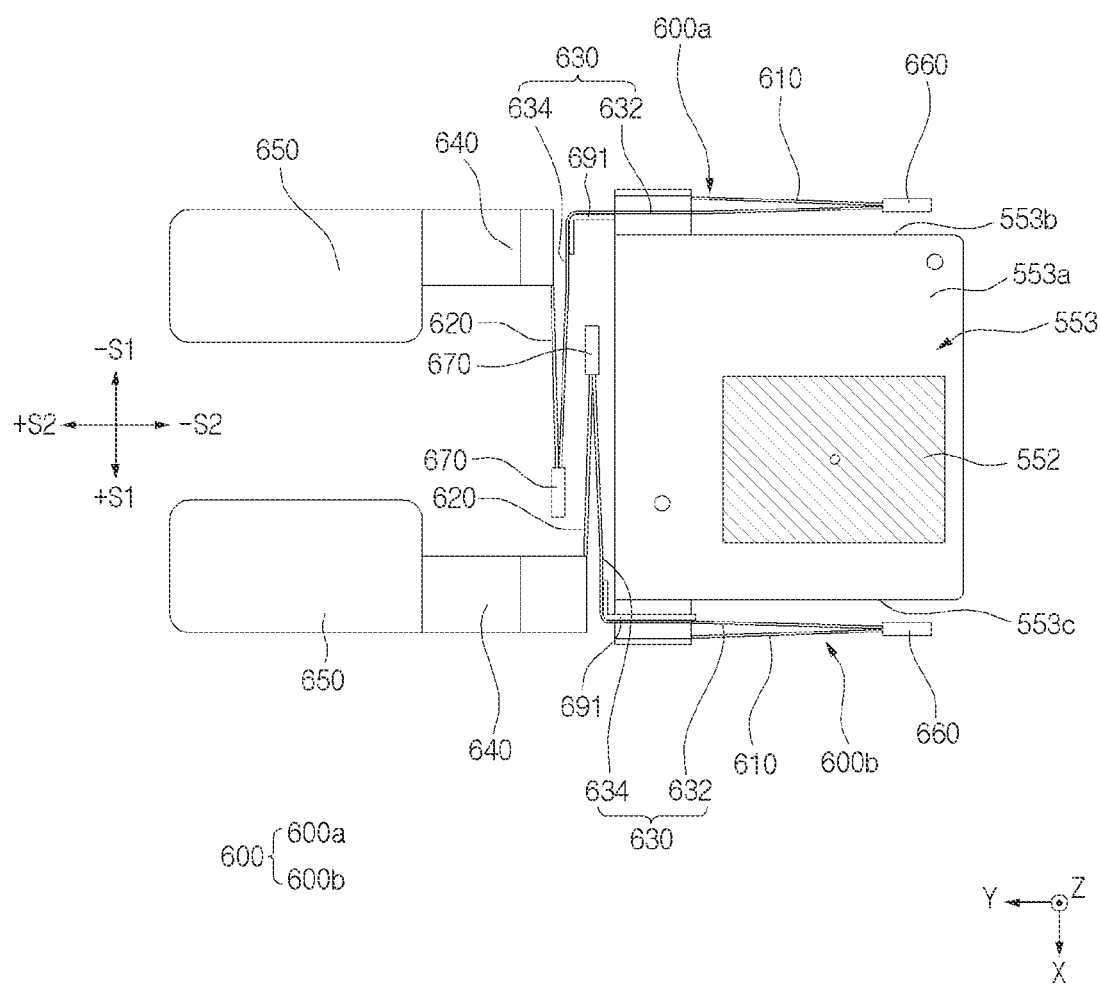
FIG. 23 illustrates the connecting member of the camera module according to an embodiment.

FIG. 22 illustrates the movable member 550 and the connecting member 600 of the camera module 500 according to an embodiment. FIG. 23 illustrates the connecting member 600 and the first circuit board 553 of the camera module 500 according to an embodiment.

Referring to FIGS. 22 and 23, the camera module 500 may include the camera housing 510, the lens assembly 520, the movable member 550, the guide member 560, the support member 580, and the connecting member 600. Some of the components of the camera module 500 illustrated in FIGS. 22 and 23 may be the same as or similar to, some of the components of the camera module 500 illustrated in FIGS. 19 to 21, and repetitive descriptions will hereinafter be omitted.

The movable member 550 may include the first circuit board 553 and the image sensor 552 disposed on the first circuit board 553. The image sensor 552 may be disposed on a first surface 553a of the first circuit board 553, and the connecting member 600 may be connected to edges of the first circuit board 553. A contact portion 650 of the connecting member 600 may be connected with the second circuit board 591 fixedly coupled to the main circuit board of the electronic device. The connecting member 600 may be configured such that the portions connecting the contact portions 650 and the first circuit board 553 are deformable in response to a movement of the first circuit board 553.

The connecting member 600 may include the first connecting member 600a and the second connecting member 600b connected to opposite sides of the first circuit board 553. The first connecting member 600a may be connected to a first edge 553b of the first circuit board 553, and the second connecting member 600b may be connected to a second edge 553c facing the first edge 553b. The first connecting member 600a and the second connecting member 600b may be formed in substantially the same structure or similar structures.

The connecting member 600 may include the first portions 610, the second portions 620, the bending portions 630, the extending portions 640, and the contact portions 650. The first portions 610, the second portions 620, the bending portions 630, and the extending portions 640 may flexibly extend to connect the contact portions 650 and the first circuit board 553. The first portions 610, the second portions 620, and the bending portions 630 may be partially deformed as the first circuit board 553 moves in the direction of the first shift axis S1 or the direction of the second shift axis S2 when the contact portions 650 are fixed to the second circuit board 591. For example, at least parts of the extending portions 640 may be mounted on the support member 580, and the first portions 610, the second portions 620, and the bending portions 630 may be deformed while partially moving with respect to the extending portions 640 mounted on the support member 580.

The first portions 610 may be connected to the edges 553b and 553c of the first circuit board 553. The second portions 620 may be connected to the extending portions 640. The bending portion 630 may be connected, at opposite end portions, to the first portions 610 and the second portions 620. The bending portions 630 may physically and electrically connect the first portions 610 and the second portions 620. The first portions 610 may be located at the edges of the first circuit board 553 in the direction of the first shift axis S1, and the second portions 620 may be located at the edge of the first circuit board 553 in the direction of the second shift axis S2. The first portions 610 and the second portions 620 may be located in directions perpendicular to each other with respect to the first circuit board 553. The first portions 610, the second portions 620, and the bending portions 630 may be disposed substantially perpendicular to the first circuit board 553.

In an embodiment, each of the bending portions 630 may be bent such that one portion partially faces the first portion 610 and another portion partially faces the second portion 620. The bending portion 630 may include a third portion 632, at least part of which faces the first portion 610 and a fourth portion 634, at least part of which faces the second portion 620.

A reinforcing member 691 may be disposed on part of the bending portion 630. The reinforcing member 691 may be disposed on the portion where the third portion 632 and the fourth portion 634 are connected and may be bent depending on the shape of the bending portion 630. The reinforcing member 691 may support the bending portion 630 such that the bending portion 630 remains bent. The reinforcing member 691 may be implemented with a material having a specified rigidity.

The first portion 610 and the third portion 632 may be electrically connected through VIAs. The first portion 610 and the third portion 632 may be electrically connected through a first VIA portion 660 having one or more VIAs formed therein. An adhesive member that attaches the first portion 610 and the third portion 632 may be disposed on the first VIA portion 660.

The second portion 620 and the fourth portion 634 may be electrically connected through VIAs. The second portion 620 and the fourth portion 634 may be electrically connected through a second VIA portion 670 having one or more VIAs formed therein. An adhesive member that attaches the second portion 620 and the fourth portion 634 may be disposed on the second VIA portion 670.

The connecting member 600 may be understood as a change of the structure of the connecting member 400 illustrated in FIGS. 13 and 14. Compared to the connecting member 400 of FIGS. 13 and 14, the connecting member 600 of FIGS. 22 and 23 may be a structure integrally formed by using one flexible circuit board. The connecting member 600 of FIGS. 22 and 23 may be a structure changed such that in the connecting member 400, the first flexible circuit board 410 and the second flexible circuit board 420 are implemented with one flexible circuit board so as to be connected without the connecting circuit board 430, the first flexible circuit board 410 is integrally formed with the second portion 256 of the first circuit board 253, and the second flexible circuit board 420 is integrally formed with the fourth portion 293 of the second circuit board 290.

The first portion 610 and the third portion 632 may be referred to as the first layer 440 and the second layer 450 of the first flexible circuit board 410 illustrated in FIGS. 13 and 14. The second portion 620 and the fourth portion 634 may be referred to as the first layer 470 and the second layer 480 of the second flexible circuit board 420 illustrated in FIGS. 13 and 14. The third portion 632 and the fourth portion 634 of the bending portion 630 may be understood as the second layer 450 of the first flexible circuit board 410 and the second layer 480 of the second flexible circuit board 420 that are changed so as to be integrally formed and directly connected with each other without being connected through the connecting circuit board 430 in the connecting member 400 illustrated in FIGS. 13 and 14.

The first VIA portion 660 may be referred to as the portion where the VIAs 461 and the adhesive member 462 are disposed in the first flexible circuit board 410 illustrated in FIGS. 13 and 14. The second VIA portion 670 may be referred to as the portion where the VIAs 491 and the adhesive member 492 are disposed in the second flexible circuit board 420 of FIGS. 13 and 14.

Hereinafter, an operation in which the connecting member 600 is deformed in an image stabilization operation will be described.

The camera module 500 may perform the image stabilization operation by moving the movable member 550 (e.g., the first circuit board 553 and the image sensor 552) in the direction of the first shift axis S1 or the second shift axis S2 perpendicular to the optical axis L. For example, when the movable member 550 moves, the lens 522 of the lens assembly 520 may be in a state of being relatively fixed to the camera housing 510.

When the image stabilization operation is performed in the direction of the first shift axis S1 (e.g., the x-axis direction), the first circuit board 553 and the image sensor 552 may move in the direction of the first shift axis S1 relative to the guide member 560 and the camera housing 510 that are relatively fixed.

The first portion 610 and the third portion 632 of the connecting member 600 may be spaced apart from each other by a predetermined gap when viewed in the direction of the optical axis L. The predetermined gap may be increased or decreased as the first circuit board 553 and the image sensor 552 move in the direction of the first shift axis S1.

When the first circuit board 553 moves in the +S1 direction (e.g., the +x-axis direction), the first portion 610 of the first connecting member 600*a* and the first portion 610 of the second connecting member 600*b* may move in the +S1 direction together with the first circuit board 553. The gap between the first portion 610 and the third portion 632 of the first connecting member 600*a* may be decreased, and the gap between the first portion 610 and the third portion 632 of the second connecting member 600*b* may be increased.

When the first circuit board 553 moves in the −S1 direction (e.g., the −x-axis direction), the first portion 610 of the first connecting member 600*a* and the first portion 610 of the second connecting member 600*b* may move in the −S1 direction together with the first circuit board 553. The gap between the first portion 610 and the third portion 632 of the first connecting member 600*a* may be increased, and the gap between the first portion 610 and the third portion 632 of the second connecting member 600*b* may be decreased.

When the image stabilization operation is performed in the direction of the second shift axis S2 (e.g., the y-axis direction), the first circuit board 553 and the image sensor 552, together with the guide member 560, may move in the direction of the second shift axis S2 relative to the camera housing 510 that is relatively fixed.

The second portion 620 and the fourth portion 634 of the connecting member 600 may be spaced apart from each other by a predetermined gap when viewed in the direction of the optical axis L. The predetermined gap may be increased or decreased as the first circuit board 553 and the image sensor 552 move in the direction of the second shift axis S2.

When the first circuit board 553 moves in the +S2 direction (e.g., the +y-axis direction), the fourth portion 634 of the first connecting member 600*a* and the fourth portion 634 of the second connecting member 600*b* may move in the +S2 direction together with the first circuit board 553. The gap between the second portion 620 and the fourth portion 634 of the first connecting member 600*a* and the gap between the second portion 620 and the fourth portion 634 of the second connecting member 600*b* may be decreased.

When the first circuit board 553 moves in the −S2 direction (e.g., the −y-axis direction), the fourth portion 634 of the first connecting member 600*a* and the fourth portion 634 of the second connecting member 600*b* may move in the −S2 direction together with the first circuit board 553. The gap between the second portion 620 and the fourth portion 634 of the first connecting member 600*a* and the gap between the second portion 620 and the fourth portion 634 of the second connecting member 600*b* may be increased.

FIG. 24 is a block diagram illustrating an electronic device 701 in a network environment 700 according to an embodiment.

Referring to FIG. 24, the electronic device 701 in the network environment 700 may communicate with an electronic device 702 via a first network 798 (e.g., a short-range wireless communication network) or at least one of an electronic device 704 or a server 708 via a second network 799 (e.g., a long-range wireless communication network). The electronic device 701 may communicate with the electronic device 704 via the server 708. The electronic device 701 may include a processor 720, memory 730, an input module 750, a sound output module 755, a display module 760, an audio module 770, a sensor module 776, an interface 777, a connecting terminal 778, a haptic module 779, a camera module 780, a power management module 788, a battery 789, a communication module 790, a subscriber identification module (SIM) 796 or an antenna module 797. In some embodiments, at least one of the components (e.g., the connecting terminal 778) may be omitted from the electronic device 701 or one or more other components may be added in the electronic device 701. In some embodiments, some of the components (e.g., the sensor module 776, the camera module 780 or the antenna module 797) may be implemented as a single component (e.g., the display module 760).

The processor 720 may execute, for example, software (e.g., a program 740) to control at least one other component (e.g., a hardware or software component) of the electronic device 701 coupled with the processor 720, and may perform various data processing or computation. According to one embodiment, as at least part of the data processing or computation, the processor 720 may store a command or data received from another component (e.g., the sensor module 776 or the communication module 790) in volatile memory 732, process the command or the data stored in the volatile memory 732, and store resulting data in non-volatile memory 734. According to an embodiment, the processor 720 may include a main processor 721 (e.g., a CPU or an AP) or an auxiliary processor 723 (e.g., a GPU, a neural processing unit (NPU), an ISP, a sensor hub processor or a CP) that is operable independently from or in conjunction with, the main processor 721. For example, when the electronic device 701 includes the main processor 721 and the auxiliary processor 723, the auxiliary processor 723 may be adapted to consume less power than the main processor 721 or to be specific to a specified function. The auxiliary processor 723 may be implemented as separate from or as part of the main processor 721.

The auxiliary processor 723 may control at least some of functions or states related to at least one component (e.g., the display module 760, the sensor module 776 or the communication module 790) among the components of the electronic device 701, instead of the main processor 721 while the main processor 721 is in an inactive (e.g., sleep) state or together with the main processor 721 while the main processor 721 is in an active state (e.g., executing an application). According to an embodiment, the auxiliary processor 723 (e.g., an ISP or a CP) may be implemented as part of another component (e.g., the camera module 780 or the communication module 790) functionally related to the auxiliary processor 723. According to an embodiment, the auxiliary processor 723 (e.g., the neural processing unit) may include a hardware structure specified for artificial intelligence model processing. An artificial intelligence model may be generated by machine learning. Such learning may be performed, e.g., by the electronic device 701 where the artificial intelligence is performed or via a separate server (e.g., the server 708). Learning algorithms may include, but are not limited to, e.g., supervised learning, unsupervised learning, semi-supervised learning or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent DNN (BRDNN), deep Q-network, or a combination of two or more thereof but is not limited thereto. The artificial intelligence model may, additionally or alternatively, include a software structure other than the hardware structure.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744 or an application 746.

The input module 750 may receive a command or data to be used by another component (e.g., the processor 720) of the electronic device 701, from the outside (e.g., a user) of the electronic device 701. The input module 750 may include, for example, a microphone, a mouse, a keyboard, a key (e.g., a button) or a digital pen (e.g., a stylus pen).

The sound output module 755 may output sound signals to the outside of the electronic device 701. The sound output module 755 may include, for example, a speaker or a receiver. The speaker may be used for general purposes, such as playing multimedia or playing record. The receiver may be used for receiving incoming calls. According to an embodiment, the receiver may be implemented as separate from or as part of the speaker.

The display module 760 may visually provide information to the outside (e.g., a user) of the electronic device 701. The display module 760 may include, for example, a display, a hologram device or a projector and control circuitry to control a corresponding one of the display, hologram device, and projector. According to an embodiment, the display module 760 may include a touch sensor adapted to detect a touch or a pressure sensor adapted to measure the intensity of force incurred by the touch.

The audio module 770 may convert a sound into an electrical signal and vice versa. According to an embodiment, the audio module 770 may obtain the sound via the input module 750 or output the sound via the sound output module 755 or a headphone of an external electronic device (e.g., an electronic device 702) directly (e.g., wiredly) or wirelessly coupled with the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. According to an embodiment, the sensor module 776 may include, for example, a gesture sensor, a gyro sensor, an atmospheric pressure sensor, a magnetic sensor, an acceleration sensor, a grip sensor, a proximity sensor, a color sensor, an IR sensor, a biometric sensor, a temperature sensor, a humidity sensor or an illuminance sensor.

The interface 777 may support one or more specified protocols to be used for the electronic device 701 to be coupled with the external electronic device (e.g., the electronic device 702) directly (e.g., wiredly) or wirelessly. According to an embodiment, the interface 777 may include, for example, an HDMI, a USB interface, an SD card interface or an audio interface.

A connecting terminal 778 may include a connector via which the electronic device 701 may be physically connected with the external electronic device (e.g., the electronic device 702). According to an embodiment, the connecting terminal 778 may include, for example, a HDMI connector, a USB connector, an SD card connector or an audio connector (e.g., a headphone connector).

The haptic module 779 may convert an electrical signal into a mechanical stimulus (e.g., a vibration or a movement) or electrical stimulus which may be recognized by a user via his tactile sensation or kinesthetic sensation. According to an embodiment, the haptic module 779 may include, for example, a motor, a piezoelectric element or an electric stimulator.

The camera module 780 may capture a still image or moving images. According to an embodiment, the camera module 780 may include one or more lenses, image sensors, ISPs or flashes.

The power management module 788 may manage power supplied to the electronic device 701. According to one embodiment, the power management module 788 may be implemented as at least part of, for example, a power management integrated circuit (PMIC).

The battery 789 may supply power to at least one component of the electronic device 701. According to an embodiment, the battery 789 may include, for example, a primary cell which is not rechargeable, a secondary cell which is rechargeable or a fuel cell.

The communication module 790 may support establishing a direct (e.g., wired) communication channel or a wireless communication channel between the electronic device 701 and the external electronic device (e.g., the electronic device 702, the electronic device 704 or the server 708) and performing communication via the established communication channel. The communication module 790 may include one or more CPs that are operable independently from the processor 720 (e.g., the AP) and supports a direct (e.g., wired) communication or a wireless communication. According to an embodiment, the communication module 790 may include a wireless communication module 792 (e.g., a cellular communication module, a short-range wireless communication module or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as Bluetooth™, wireless-fidelity (Wi-Fi) direct or IR data association (IrDA)) or the second network 799 (e.g., a long-range communication network, such as a legacy cellular network, a 5G network, a next-generation communication network, the Internet or a computer network (e.g., LAN or wide area network (WAN)). These various types of communication modules may be implemented as a single component (e.g., a single chip) or may be implemented as multi components (e.g., multi chips) separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The wireless communication module 792 may support a 5G network, after a 4G network, and next-generation communication technology, e.g., new radio (NR) access technology. The NR access technology may support enhanced mobile broadband (eMBB), massive machine type communications (mMTC) or ultra-reliable and low-latency communications (URLLC). The wireless communication module 792 may support a high-frequency band (e.g., the mmWave band) to achieve, e.g., a high data transmission rate. The wireless communication module 792 may support various technologies for securing performance on a high-frequency band, such as, e.g., beamforming, massive multiple-input and multiple-output (massive MIMO), full dimensional MIMO (FD-MIMO), array antenna, analog beam-forming or large scale antenna. The wireless communication module 792 may support various requirements specified in the electronic device 701, an external electronic device (e.g., the electronic device 704) or a network system (e.g., the second network 799). According to an embodiment, the wireless communication module 792 may support a peak data rate (e.g., 20 Gbps or more) for implementing eMBB, loss coverage (e.g., 164 dB or less) for implementing mMTC or U-plane latency (e.g., 0.5 ms or less for each of downlink (DL) and uplink (UL) or a round trip of 1 ms or less) for implementing URLLC.

The antenna module 797 may transmit or receive a signal or power to or from the outside (e.g., the external electronic device) of the electronic device 701. According to an embodiment, the antenna module 797 may include an antenna including a radiating element composed of a conductive material or a conductive pattern formed in or on a substrate (e.g., a PCB). According to an embodiment, the antenna module 797 may include a plurality of antennas (e.g., array antennas). In such a case, at least one antenna appropriate for a communication scheme used in the communication network, such as the first network 798 or the second network 799, may be selected, for example, by the communication module 790 (e.g., the wireless communication module 792) from the plurality of antennas. The signal or the power may then be transmitted or received between the communication module 790 and the external electronic device via the selected at least one antenna. According to an embodiment, another component (e.g., a radio frequency integrated circuit (RFIC)) other than the radiating element may be additionally formed as part of the antenna module 797.

The antenna module 797 may form a mmWave antenna module. According to an embodiment, the mmWave antenna module may include a PCB, an RFIC disposed on a first surface (e.g., the bottom surface) of the PCB or adjacent to the first surface and capable of supporting a designated high-frequency band (e.g., the mmWave band), and a plurality of antennas (e.g., array antennas) disposed on a second surface (e.g., the top or a side surface) of the PCB or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI) or mobile industry processor interface (MIPI)).

According to an embodiment, commands or data may be transmitted or received between the electronic device 701 and the external electronic device 704 via the server 708 coupled with the second network 799. Each of the electronic devices 702 or 704 may be a device of a same type as or a different type, from the electronic device 701. According to an embodiment, all or some of operations to be executed at the electronic device 701 may be executed at one or more of the external electronic devices 702, 704 or 708. For example, if the electronic device 701 should perform a function or a service automatically or in response to a request from a user or another device, the electronic device 701, instead of or in addition to, executing the function or the service, may request the one or more external electronic devices to perform at least part of the function or the service. The one or more external electronic devices receiving the request may perform the at least part of the function or the service requested or an additional function or an additional service related to the request, and transfer an outcome of the performing to the electronic device 701. The electronic device 701 may provide the outcome, with or without further processing of the outcome, as at least part of a reply to the request. To that end, a cloud computing, distributed computing, mobile edge computing (MEC) or client-server computing technology may be used, for example. The electronic device 701 may provide ultra low-latency services using, e.g., distributed computing or MEV. Alternatively, the external electronic device 704 may include an internet-of-things (IoT) device. The server 708 may be an intelligent server using machine learning and/or a neural network. According to an embodiment, the external electronic device 704 or the server 708 may be included in the second network 799. The electronic device 701 may be applied to intelligent services (e.g., smart home, smart city, smart car or healthcare) based on 5G communication technology or IoT-related technology.

Figure 25:
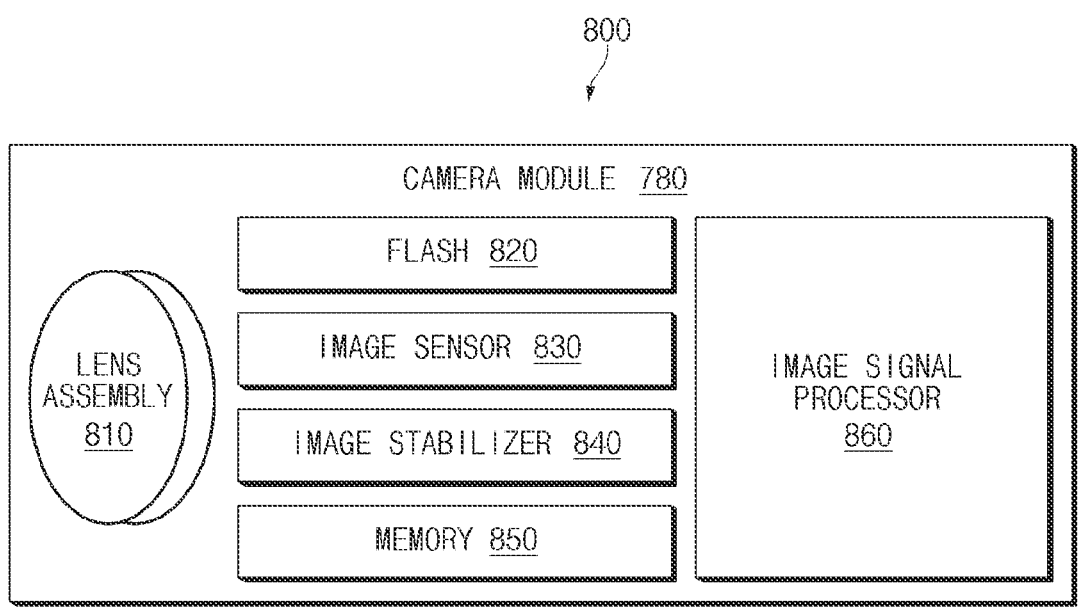
FIG. 25 is a block diagram illustrating a camera module according to an embodiment.

FIG. 25 is a block diagram 800 illustrating the camera module 780 according to various embodiments.

Referring to FIG. 25, the camera module 780 may include a lens assembly 810, a flash 820, an image sensor 830, an image stabilizer 840, memory 850 (e.g., buffer memory) or an ISP 860. The lens assembly 810 may collect light emitted or reflected from an object whose image is to be taken. The lens assembly 810 may include one or more lenses. According to an embodiment, the camera module 780 may include a plurality of lens assemblies 810. In such a case, the camera module 780 may form, for example, a dual camera, a 360-degree camera or a spherical camera. Some of the plurality of lens assemblies 810 may have the same lens attribute (e.g., view angle, focal length, auto-focusing, f number or optical zoom) or at least one lens assembly may have one or more lens attributes different from those of another lens assembly. The lens assembly 810 may include, for example, a wide-angle lens or a telephoto lens.

The flash 820 may emit light that is used to reinforce light reflected from an object. According to an embodiment, the flash 820 may include one or more light emitting diodes (LEDs)(e.g., a red-green-blue (RGB) LED, a white LED, an IR LED or an ultraviolet (UV) LED) or a xenon lamp. The image sensor 830 may obtain an image corresponding to an object by converting light emitted or reflected from the object and transmitted via the lens assembly 810 into an electrical signal. According to an embodiment, the image sensor 830 may include one selected from image sensors having different attributes, such as an RGB sensor, a black-and-white (BW) sensor, an IR sensor or a UV sensor, a plurality of image sensors having the same attribute or a plurality of image sensors having different attributes. Each image sensor included in the image sensor 830 may be implemented using, for example, a charged coupled device (CCD) sensor or a complementary metal oxide semiconductor (CMOS) sensor.

The image stabilizer 840 may move the image sensor 830 or at least one lens included in the lens assembly 810 in a particular direction or control an operational attribute (e.g., adjust the read-out timing) of the image sensor 830 in response to the movement of the camera module 780 or the electronic device 701 including the camera module 780. This allows compensating for at least part of a negative effect (e.g., image blurring) by the movement on an image being captured. According to an embodiment, the image stabilizer 840 may sense such a movement by the camera module 780 or the electronic device 701 using a gyro sensor or an acceleration sensor disposed inside or outside the camera module 780. According to an embodiment, the image stabilizer 840 may be implemented, for example, as an OIS.

The memory 850 may store, at least temporarily, at least part of an image obtained via the image sensor 830 for a subsequent image processing task. For example, if image capturing is delayed due to shutter lag or multiple images are quickly captured, a raw image obtained (e.g., a Bayer-patterned image, a high-resolution image) may be stored in the memory 850, and its corresponding copy image (e.g., a low-resolution image) may be previewed via the display module 760. Thereafter, if a specified condition is met (e.g., by a user's input or system command), at least part of the raw image stored in the memory 850 may be obtained and processed, for example, by the ISP 860. According to an embodiment, the memory 850 may be configured as at least part of the memory 730 or as a separate memory that is operated independently from the memory 730.

The ISP 860 may perform one or more image processing with respect to an image obtained via the image sensor 830 or an image stored in the memory 850. The one or more image processing may include, for example, depth map generation, three-dimensional (3D) modeling, panorama generation, feature point extraction, image synthesizing or image compensation (e.g., noise reduction, resolution adjustment, brightness adjustment, blurring, sharpening or softening). Additionally or alternatively, the ISP 860 may perform control (e.g., exposure time control or read-out timing control) with respect to at least one (e.g., the image sensor 830) of the components included in the camera module 780. An image processed by the ISP 860 may be stored back in the memory 850 for further processing or may be provided to an external component (e.g., the memory 730, the display module 760, the electronic device 702, the electronic device 704 or the server 708) outside the camera module 780. According to an embodiment, the ISP 860 may be configured as at least part of the processor 720 or as a separate processor that is operated independently from the processor 720. If the ISP 860 is configured as a separate processor from the processor 720, at least one image processed by the ISP 860 may be displayed, by the processor 720, via the display module 760 as it is or after being further processed.

According to an embodiment, the electronic device 701 may include a plurality of camera modules 780 having different attributes or functions. In such a case, at least one of the plurality of camera modules 780 may form, for example, a wide-angle camera and at least another of the plurality of camera modules 780 may form a telephoto camera. Similarly, at least one of the plurality of camera modules 780 may form, for example, a front camera and at least another of the plurality of camera modules 780 may form a rear camera.

An electronic device 100 according to an embodiment of the disclosure may include a housing 110 having a main circuit board 150 disposed therein and a camera module 200, at least part of which is disposed in the housing 110, the camera module 200 being electrically connected with the main circuit board 150. The camera module 200 may include a camera housing 210, a lens assembly 220, at least part of which is accommodated in the camera housing 210, the lens assembly 220 including a lens 226, a movable member 250 including an image sensor 252 and a first circuit board 253 electrically connected with the image sensor 252, the movable member 250 being coupled to the camera housing 210 so as to be movable in a direction perpendicular to an optical axis L of the lens 226, a second circuit board 290, at least part of which is electrically connected with the main circuit board 150, and a connecting member 400 that electrically connects the first circuit board 253 and the second circuit board 290. The connecting member 400 may include a first flexible circuit board 410 connected with the first circuit board 253 and a second flexible circuit board 420 connected with the second circuit board 290, and the first flexible circuit board 410 and the second flexible circuit board 420 may be configured to be electrically connected. Each of the first flexible circuit board 410 and the second flexible circuit board 420 may include a first layer 440 and 470, a second layer 450 and 480 disposed to face the first layer 440 and 470, and a VIA 461 and 491 that electrically connects the first layer 440 and 470 and the second layer 450 and 480.

Herein, each of the first flexible circuit board 410 and the second flexible circuit board 420 may be configured to be deformed in a shape in which, when the movable member moves, a gap between a partial area of the first layer 440 and 470 and a partial area of the second layer 450 and 480 is decreased or increased as the first circuit board 253 moves relative to the second circuit board 290.

The movable member 250 may be configured to move in a direction of at least one of a first shift axis S1 or a second shift axis S2 perpendicular to the optical axis L. The first shift axis S1 and the second shift axis S2 may be perpendicular to each other. The first flexible circuit board 410 may be configured to be deformed in response to a movement of the movable member 250 in the direction of the first shift axis S1. The second flexible circuit board 420 may be configured to be deformed in response to a movement of the movable member 250 in the direction of the second shift axis S2.

Herein, each of the first flexible circuit board 410 and the second flexible circuit board 420 may be configured such that the first layer 440 and 470 and the second layer 450 and 480 are formed in substantially the same shape.

The first layer 440 of the first flexible circuit board 410 may be connected to the first circuit board 253. The first layer 470 of the second flexible circuit board 420 may be connected to the second circuit board 290. The second layer 450 of the first flexible circuit board 410 and the second layer 480 of the second flexible circuit board 420 may be electrically connected.

The first layer 440 and 470 may include a first pad area 442 having a first conductive pad 441 and 471 formed thereon and a first VIA area 443 having the VIA 461 and 491 formed therein. The second layer 450 and 480 may include a second pad area 452 having a second conductive pad 451 and 481 formed thereon and a second VIA area 453 having the VIA 461 and 491 formed therein.

Herein, each of the first flexible circuit board 410 and the second flexible circuit board 420 may further include an adhesive member 462 and 492 disposed between the first VIA area 443 and the second VIA area 453, and the VIA 461 and 491 may pass through at least part of the first VIA area 443, the second VIA area 453, and the adhesive member 462 and 492.

The first layer 440 and 470 and the second layer 450 and 480 may be configured such that the first VIA area 443 and the second VIA area 453 are physically coupled through the adhesive member 462 and 492 and a gap between the first pad area 442 and the second pad area 452 is changed based on areas coupled by the adhesive member 462 and 492.

The connecting member 400 may further include a connecting circuit board 430 that electrically connects the first flexible circuit board 410 and the second flexible circuit board 420. The first flexible circuit board 410 may be disposed between the first circuit board 253 and the connecting circuit board 430. The second flexible circuit board 420 may be disposed between the second circuit board 290 and the connecting circuit board 430.

The first flexible circuit board 410 may be configured such that at least part of the first layer 440 of the first flexible circuit board 410 is coupled to the first circuit board 253 and at least part of the second layer 450 of the first flexible circuit board 410 is coupled to the connecting circuit board 430. The second flexible circuit board 420 may be configured such that at least part of the first layer 470 of the second flexible circuit board 420 is coupled to the second circuit board 290 and at least part of the second layer 480 of the second flexible circuit board 420 is coupled to the connecting circuit board 430.

The first circuit board 253 may include a first portion 255 on which the image sensor 252 is disposed and a second portion 256 that extends from the first portion 255 at a right angle. The first flexible circuit board 410 may be connected to the second portion 256 such that the first layer 440 and the second layer 450 are parallel to the second portion 256.

The second circuit board 290 may include a third portion 291 on which a connector 295 is disposed and a fourth portion 293 that extends from the third portion 291 and that is disposed perpendicular to the first portion 255 and the second portion 256 of the first circuit board 253. The second flexible circuit board 420 may be connected to the fourth portion 293 such that the first layer 470 and the second layer 480 are parallel to the fourth portion 293.

The connecting member 400 may further include a connecting circuit board 430 that connects the first flexible circuit board 410 and the second flexible circuit board 420. The connecting circuit board 430 may include a first connecting portion 431 that faces the second portion 256 of the first circuit board 253 in parallel and a second connecting portion 432 that extends from the first connecting portion 431 at a right angle and faces the fourth portion 293 of the second circuit board 290 in parallel. The first flexible circuit board 410 may be disposed between the second portion 256 and the first connecting portion 431, and the second flexible circuit board 420 may be disposed between the fourth portion 293 and the second connecting portion 432.

Herein, each of the first flexible circuit board 410 and the second flexible circuit board 420 may be configured such that a first conductive pad 441 and 471 is disposed on a partial area of the first layer 440 and 470 and a second conductive pad 451 and 481 is disposed on a partial area of the second layer 450 and 480. The first flexible circuit board 410 may electrically connect the first circuit board 253 and the connecting circuit board 430 as the first conductive pad 441 is coupled to the second portion 256 and the second conductive pad 451 is coupled to the first connecting portion 431. The second flexible circuit board 420 may electrically connect the second circuit board 290 and the connecting circuit board 430 as the first conductive pad 471 is coupled to the fourth portion 293 and the second conductive pad 481 is coupled to the second connecting portion 432.

The second circuit board 290 may be fixedly disposed in the housing 110. The first circuit board 253 may be configured to move in a direction of a first shift axis S1 and a direction of a second shift axis S2 perpendicular to the optical axis L relative to the second circuit board 290 together with the movable member 250. A distance between the second portion 256 and the first connecting portion 431 of the first circuit board 253 may be changed when the first circuit board 253 moves in the direction of the first shift axis S1. A distance between the fourth portion 293 and the second connecting portion 432 of the second circuit board 290 may be changed when the first circuit board 253 moves in the direction of the second shift axis S2.

A camera module 200 according to an embodiment of the disclosure may include a camera housing 210, a lens assembly 220, at least part of which is accommodated in the camera housing 210, the lens assembly 220 including a lens 226, and a circuit board structure for electrical connection of the camera module 200. The circuit board structure may include a first circuit board portion 253 on which an image sensor 252 is disposed, a second circuit board portion 290 on which a connector 295 is disposed, and a third circuit board portion 400, at least part of which flexibly extends from the first circuit board portion 253 toward the second circuit board portion 290 to connect the first circuit board portion 253 and the second circuit board portion 290. The third circuit board portion 400 may include a first flexible portion 410 connected to the first circuit board portion 253 and a second flexible portion 420 connected to the second circuit board portion 290. Each of the first flexible portion 410 and the second flexible portion 420 may include a first layer 440 and 470, a second layer 450 and 480 disposed to face the first layer 440 and 470, an adhesive member 464 and 492 disposed between a partial area of the first layer 440 and 470 and a partial area of the second layer 450 and 480, and a VIA 461 and 491 that passes through the adhesive member 462 and 492 to electrically connect the first layer 440 and 470 and the second layer 450 and 480.

The first circuit board portion 253 may be configured to move relative to the second circuit board portion 290. Each of the first flexible portion 410 and the second flexible portion 420 may be configured to be deformed in a shape in which a gap G between a partial area of the first layer 440 and 470 and a partial area of the second layer 450 and 480 is decreased or increased as the first circuit board portion 253 moves.

The first layer 440 and 470 may include a first pad area 442 having a first conductive pad 441 and 471 formed thereon and a first VIA area 443 having the VIA 461 and 491 formed therein. The second layer 450 and 480 may include a second pad area 452 having a second conductive pad 451 and 481 formed thereon and a second VIA area 453 having the VIA 461 and 491 formed therein. The adhesive member 462 and 492 may be disposed between the first VIA area 443 and the second VIA area 453.

The first layer 440 and 470 and the second layer 450 and 480 may be configured such that the first VIA area 443 and the second VIA area 453 are physically coupled through the adhesive member 462 and 492 and a gap G between the first pad area 442 and the second pad area 452 is changed based on areas coupled by the adhesive member 462 and 492.

The circuit board structure may include a rigid circuit board portion including the first circuit board portion 253 and the second circuit board portion 290 and a flexible circuit board portion including the first flexible portion 410 and the second flexible portion 420, and the rigid circuit board portion and the flexible circuit board portion may be integrally formed with each other.

As used in connection with various embodiments of the disclosure, the term "module" may include a unit implemented in hardware, software or firmware, and may interchangeably be used with other terms, for example, "logic," "logic block," "part," or "circuitry". A module may be a single integral component or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 740) including one or more instructions that are stored in a storage medium (e.g., internal memory 736 or external memory 738) that is readable by a machine (e.g., the electronic device 701). For example, a processor (e.g., the processor 720) of the machine (e.g., the electronic device 701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)) or be distributed (e.g., downloaded or uploaded) online via an application store (e.g., PlayStore™) or between two user devices (e.g., smart phones) directly. If distributed online, at least part of the computer program product may be temporarily generated or at least temporarily stored in the machine-readable storage medium, such as memory of the manufacturer's server, a server of the application store or a relay server.

According to various embodiments, each component (e.g., a module or a program) of the above-described components may include a single entity or multiple entities, and some of the multiple entities may be separately disposed in different components. According to various embodiments, one or more of the above-described components may be omitted or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program or another component may be carried out sequentially, in parallel, repeatedly or heuristically or one or more of the operations may be executed in a different order or omitted or one or more other operations may be added.

While the disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device, comprising:
a housing in which a main circuit board is disposed; and
a camera module, at least part of which is disposed in the housing, the camera module being electrically connected with the main circuit board,
wherein the camera module includes:
a camera housing;
a lens assembly, at least part of which is accommodated in the camera housing, the lens assembly including a lens,
a movable member including an image sensor and a first circuit board electrically connected with the image sensor, the movable member being coupled to the camera housing so as to be movable in a direction perpendicular to an optical axis of the lens;
a second circuit board, at least part of which is electrically connected with the main circuit board; and
a connecting member configured to electrically connect the first circuit board and the second circuit board,
wherein the connecting member includes a first flexible circuit board connected with the first circuit board and a second flexible circuit board connected with the second circuit board,
wherein the first flexible circuit board and the second flexible circuit board are configured to be electrically connected, and
wherein each of the first flexible circuit board and the second flexible circuit board includes a first layer, a second layer disposed to face the first layer, and a via configured to electrically connect the first layer and the second layer.

2. The electronic device of claim 1,
wherein each of the first flexible circuit board and the second flexible circuit board is configured to be deformed in a shape in which, when the movable member moves, a gap between a partial area of the first layer and a partial area of the second layer is decreased or increased as the first circuit board moves relative to the second circuit board.

3. The electronic device of claim 2,
wherein the movable member is configured to move in a direction of at least one of a first shift axis or a second shift axis perpendicular to the optical axis,
wherein the first shift axis and the second shift axis are perpendicular to each other,
wherein the first flexible circuit board is configured to be deformed in response to a movement of the movable member in the direction of the first shift axis, and
wherein the second flexible circuit board is configured to be deformed in response to a movement of the movable member in the direction of the second shift axis.

4. The electronic device of claim 1,
wherein each of the first flexible circuit board and the second flexible circuit board is configured such that the first layer and the second layer are formed in substantially an identical shape.

5. The electronic device of claim 1,
wherein the first layer of the first flexible circuit board is connected to the first circuit board,
wherein the first layer of the second flexible circuit board is connected to the second circuit board, and
wherein the second layer of the first flexible circuit board and the second layer of the second flexible circuit board are electrically connected.

6. The electronic device of claim 1,
wherein the first layer includes a first pad area on which a first conductive pad is formed and a first via area on which the via is formed, and
wherein the second layer includes a second pad area on which a second conductive pad is formed and a second via area on which the via is formed.

7. The electronic device of claim 6, wherein each of the first flexible circuit board and the second flexible circuit board further includes an adhesive member disposed between the first via area and the second via area, and
wherein the via passes through at least part of the first via area, the second VIA area, and the adhesive member.

8. The electronic device of claim 6, wherein the first layer and the second layer are configured such that the first via area and the second via area are physically coupled through an adhesive member and a gap between the first pad area and the second pad area is changed based on areas coupled by the adhesive member.

9. The electronic device of claim 1,
wherein the connecting member further includes a connecting circuit board configured to electrically connect the first flexible circuit board and the second flexible circuit board,
wherein the first flexible circuit board is disposed between the first circuit board and the connecting circuit board, and
wherein the second flexible circuit board is disposed between the second circuit board and the connecting circuit board.

10. The electronic device of claim 9,
wherein the first flexible circuit board is configured such that at least part of the first layer of the first flexible circuit board is coupled to the first circuit board and at least part of the second layer of the first flexible circuit board is coupled to the connecting circuit board, and
wherein the second flexible circuit board is configured such that at least part of the first layer of the second flexible circuit board is coupled to the second circuit board and at least part of the second layer of the second flexible circuit board is coupled to the connecting circuit board.

11. The electronic device of claim 1,
wherein the first circuit board includes a first portion on which the image sensor is disposed and a second portion configured to extend from the first portion at a right angle, and
wherein the first flexible circuit board is connected to the second portion such that the first layer and the second layer are parallel to the second portion.

12. The electronic device of claim 11,
wherein the second circuit board includes a third portion on which a connector is disposed and a fourth portion configured to extend from the third portion and disposed perpendicular to the first portion and the second portion of the first circuit board, and
wherein the second flexible circuit board is connected to the fourth portion such that the first layer and the second layer are parallel to the fourth portion.

13. The electronic device of claim 12,
wherein the connecting member further includes a connecting circuit board configured to connect the first flexible circuit board and the second flexible circuit board,
wherein the connecting circuit board includes a first connecting portion configured to face the second portion of the first circuit board in parallel and a second connecting portion configured to extend from the first connecting portion at a right angle and face the fourth portion of the second circuit board in parallel, wherein the first flexible circuit board is disposed between the second portion and the first connecting portion, and wherein the second flexible circuit board is disposed between the fourth portion and the second connecting portion.

14. The electronic device of claim 13, wherein each of the first flexible circuit board and the second flexible circuit board is configured such that a first conductive pad is disposed on a partial area of the first layer and a second conductive pad is disposed on a partial area of the second layer, wherein the first flexible circuit board electrically connects the first circuit board and the connecting circuit board as the first conductive pad is coupled to the second portion and the second conductive pad is coupled to the first connecting portion, and wherein the second flexible circuit board electrically connects the second circuit board and the connecting circuit board as the first conductive pad is coupled to the fourth portion and the second conductive pad is coupled to the second connecting portion.

15. The electronic device of claim 13, wherein the second circuit board is fixedly disposed in the housing, wherein the first circuit board is configured to move in a direction of a first shift axis and a direction of a second shift axis perpendicular to the optical axis relative to the second circuit board together with the movable member, wherein a distance between the second portion and the first connecting portion of the first circuit board is changed when the first circuit board moves in the direction of the first shift axis, and wherein a distance between the fourth portion and the second connecting portion of the second circuit board is changed when the first circuit board moves in the direction of the second shift axis.

16. A camera module, comprising:

a camera housing;

a lens assembly, at least part of which is accommodated in the camera housing, the lens assembly including a lens, and a circuit board structure for electrical connection of the camera module, wherein the circuit board structure includes:

a first circuit board portion on which an image sensor is disposed;

a second circuit board portion on which a connector is disposed; and a third circuit board portion, at least part of which flexibly extends from the first circuit board portion toward the second circuit board portion to connect the first circuit board portion and the second circuit board portion, wherein the third circuit board portion includes a first flexible portion connected to the first circuit board portion and a second flexible portion connected to the second circuit board portion, and wherein each of the first flexible portion and the second flexible portion includes a first layer, a second layer disposed to face the first layer, an adhesive member disposed between a partial area of the first layer and a partial area of the second layer, and a VIA configured to pass through the adhesive member to electrically connect the first layer and the second layer.

17. The camera module of claim 16, wherein the first circuit board portion is configured to move relative to the second circuit board portion, and wherein each of the first flexible portion and the second flexible portion is configured to be deformed in a shape in which a gap between a partial area of the first layer and a partial area of the second layer is decreased or increased as the first circuit board portion moves.

18. The camera module of claim 16, wherein the first layer includes a first pad area having a first conductive pad formed thereon and a first via area having the via formed therein, wherein the second layer includes a second pad area having a second conductive pad formed thereon and a second via area having the via formed therein, and wherein the adhesive member is disposed between the first via area and the second via area.

19. The camera module of claim 18, wherein the first layer and the second layer are configured such that the first via area and the second via area are physically coupled through the adhesive member and a gap between the first pad area and the second pad area is changed based on areas coupled by the adhesive member.

20. The camera module of claim 16, wherein the circuit board structure includes a rigid circuit board portion including the first circuit board portion and the second circuit board portion and a flexible circuit board portion including the first flexible portion and the second flexible portion, and wherein the rigid circuit board portion and the flexible circuit board portion are integrally formed with each other.

\* \* \* \* \*